US010750588B2

(12) United States Patent
Diana et al.

(10) Patent No.: US 10,750,588 B2
(45) Date of Patent: Aug. 18, 2020

(54) LIGHT FIXTURE WITH DYNAMICALLY CONTROLLABLE LIGHT DISTRIBUTION

(71) Applicant: Lumileds LLC, San Jose, CA (US)

(72) Inventors: Frederic Stephane Diana, Santa Clara, CA (US); Yifeng Qiu, San Jose, CA (US); Michael Wasilko, San Jose, CA (US); Nazila Soleimani, San Jose, CA (US); Jeroen Den Breejen, San Jose, CA (US); Alan Andrew McReynolds, San Jose, CA (US); Gregory Donald Guth, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/403,455

(22) Filed: May 3, 2019

(65) Prior Publication Data

US 2019/0342963 A1 Nov. 7, 2019

Related U.S. Application Data

(63) Continuation-in-part of application No. 16/014,734, filed on Jun. 21, 2018.
(Continued)

(30) Foreign Application Priority Data

Jul. 27, 2018 (EP) .................................. 18186073

(51) Int. Cl.
*H05B 45/10* (2020.01)
*F21V 23/00* (2015.01)
(Continued)

(52) U.S. Cl.
CPC ........... *H05B 45/10* (2020.01); *F21V 23/006* (2013.01); *H05B 45/37* (2020.01); *H05B 45/48* (2020.01);
(Continued)

(58) Field of Classification Search
None
See application file for complete search history.

(56) References Cited

U.S. PATENT DOCUMENTS

| 2,347,665 A | 5/1944 | Bandy et al. |
| 4,293,987 A | 10/1981 | Gottbreht et al. |

(Continued)

FOREIGN PATENT DOCUMENTS

| JP | 2009158260 | 7/2009 |
| JP | 2012084316 | 4/2012 |

(Continued)

OTHER PUBLICATIONS

US 10,580,824 B2, 03/2020, Diana et al. (withdrawn)
(Continued)

*Primary Examiner* — Dedei K Hammond
(74) *Attorney, Agent, or Firm* — Schwegman Lundberg & Woessner, P.A.

(57) ABSTRACT

A light engine is disclosed in which the light engine contains a core comprising an opening extending completely through the core and independently addressable LED segments. The opening defines an inner surface of the core. Each segment has multiple LEDs. A PCB contains a body adjacent to one of an inner or outer surface of the core and to which the LED segments are attached and legs extending from the body and bent to be adjacent and traverse to the other of the inner or outer surface. Each leg is associated with a different LED segment. Control circuitry is connected with the legs of the flexible PCB and independently controls parameters of the LED segments to provide a preset illumination distribution and intensity based on user input.

19 Claims, 47 Drawing Sheets

Related U.S. Application Data

(60) Provisional application No. 62/667,180, filed on May 4, 2018.

(51) Int. Cl.

| *H05K 1/18* | (2006.01) |
|---|---|
| *H05B 45/37* | (2020.01) |
| *H05B 45/48* | (2020.01) |
| *H05B 47/19* | (2020.01) |
| *F21V 8/00* | (2006.01) |
| *F21Y 115/10* | (2016.01) |

(52) U.S. Cl.
CPC ............ *H05B 47/19* (2020.01); *H05K 1/189* (2013.01); *F21Y 2115/10* (2016.08); *G02B 6/0016* (2013.01); *G02B 6/0046* (2013.01); *G02B 6/0051* (2013.01); *G02B 6/0068* (2013.01); *G02B 6/0083* (2013.01); *H05K 2201/056* (2013.01); *H05K 2201/10106* (2013.01)

(56) References Cited

U.S. PATENT DOCUMENTS

| 5,555,160 | A | 9/1996 | Tawara et al. |
|---|---|---|---|
| 5,890,794 | A | 4/1999 | Abtahi et al. |
| 6,053,621 | A | 4/2000 | Yoneda |
| 7,333,344 | B2 | 2/2008 | Huang |
| 7,696,441 | B2 | 4/2010 | Kataoka |
| 8,011,818 | B2 | 9/2011 | Negley |
| 8,434,913 | B2 | 5/2013 | Vissenberg |
| 8,545,056 | B2 | 10/2013 | Kajiya et al. |
| 8,702,295 | B2 | 4/2014 | Lin et al. |
| 9,004,722 | B2 | 4/2015 | Sampsell et al. |
| 9,374,869 | B1 | 6/2016 | Wright et al. |
| 9,395,074 | B2 | 7/2016 | Hussell et al. |
| 9,482,416 | B2 | 11/2016 | Narag et al. |
| 9,618,678 | B1 | 4/2017 | Tickner et al. |
| 9,857,520 | B2 | 1/2018 | Parker et al. |
| 9,989,195 | B2 | 6/2018 | Marinus et al. |
| 10,362,679 | B2 | 7/2019 | Gielen |
| 10,416,377 | B2 | 9/2019 | Girotto et al. |
| 10,622,405 | B2 | 4/2020 | Diana et al. |
| 2002/0172039 | A1 | 11/2002 | Lee et al. |
| 2005/0174769 | A1 | 8/2005 | Yong et al. |
| 2005/0207152 | A1 | 9/2005 | Maxik |
| 2006/0193130 | A1 | 8/2006 | Ishibashi |
| 2009/0073689 | A1 | 3/2009 | Patrick |
| 2009/0086480 | A1 | 4/2009 | Chen |
| 2009/0262530 | A1* | 10/2009 | Tickner ............... F21K 9/00 362/235 |
| 2010/0277904 | A1 | 11/2010 | Hanley et al. |
| 2011/0298371 | A1 | 12/2011 | Brandes et al. |
| 2011/0310605 | A1 | 12/2011 | Renn et al. |
| 2012/0014128 | A1 | 1/2012 | Lin |
| 2012/0139425 | A1 | 6/2012 | Kim |
| 2013/0021811 | A1 | 1/2013 | Goldwater |
| 2013/0235578 | A1 | 9/2013 | Hsieh et al. |
| 2013/0240920 | A1 | 9/2013 | Chen et al. |
| 2013/0271981 | A1 | 10/2013 | Lopez et al. |
| 2013/0279175 | A1 | 10/2013 | Hussell et al. |
| 2013/0294092 | A1* | 11/2013 | Hussell ............... F21V 29/004 362/363 |
| 2014/0036497 | A1 | 2/2014 | Hussell et al. |
| 2014/0146536 | A1 | 5/2014 | Li |
| 2014/0226330 | A1 | 8/2014 | Yun |
| 2014/0240990 | A1 | 8/2014 | Bae |
| 2014/0300274 | A1 | 10/2014 | Acatrinei |
| 2015/0260352 | A1 | 9/2015 | Bhattarai et al. |
| 2015/0260353 | A1 | 9/2015 | Bhattarai et al. |
| 2015/0377421 | A1 | 12/2015 | Chen |
| 2017/0322364 | A1 | 11/2017 | Girotto et al. |
| 2018/0168047 | A1 | 6/2018 | Van Uden et al. |
| 2018/0372276 | A1 | 12/2018 | Su et al. |
| 2019/0016254 | A1 | 1/2019 | Salter et al. |
| 2019/0337449 | A1 | 11/2019 | Diana et al. |
| 2019/0339441 | A1 | 11/2019 | Diana et al. |
| 2019/0341421 | A1 | 11/2019 | Diana et al. |
| 2019/0341422 | A1 | 11/2019 | Diana et al. |
| 2019/0341423 | A1 | 11/2019 | Diana et al. |
| 2019/0342975 | A1 | 11/2019 | Diana et al. |
| 2019/0377128 | A1 | 12/2019 | Diana et al. |
| 2020/0194493 | A1 | 6/2020 | Diana et al. |

FOREIGN PATENT DOCUMENTS

| KR | 1020100003326 | 1/2010 |
|---|---|---|
| KR | 20100003326 | 3/2010 |
| WO | 2014179519 | 11/2014 |
| WO | WO-2019/213634 A1 | 11/2019 |
| WO | WO-2019/213635 A1 | 11/2019 |
| WO | WO-2019/213636 A1 | 11/2019 |
| WO | WO-2019/213637 A1 | 11/2019 |
| WO | WO-2019/213638 A1 | 11/2019 |

OTHER PUBLICATIONS

U.S. Appl. No. 16/014,734, filed Jun. 21, 2018, Light Engines With Dynamically Controllable Light Distribution.
U.S. Appl. No. 16/403,452, filed May 3, 2019, Light Fixture With Dynamically Controllable Light Distribution.
U.S. Appl. No. 16/403,457, filed May 3, 2019, Light Fixture With Dynamically Controllable Light Distribution.
U.S. Appl. No. 16/403,485, filed May 3, 2019, Light Engines With Dynamically Controllable Light Distribution.
U.S. Appl. No. 16/403,456, filed May 3, 2019, Light Fixture With Dynamically Controllable Light Distribution.
U.S. Appl. No. 16/403,484, filed May 3, 2019, Light Engines With Dynamically Controllable Light Distribution.
U.S. Appl. No. 16/403,478, filed May 3, 2019, Light Engines With Dynamically Controllable Light Distribution.
"U.S. Appl. No. 16/014,734, Final Office Action dated Nov. 15, 2019", 9 pgs.
"U.S. Appl. No. 16/014,734, Response filed Jan. 15, 2020 to Final Office Action dated Nov. 15, 2019", 9 pgs.
"U.S. Appl. No. 16/403,456, Notice of Allowance dated Oct. 24, 2019", 11 pgs.
"Taiwanese Application Serial No. 108115638, Office Action dated Nov. 27, 2019", (w/ English Summary), 3 pgs.
"Taiwanese Application Serial No. 108115638, Response filed Dec. 27, 2019 to Office Action dated Nov. 27, 2019", w/ Translation, 57 pgs.
"U.S. Appl. No. 16/014,734, Non Final Office Action dated May 17, 2019", 10 pgs.
"International Application Serial No. PCT US2019 030761, International Search Report dated Jun. 25, 2019", 4 pgs.
"International Application Serial No. PCT US2019 030761, Written Opinion dated Jun. 25, 2019", 8 pgs.
"International Application Serial No. PCT US2019 030762, International Search Report dated Jun. 28, 2019", 4 pgs.
"International Application Serial No. PCT US2019 030762, Written Opinion dated Jun. 28, 2019", 8 pgs.
"International Application Serial No. PCT US2019 030763, International Search Report dated Jun. 25, 2019", 5 pgs.
"International Application Serial No. PCT US2019 030763, Written Opinion dated Jun. 25, 2019", 10 pgs.
"International Application Serial No. PCT US2019 030759, International Search Report dated Jun. 28, 2019", 3 pgs.
"International Application Serial No. PCT US2019 030759, Written Opinion dated Jun. 28, 2019", 8 pgs.
"International Application Serial No. PCT US2019 030764, International Search Report dated Jul. 3, 2019", 4 pgs.
"International Application Serial No. PCT US2019 030764, Written Opinion dated Jul. 3, 2019", 6 pgs.
"U.S. Appl. No. 16/014,734, Response filed Aug. 16, 2019 to Non-Final Office Action dated May 17, 2019", 11 pgs.

(56) References Cited

OTHER PUBLICATIONS

U.S. Appl. No. 16/786,836, filed Feb. 10, 2020, Light Fixture With Dynamically Controllable Light Distribution.

"U.S. Appl. No. 16/014,734, Notice of Allowance dated Feb. 4, 2020", 9 pgs.

"U.S. Appl. No. 16/403,456, Corrected Notice of Allowability dated Mar. 6, 2020", 2 pgs.

"U.S. Appl. No. 16/403,457, Non- Final Office Action dated Jan. 30, 2020", 26 pgs.

"U.S. Appl. No. 16/403,478, Non-Final Office Action dated Feb. 26, 2020", 12 pgs.

"U.S. Appl. No. 16/403,484, Non-Final Office Action dated Feb. 6, 2020", 11 pgs.

"U.S. Appl. No. 16/403,485, Non-Final Office Action dated Feb. 7, 2020", 12 pgs.

"U.S. Appl. No. 16/786,836, Preliminary Amendment filed May 5, 2020", 8 pgs.

"U.S. Appl. No. 16/014,734, Notice of Allowance dated May 13, 2020", 9 pgs.

"U.S. Appl. No. 16/403,452, Non Final Office Action dated Apr. 17, 2020", 17 pgs.

"U.S. Appl. No. 16/403,457, Final Office Action dated May 21, 2020", 20 pgs.

"U.S. Appl. No. 16/403,457, Response filed Apr. 29, 2020 to Non Final Office Action dated Jan. 30, 2020", 13 pgs.

"U.S. Appl. No. 16/403,478, Response filed May 26, 2020 to Non Final Office Action dated Feb. 26, 2020", 12 pgs.

"U.S. Appl. No. 16/403,484, Notice of Allowance dated May 20, 2020", 9 pgs.

"U.S. Appl. No. 16/403,484, Response filed May 5, 2020 to Non Final Office Action dated Feb. 6, 2020", 10 pgs.

"U.S. Appl. No. 16/403,485, Response filed May 7, 2020 to Non Final Office Action dated Feb. 7, 2020", 14 pgs.

\* cited by examiner

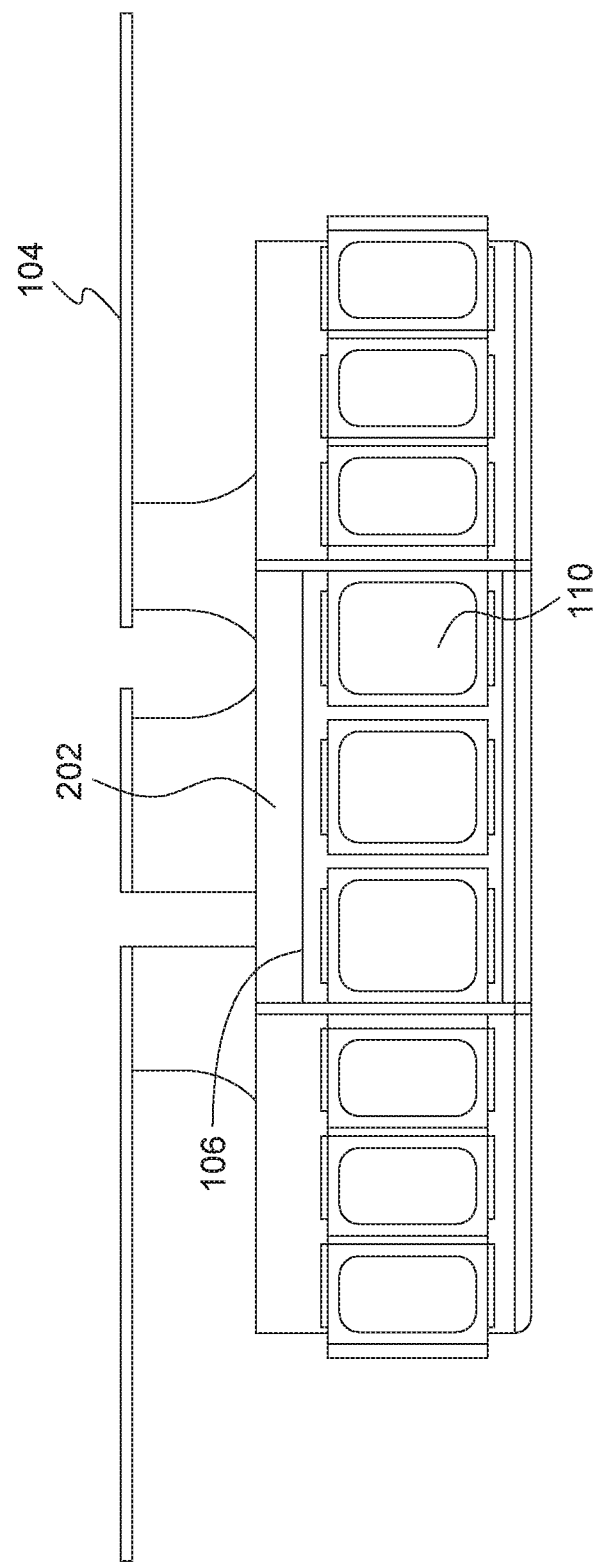

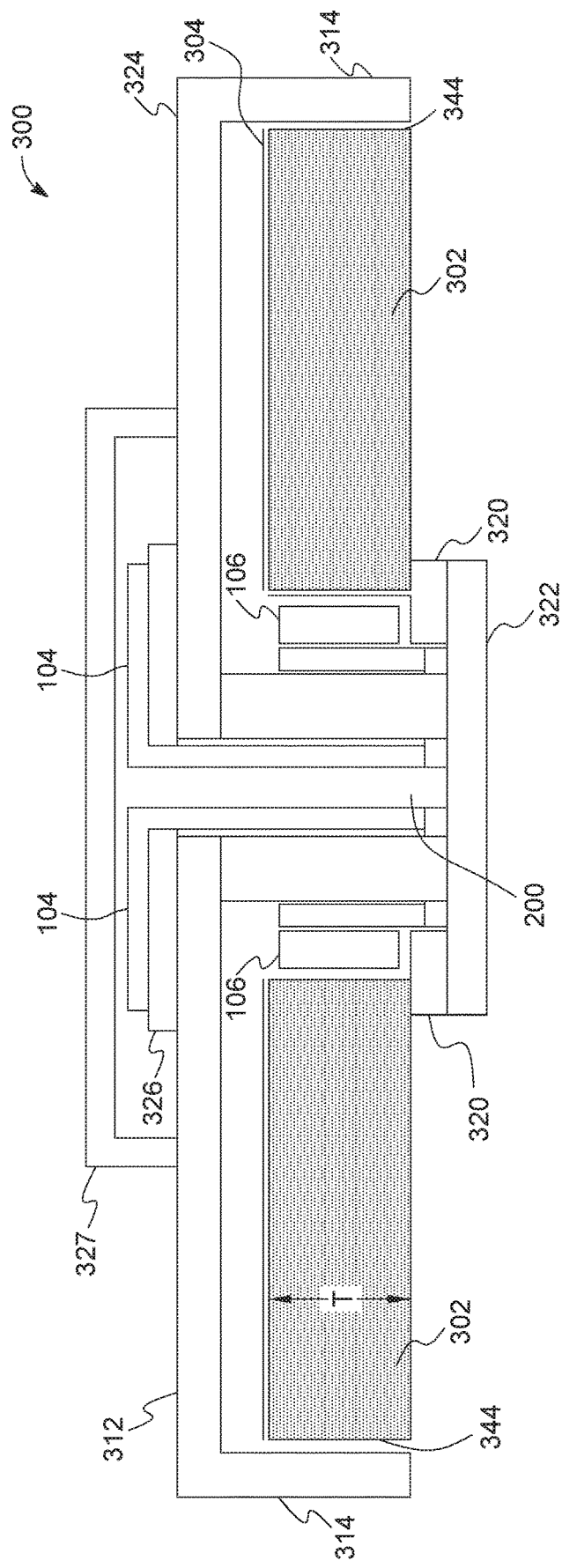

LIGHT FIXTURE WITH DYNAMICALLY CONTROLLABLE LIGHT DISTRIBUTION

PRIORITY CLAIM

This application claims the benefit of U.S. Provisional Application Ser. No. 62/667,180, filed May 4, 2018, U.S. application Ser. No. 16/014,734, filed Jun. 21, 2018, and EP Application Serial No. 18186073.5 filed, Jul. 27, 2018, each of which is incorporated by reference as if fully set forth.

BACKGROUND

Light emitting diodes (LEDs) are commonly used as light sources in various applications. LEDs can be more energy-efficient than traditional light sources, providing much higher energy conversion efficiency than incandescent lamps and fluorescent light, for example. Furthermore, LEDs may radiate less heat into illuminated regions and afford a greater breadth of control over brightness, emission color and spectrum than traditional light sources. These characteristics make LEDs an excellent choice for various lighting applications, such as outdoor lighting, decorative lighting, or outdoor lighting.

Different applications may require different light distribution patterns. To this end, it is desirable for LEDs to be paired with the appropriate light fixture when used for indoor or outdoor lighting. For example, some lighting applications may desire light emissions that are more broadly spread than others.

SUMMARY

According to aspects of the disclosure, a light engine comprises a core comprising an opening extending completely through the core, the opening defining an inner surface of the core; a plurality of independently addressable light emitting diode (LED) segments, each LED segment comprising a plurality of LEDs; a flexible printed circuit board (PCB) comprising a body adjacent to one of an inner or outer surface of the core and to which the LED segments are attached and a plurality of legs extending from the body and bent to be adjacent and traverse to the other of the inner or outer surface, each leg associated with a different LED segment; and control circuitry connected with the legs of the flexible PCB, the control circuitry configured to independently control parameters of the LED segments to provide a preset illumination distribution and intensity based on user input.

According to aspects of the disclosure, the control circuitry comprises a first PCB having a first surface that opposes the LED segments, a second surface opposing the first surface, and an opening extending between the first and second surfaces, and the legs of the flexible PCB extend through the opening and are soldered to control contacts of the first PCB on the second surface.

According to aspects of the disclosure, the LED segments are configured in parallel, and the control circuitry comprises: a direct current (DC)/DC converter or low-dropout (LDO) regulator configured to convert a higher constant DC voltage to a lower constant DC voltage, the lower constant DC voltage used to adjust an LED voltage supplied to the LED segments, a constant current regulator configured to provide a fixed peak current to the LED segments, and a controller configured to control a duty cycle of the LED segments based on the user input to independently control light intensity from each of the LED segments.

According to aspects of the disclosure, forward voltages of the LED segments are matched, and an applied voltage to each of the LED segments is below the LED voltage by about 1-2 volts.

According to aspects of the disclosure, the LED segments are configured in parallel, and the control circuitry comprises: a plurality of DC/DC converters each supplied with a constant voltage and configured to control a different LED segment, and a controller configured to control at least one of a duty cycle or a peak current of the DC/DC converters independently based on the user input.

According to aspects of the disclosure, the LED segments are configured in parallel, and the control circuitry comprises: a direct current (DC)/DC converter or low-dropout (LDO) regulator configured to convert a higher constant DC voltage to a lower constant DC voltage, the lower constant DC voltage used to adjust a constant current supplied to the LED segments, the LED segments sharing the constant current, and a controller supplied with the lower constant DC voltage and configured to control, via a time-division multiplexer, at least one parameter of each of the DC/DC converters independently based on the user input, such that only one of the LED segments is conducting current at a particular time.

According to aspects of the disclosure, the parameter is a duty cycle of the DC/DC converter.

According to aspects of the disclosure, the parameter is the constant current supplied to the DC/DC converter.

According to aspects of the disclosure, forward voltages of the LED segments are matched.

According to aspects of the disclosure, the LED segments are configured in series, and a shunt switch is disposed between each LED segment, and the control circuitry comprises: a direct current (DC)/DC converter or low-dropout (LDO) regulator configured to convert a higher constant DC voltage to a lower constant DC voltage, the lower constant DC voltage used to adjust a constant current supplied to the LED segments, and a controller supplied with the lower constant DC voltage and configured to control the constant current and a duty cycle of each LED segment independently.

According to aspects of the disclosure, the controller is able to control the LED segments such that multiple LED segments are able to conduct current at the same time.

According to aspects of the disclosure, a duty cycle associated with each of the LED segments is set by a lookup table in a memory of the control circuity, the lookup table containing a correspondence between a light distribution indicted by a user equipment and the duty cycle associated with each of the LED segments.

According to aspects of the disclosure, the lookup table further contains a correspondence between a constant current associated with each of the LED segments and the light distribution indicted by the user equipment.

According to aspects of the disclosure, the control circuitry further comprises a second PCB that is detachable from the first PCB, and the second PCB comprises communication circuitry configured to wirelessly communicate with a user interface via a supported communication protocol to control light output from each of the LED segments accordingly.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

FIG. 2C is a side view of the illumination source of FIG. 2A, according to aspects of the disclosure;

FIG. 7A is a cross-sectional side view of another example of a light fixture, according to aspects of the disclosure;

DETAILED DESCRIPTION

Figure 1A:
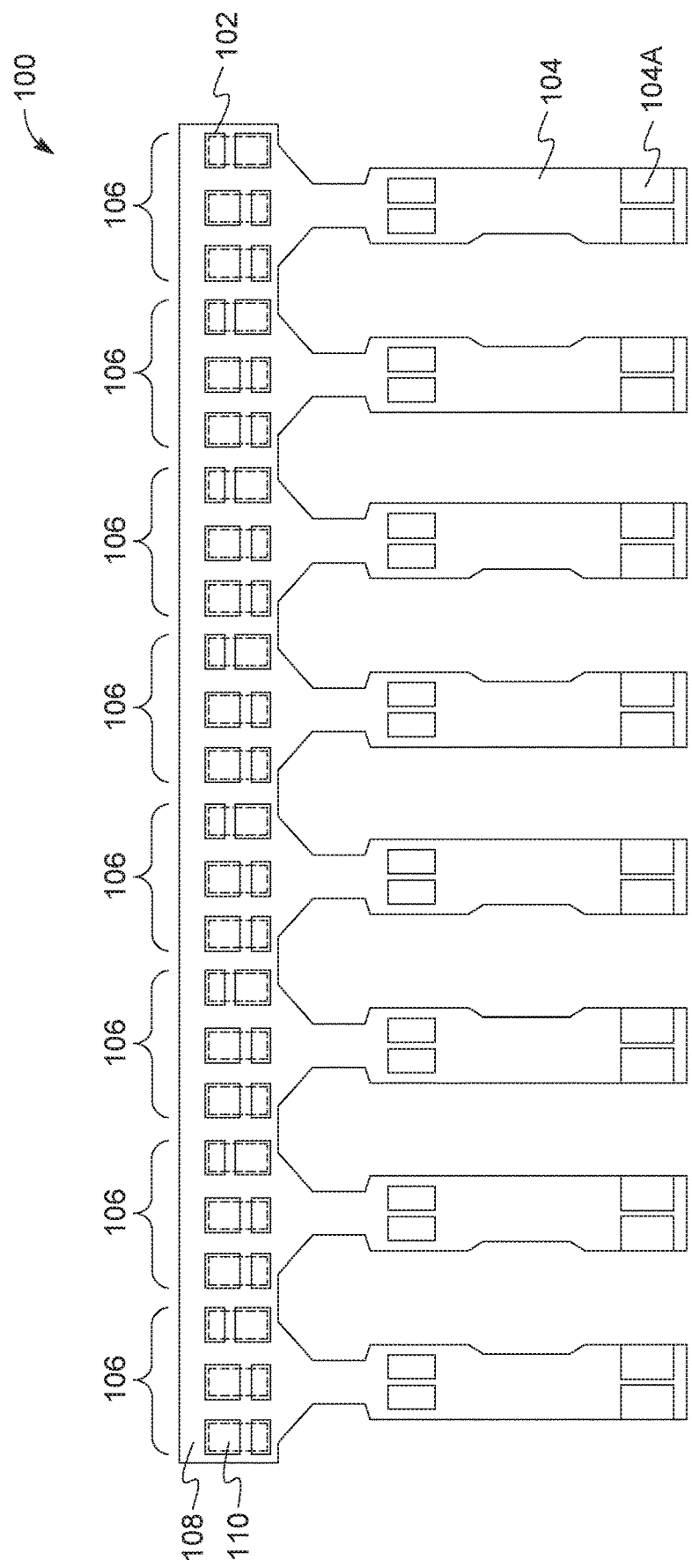
FIG. 1A is a diagram of an example of a flexible printed circuit board, according to aspects of the disclosure.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

According to aspects of the disclosure, a flexible printed circuit board, method of fabricating the flexible printed circuit board, illumination device (or light fixture) using of the flexible printed circuit hoard, electronics of the illumination device, and method of using the flexible printed circuit board to control illumination device, among others, are described. For example, in some embodiments, the flexible printed circuit board contains a substantially rectangular body having a plurality of segments. At least one of the segments has a body contact to which an illumination source, such as an LED, or set of illumination sources (also referred to as a bank of illumination sources) is attached. In some instances, at least one of the segments may have multiple body contacts. One or more flexible legs extend substantially perpendicularly from the body, such as one flexible leg for each segment. Each flexible leg contains at least one pair of leg contacts disposed proximate to a distal end of the leg from the body. The flexible printed circuit board is formed from a multilayer structure that comprises an adhesive layer configured to adhere the structure to a material contacting the adhesive layer, at least one pair of dielectric and metal layers, with one of the dielectric layers adjacent to the adhesive layer. Exposed portions of the metal layer through the dielectric layer form the leg contacts, and exposed portions of the metal layer through an overlying solder mask layer form the pair of body contacts.

The flexible printed board may be incorporated in a light fixture. The light fixture may include a light guide having an interior opening that defines an interior edge of the light guide. The light guide may be planar, and thus be formed as a light guide plate. An illumination source is inserted in the interior opening and may include a plurality of LEDs that are arranged to inject light into the light guide through the interior edge of the light guide. The LEDs may be arranged around the circumference of a base that is part of the illumination source. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat.

Various types of light guides can be used to address different types of applications. Flat light guide panels may be used to cover applications ranging from intermediate batwings (typically ~45-60 degree beam angle) to concentrated lambertians for some outdoor (parking garages) and indoor (downlights) applications. Flat+chamfered outer edge light guide panels may be used for similar applications, but with higher efficiency targets and less cost constrained, can be used too. This geometry can also be used for spots applications. Wedge light guide panels may be used for applications demanding batwing light distributions with high beam angles (>60 degrees) and high optical efficiency, such as for bollards or street lighting. The light guide panel may have a main flat surface facing the backside of the light engine to achieve good mechanical support and rigidity. The flat surface (or both surfaces in some cases) can include additional light extracting elements (such as ink dot patterns or 3D textures or also the electrically-controllable inks already proposed in a previous ID) to provide increased performance for light output, or added dynamic control of light distributions, or simply for light extraction from the flat light guide panels or for additional emitting surface uniformity purpose. The center hole from which light is injected can also be shaped circularly or be multifaceted (octagon for instance to match the number of LEDs or angular segments) to tune the light distribution as well. Planar facets allow to generate more concentrated beams in the horizontal planes. The outer light guide panel edge can also include a reflective layer (white or mirror tape, or white glue, or clear glue+ white reflective or mirror film) to recycle the light that otherwise would escape and likely get absorbed in the housing.

Examples of different light fixtures are described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

FIGS. 1A-1F are diagrams of an example of a flexible printed circuit board, according to aspects of the disclosure. In particular, FIG. 1A is a top view of the flexible printed circuit board 100. The flexible printed circuit board 100 may include a body 108 and one or more legs 104. As shown, the flexible printed circuit board 100 contains multiple legs 104. The body 108 may be substantially rectangular and the legs 104 may extend substantially perpendicularly from the body 108.

The body 108 may include one or more segments 106 associated with a set of pairs of body contacts 102. Each pair of body contacts 102 may be used to provide electrical connection to a different illumination source 110 mounted thereon (or otherwise attached thereto). Each set of pairs of body contacts 102 may include a single pair of body contacts 102 or multiple pairs of body contacts 102. Different segments 106 may contain the same number of pairs of body contacts 102, as shown, or one or more of the segments 106 may contain a different number of pairs of body contacts 102 from at least one other segment 106.

The set of illumination sources 110 within a particular segment 106 may be the same color or one or more of the illumination sources 110 within the segment 106 may be different colors. Similarly, in some embodiments, each segment 106 may contain a set of illumination sources 110 having the same color or set of colors. In other embodiments, one or more of the colors may be different in different segments 106. In some embodiments, each set of illumination sources 110 (the illumination sources 110 of a segment 106) may be independently controllable. In further embodiments, each illumination source 110 within the set of illumination sources 110 may be independently controllable via the body contacts 102 connected to each illumination source 110. In some embodiments, one or more of the segments 106 may not contain any illumination sources 110.

As shown in FIG. 1A, each of the legs 104 may include one or more electrical connections, shown as leg contacts 104a, that are disposed at a distal end thereof. The leg contacts 104a of each leg are used to control the set of illumination sources 110 in a different one of the segments 106. Thus, in the embodiment shown in FIG. 1A, multiple illumination sources 110 of a particular segment 106 are controlled by a single pair of leg contacts 104a associated with the segment 106. As shown, test contacts on each leg 104 may be disposed between the body 108 and the leg contacts 104a. The test contacts may be used during testing of the flexible printed circuit board 100, either to test the connectivity between the leg contacts 104a and the body contacts 102 or connectivity to the set of illumination sources 110.

To control the illumination sources 110, each leg 104 may include one or more electrical connections and/or wiring to activate/deactivate one or more of the illumination sources 110 in the associated segment 106, change the brightness of one or more of the illumination sources 110 in the associated segment 106, change the color of light output of in the associated segment 106, and/or control other characteristics of the operation of the one or more of the illumination sources 110 in the associated segment 106. The set of illumination sources 110 in each segment 106 may be connected to one another in series, in parallel, and/or in any other suitable way. As above, the set of illumination sources 110 in each segment 106 may be configured to output the same color of light or different colors of light such as, for example, red, green, and blue. Additionally or alternatively, the set of illumination sources 110 in each of the segments 106 may output light having the same correlated color temperature (CCT). Additionally or alternatively, the light outputs of at least two of the illumination sources 110 in a segment 106 may have different CCTs.

Figure 1B:
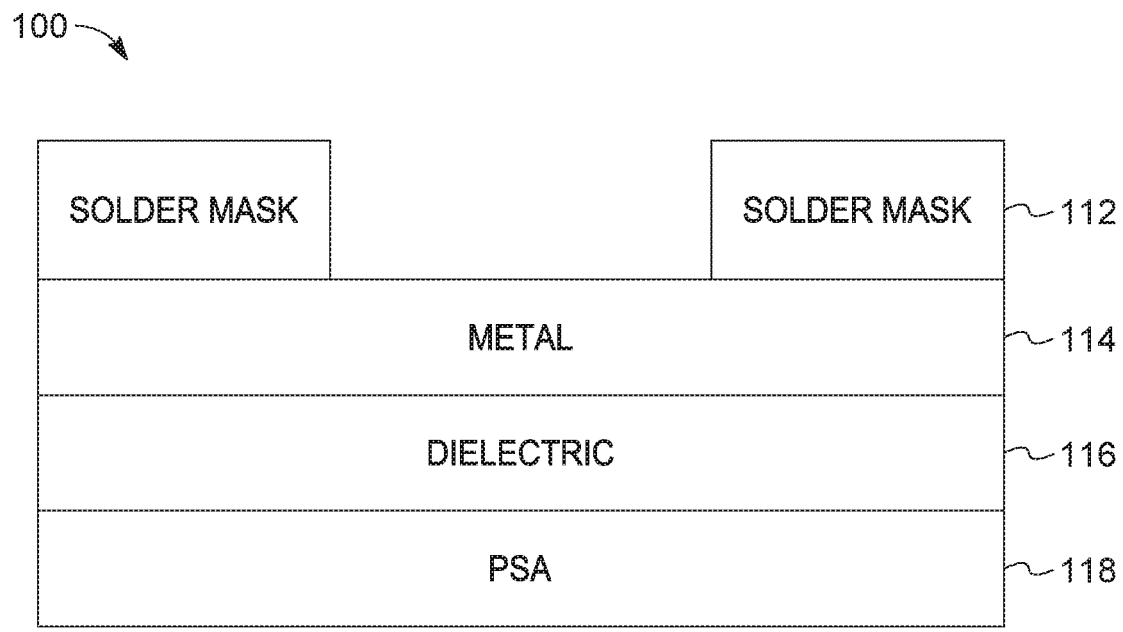
FIG. 1B is a cross-sectional view of the flexible printed circuit board of FIG. 1A, according to aspects of the disclosure.
Figure 1C:
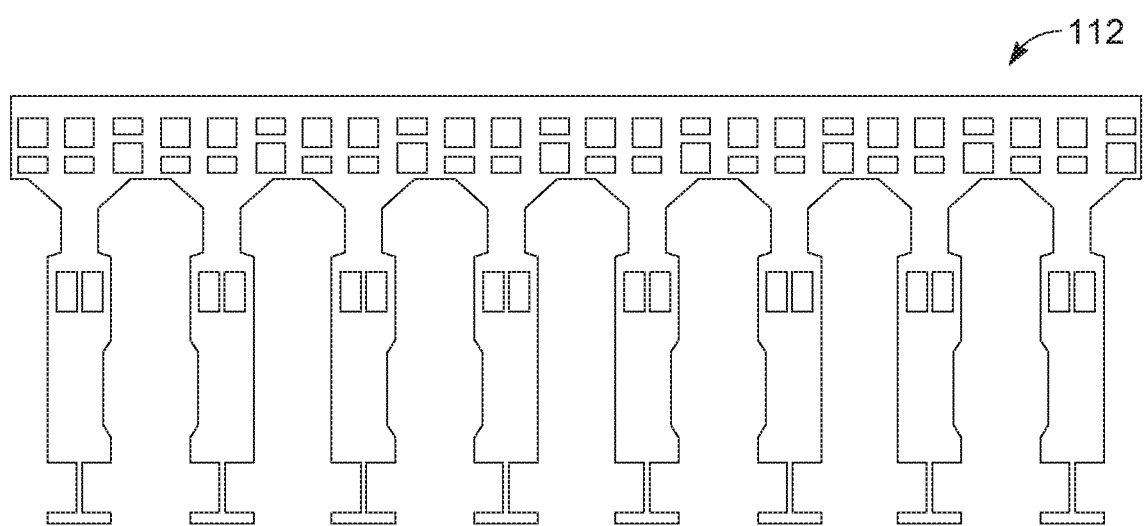
FIG. 1C is a planar top-down view of a solder mask layer of the flexible printed circuit board of FIG. 1A, according to aspects of the disclosure.
Figure 1D:
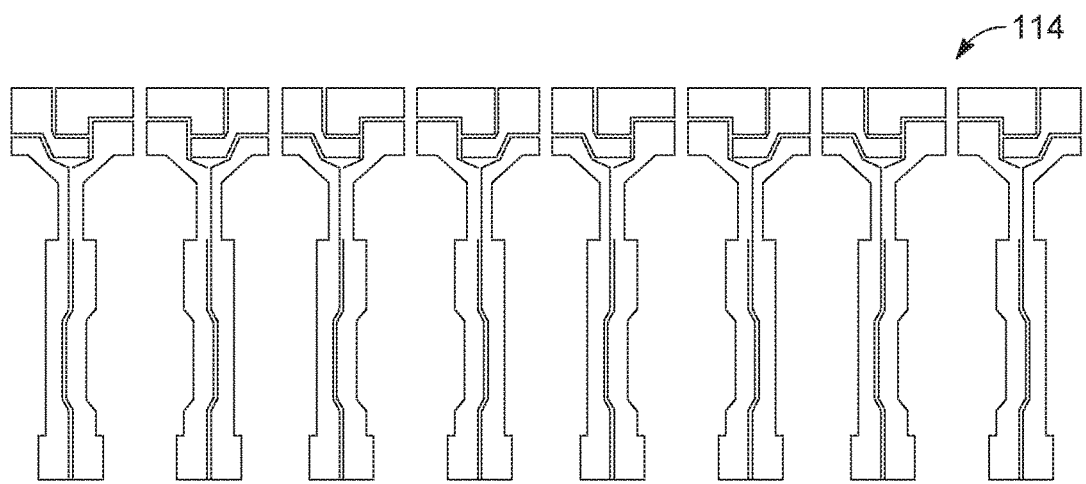
FIG. 1D is a planar top-down view of a metal layer of the flexible printed circuit board of FIG. 1A, according to aspects of the disclosure.
Figure 1E:
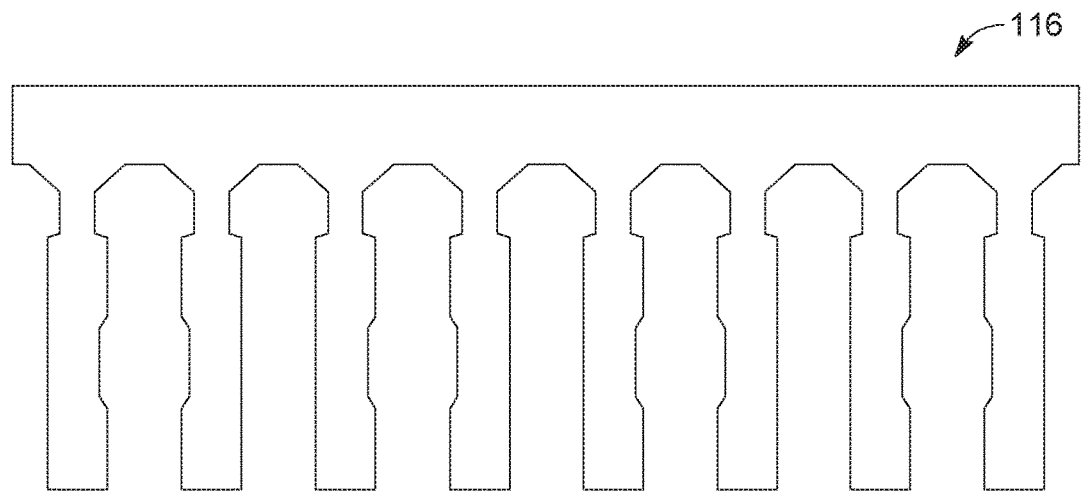
FIG. 1E is a planar top-down view of a dielectric layer of the flexible printed circuit board of FIG. 1A, according to aspects of the disclosure.
Figure 1F:
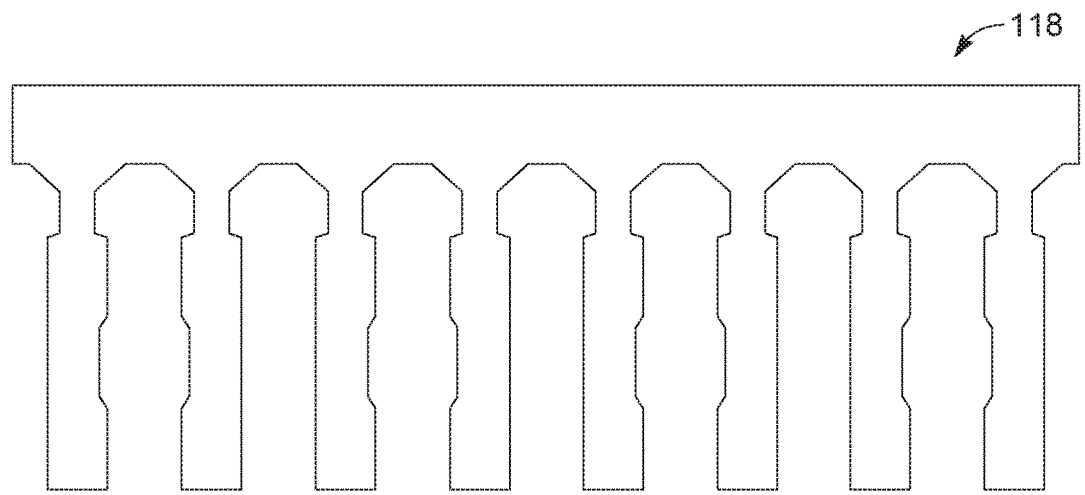
FIG. 1F is a planar top-down view of an adhesive layer of the flexible printed circuit board of FIG. 1A, according to aspects of the disclosure.
Figure 1G:
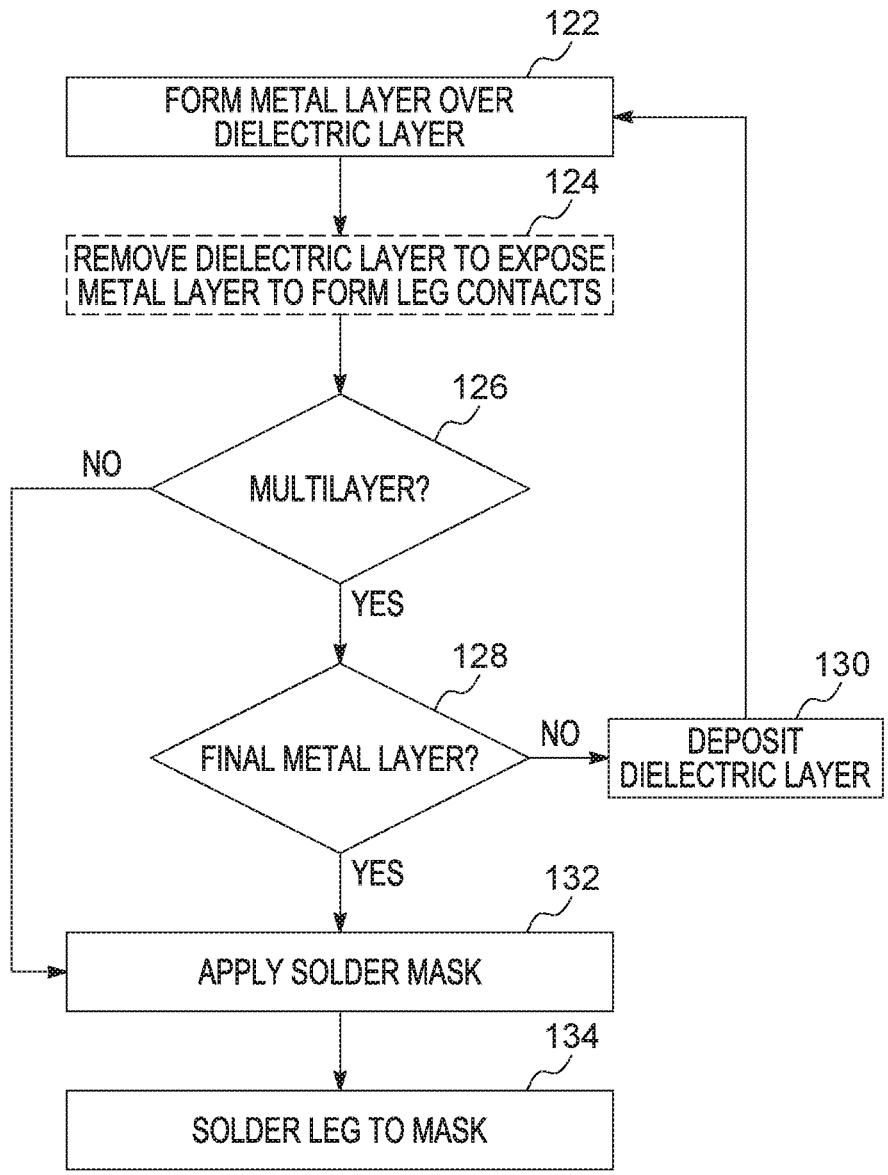
FIG. 1G is a flowchart of a method of fabricating the flexible printed circuit board of FIG. 1A, according to aspects of the disclosure.

FIG. 1B is a cross-sectional view of the flexible printed circuit board of FIG. 1A, according to aspects of the disclosure, while FIG. 1G is a flowchart of a method of fabricating the flexible printed circuit board of FIG. 1A, according to aspects of the disclosure. The flexible printed circuit board 100 may be a multilayer structure that contains at least one pair of metal and dielectric layers 114, 116 and a solder mask 112 on a topmost metal layer 114. A pressure-sensitive adhesive (PSA) 118 may be attached to the underside of a portion of the dielectric layer 116. The PSA 118 is a non reactive adhesive that forms a bond when pressure is applied without the use of a solvent, water, or heat. The PSA 118 may be between about 50 μm and 1 mm, but is typically around 100 μm.

The dielectric layer 116 may be formed from polyimide, or any other suitable insulating material that is sufficiently flexible when of the desired thickness. The dielectric layer 116 may be between about 25 μm and 100 μm, sufficient to support the metal layer 114. As shown in FIG. 1G, the metal layer 114 may be formed on the dielectric layer 116 at operation 122. In different embodiments, the metal layer 114 may be deposited or plated on the dielectric layer 116. The metal layer 114 may be formed from copper, or any other suitable conductive material. The metal layer 114 may be between about 17.5 μm and 100 μm, nominally 70 μm or so.

In some embodiments, after formation of the metal layer 114 on the dielectric layer 116, leg contacts may be formed at operation 124. In some embodiments, portions of the dielectric layer 116 may be removed by etching or other chemical or mechanical process to permit contact to the metal layer 114 at the appropriate location. In other embodiments, the portions of the dielectric layer 116 may not be removed. If a multilayer structure is used (operation 126) and the metal layer is not the final metal layer (operation 128), a new dielectric layer may be deposited or otherwise formed on underlying the metal layer at operation 130. The process may then return to operation 122.

If a multilayer structure is not used (operation 126) or the metal layer is the final metal layer (operation 128), the solder mask 112 may be deposited on the topmost metal layer 114 at operation 132. The solder mask 112 may be between about 25 μm and 50 μm. The solder mask 112, when applied, may have openings to expose portions of the topmost metal layer 114 to form the body contacts. The solder mask 112 may also have openings to expose portions of the topmost metal layer 114 to form the leg contacts, if not formed in the dielectric layer 116. In other embodiments, the openings in the solder mask 112 may be formed after application of the solder mask 112. The LEDs or other illumination sources may then be soldered or affixed to the solder mask 112. The PSA 118 may be applied at any point during the process shown in FIG. 1G, such as before the illumination sources are attached or before the solder mask is applied. The PSA 118 may be applied to areas to which the multilayer structure is attached, or at least areas other than the leg contacts.

FIG. 1C is a planar top-down view of a solder mask layer of the flexible printed circuit board of FIG. 1A, according to aspects of the disclosure. As shown in FIG. 1C, the solder mask 112 has openings for both the body and leg contacts.

FIG. 1D is a planar top-down view of a metal layer of the flexible printed circuit board of FIG. 1A, according to aspects of the disclosure. As above, the metal layer 114 may be formed from copper, or any other suitable conductive material. As shown, the metal layer 114 is split into individual connections. The portion of the metal layer 114 corresponding to the leg 104 is split into two sections, each connected to a different body contact 102 of the body 108. The portion of the metal layer 114 corresponding to the body 108 is further split into multiple sections. Each section of the metal layer 114 is electrically isolated from each other section of the metal layer 114. The sections as shown in FIG. 1D are configured such that the set of illumination sources 110 in a segment 106 are series connected, with one of the pairs of body contacts 102 being electrically connected to another of the pairs of body contacts 102. In other embodiments, however, one or more of the illumination sources 110 in the set of illumination sources 110 may be independently addressable using the metal layer 114 via additional sections of the metal layer 114 or using a different (underlying) metal layer.

FIG. 1E is a planar top-down view of a dielectric layer of the flexible printed circuit board of FIG. 1A, according to aspects of the disclosure. The dielectric layer 116 may, as above, be formed from polyimide. FIG. 1F is a planar top-down view of an adhesive layer of the flexible printed circuit board of FIG. 1A, according to aspects of the disclosure. As above, portions of the PSA 118 may be removed prior to adhesion to the dielectric layer 116 and/or surface to which the structure is attached. Although multiple pairs of body contacts are described as being associated with a single pair of leg contacts, multiple pairs of leg contacts may be used, one pair for each color LED if multiple LED colors are present within the LED segment. In addition, although pairs of contacts are described, in some embodiments, more than two contacts may be used (e.g., the LED or other illumination source may use more than two contacts).

Figure 2A:
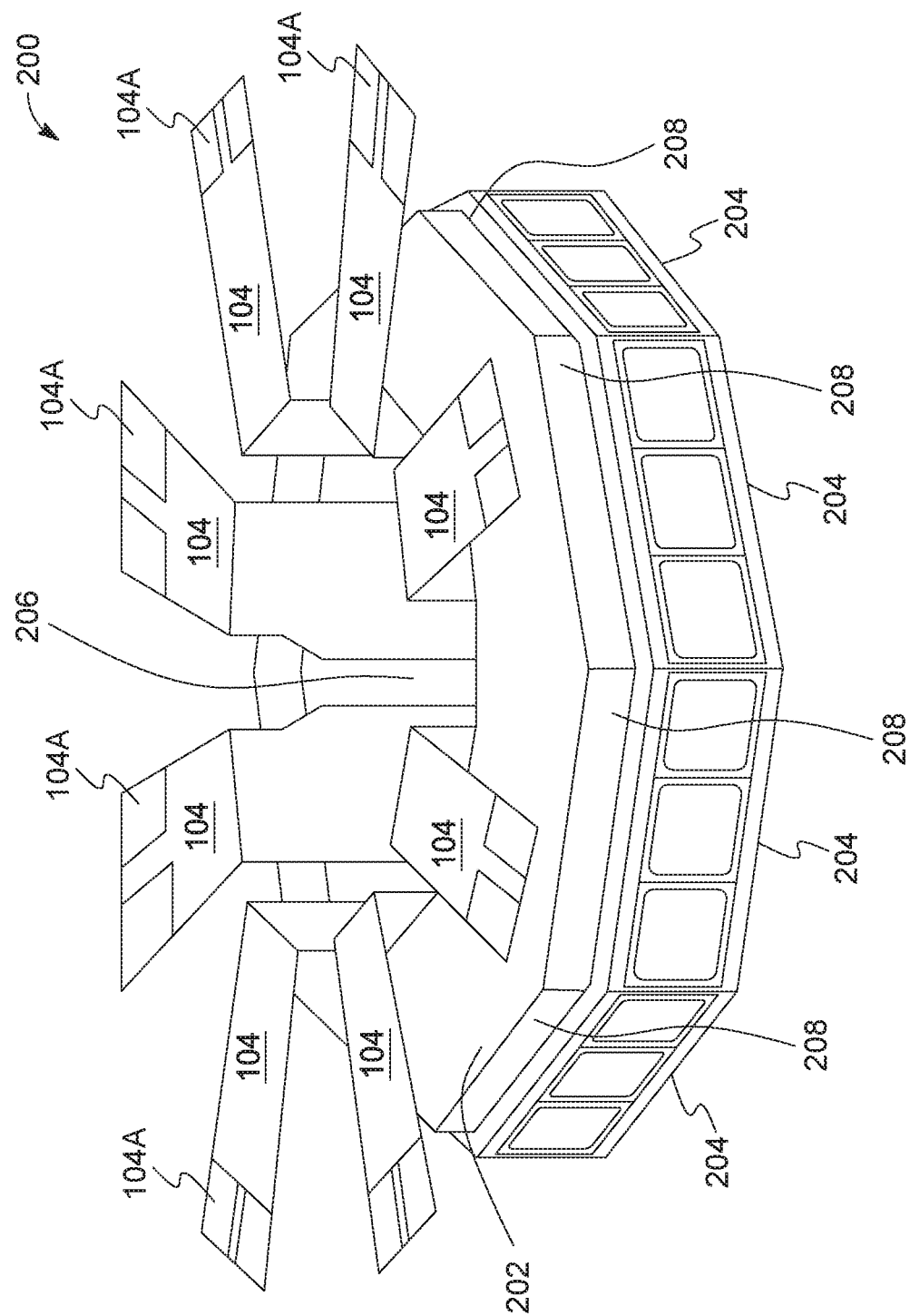
FIG. 2A is a perspective view of an example of an illumination source utilizing the flexible printed circuit board of FIG. 1, according to aspects of the disclosure.
Figure 2B:
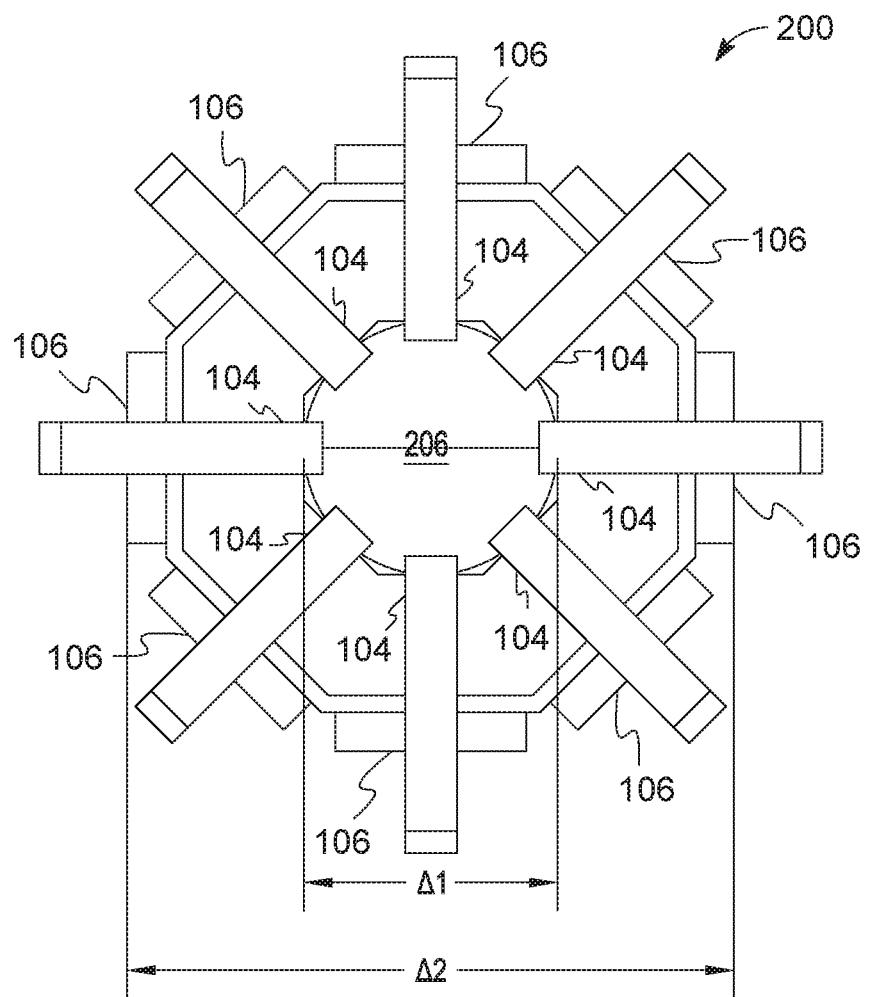
FIG. 2B is a planar top-down view of the illumination source of FIG. 2A, according to aspects of the disclosure.
Figure 2D:
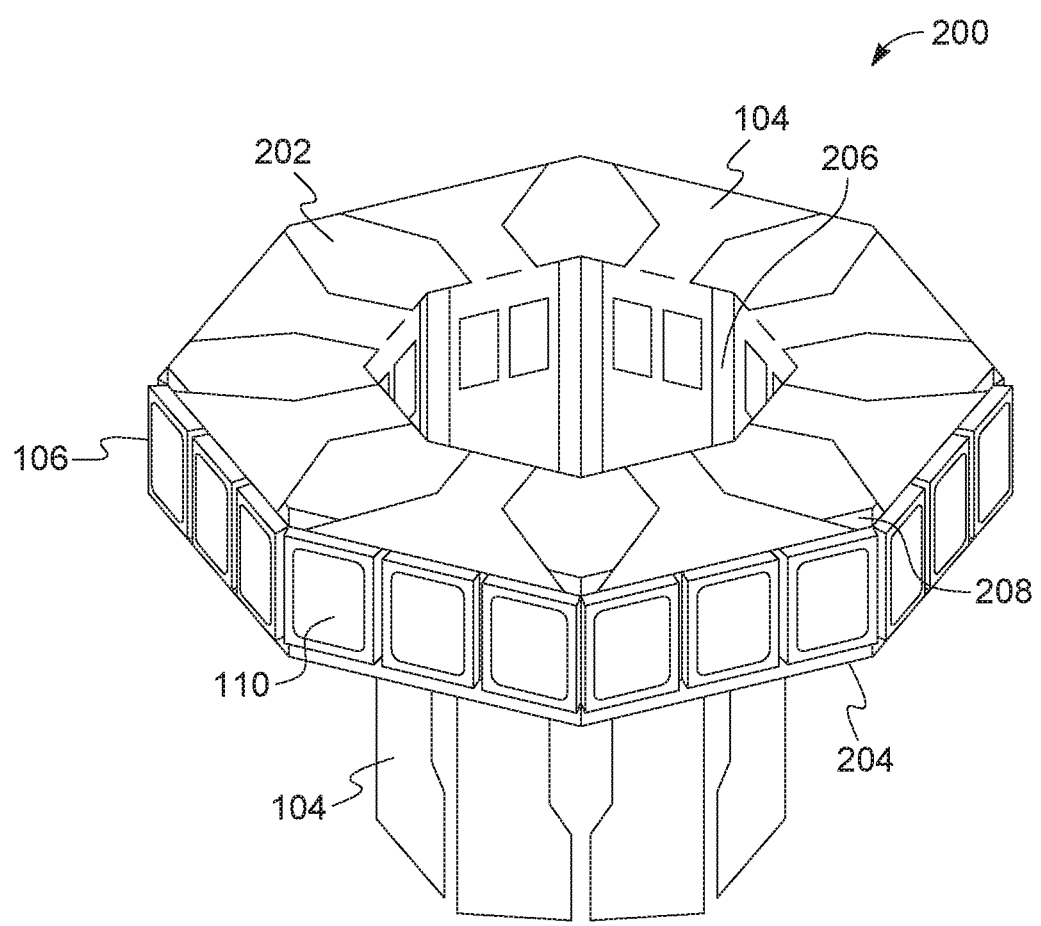
FIG. 2D is a perspective bottom-up view of the illumination source of FIG. 2A, according to aspects of the disclosure.

FIGS. 2A-D show diagrams of an example illumination source according to aspects of the disclosure. In particular, FIG. 2A is a perspective view of an example of an illumination source utilizing the flexible printed circuit board of FIG. 1, FIG. 2B is a planar top-down view of the illumination source of FIG. 2A, FIG. 2C is a side view of the illumination source of FIG. 2A and FIG. 2D is a perspective bottom-up view of the illumination source of FIG. 2A. The flexible printed circuit board 100 is shown in FIGS. 2A-2D, as is a base 202 (also referred to as a core) to which the flexible printed circuit board 100 is attached.

As shown in FIGS. 2A-2D, the base 202 contains multiple sides 208 and a opening or opening 206 in the center of the base 202 that extends between the top and bottom surfaces of the base 202. As shown, the base 202 may be formed in an octagonal shape, although in other embodiments, the base 202 may be formed in a hexagonal, pentagonal, square or triangular shape, among others. The base 202 may thus have a round cross-section or a cross-section that is shaped as another type of polygon (e.g., a rectangle, a hexagon, a decagon, etc.).

The legs 104 of flexible printed circuit board 100 may be routed around a bottom edge 204 of the base 202, along the bottom of the base 202, and into the opening 206 at the bottom of the base 202 as shown more clearly in FIG. 2D. In some embodiments, the legs 104 may extend into the opening 206 without coming out of the top of the base 202. As shown in the embodiment of FIG. 2D, the legs 104 extend entirely through the opening 206, to come out above the base 202. In some embodiments, the legs 104 may be attached to the inner sides of the opening 206 using the PSA, although in other embodiments, the legs 104 may not be attached to the inner sides of the opening 206. As shown in FIGS. 2A-2C, the legs 104 may be bent such that terminal portions of the legs 104 (which contain the leg contacts 104a) may be parallel to the top surface of the base 202. As shown, the bent portions of the legs 104 may extend from the edge of the opening 206 farther radially outward than the sides 208 of the base 202, or the set of illumination sources 102 of the segment 106. In other embodiments, the body 108 may be attached to the inner wall of the base 202. In this case, the legs 104 of flexible printed circuit board 100 may be bent to extend transverse to the outer wall of the base 202.

Although in the present example the base 202 includes one or more LEDs 102 on each of its sides 208, alternative implementations are possible in which at least one of the sides 208 does not have any LEDs mounted thereon. For example, in instances in which the base 202 is rail-shaped or has a rectangular cross-section, there may be LEDs disposed on only one or two of the sides. In some implementations, the base 202 of the illumination source 200 may be formed of metal or other heat dissipating material, and it may be configured to lead heat away from the flexible printed circuit board 100. Although in the present example the LEDs in the illumination source 200 are part of the flexible printed circuit hoard, alternative implementations are possible in which the LEDs are part of another type of circuit, such as a non-flexible circuit.

Figure 3A:
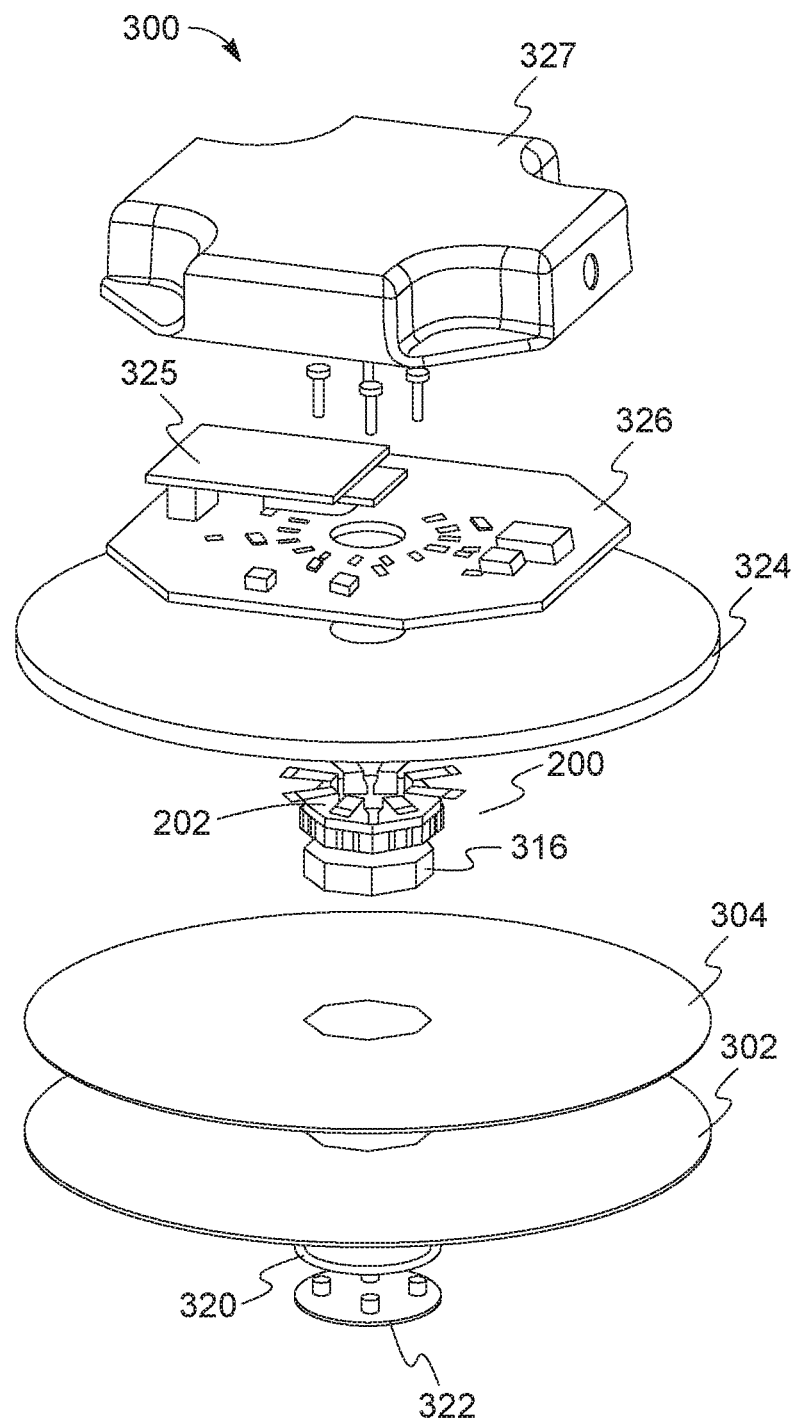
FIG. 3A is an exploded view of an example of a light fixture utilizing the illumination source of FIG. 2A, according to aspects of the disclosure.

FIG. 3A shows an exploded view of an example of a light fixture 300 that utilizes the illumination source 200, according to aspects of the disclosure. The light fixture 300 may include, among others, a light guide 302 and a reflector 304 disposed over the light guide 302. The reflector 304 described in the various embodiments herein may be placed at the back of the light guide panel to reflect downwards the light that otherwise would be directed upwards. The specularity and diffusivity properties of the reflector 304 can be tuned to broaden the light distributions in both vertical and horizontal planes. Although the various light fixtures 300 show the reflector 304 as having a cylindrical shape with a substantially rectangular cross-section, like the other elements being formed in a shape circular or multi-sided (e.g., octangular) shape, the various aspects are not so limited. For example, the reflector may extend over the outer edge of the light guide and have a frustoconical shape. The frustoconical shape has a trapezoidal cross-section, similar to the shape of the light guide in FIG. 10A. The underlying light guide may retain the same frustoconical shape.

In some embodiments, the light fixture may include further elements, such as a diffuser disposed under the light guide 302, to diffuse light directed out from the light guide to an external environment. Although in the present example the light guide 302 is shaped as a disk having an interior opening (e.g., an opening in the middle of the disk or at another location), alternative implementations are possible in which the light guide 302 has a different shape. For example, the light guide 302 may be shaped as a rectangle or another polygon (e.g., octagon, hexagon, etc.), a rail, etc. The shape may be determined based on any applicable reason such as light distribution preference, physical space requirements, or the like. A light distribution preference may be based on an application of a light fixture, an environmental conduction (e.g., objects to illuminate, distance to illuminate, available ambient light, etc.), or a user input. It should be noted that although one or more specific light guide shapes are shown in the figures contained herein, the shape of a light guide may be adjusted to be any applicable shape that results in a desired light distribution.

Figure 3B:
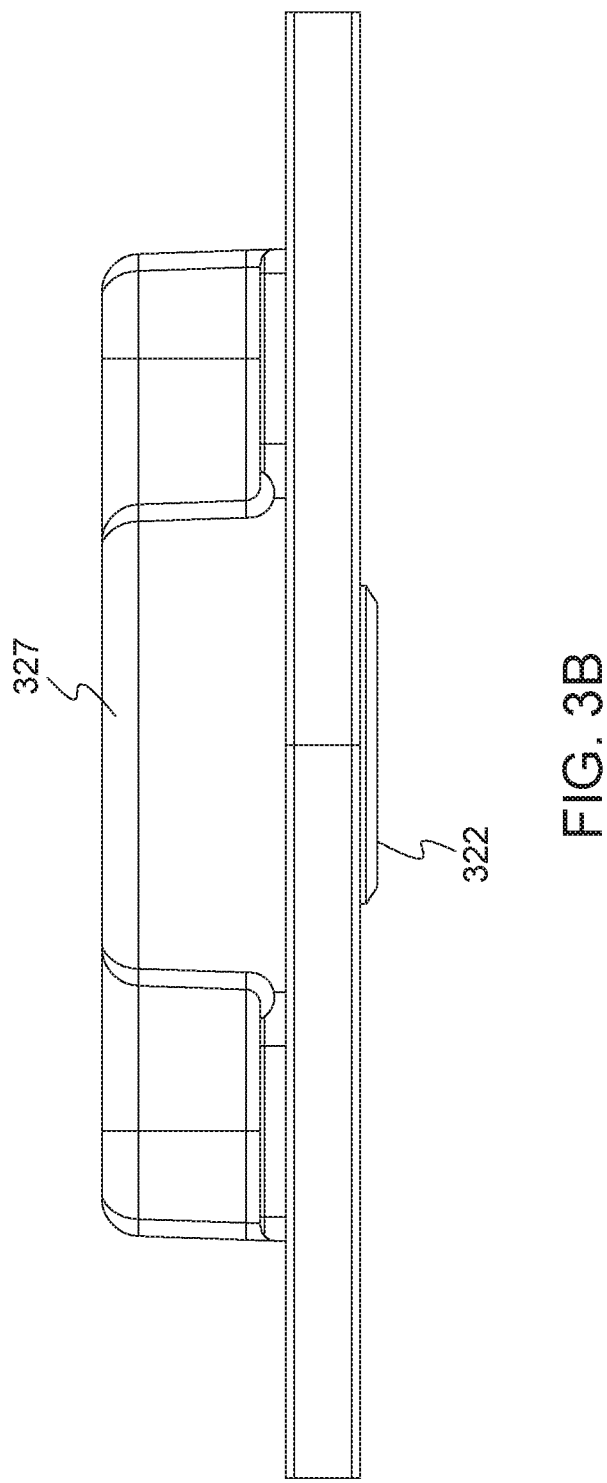
FIG. 3B is a side view of the combined light fixture of FIG. 3A, according to aspects of the disclosure.

The illumination source 200 may be connected to a PCB structure containing one or more control boards, such as printed circuit board (PCB) 326 for controlling the operation of the LEDs. As illustrated in FIG. 3, the PCB 326 may be situated above the base 202. In addition, a secondary control hoard 325 (or daughterboard) may be situated above the PCB 326 (or motherboard). The secondary control board 325 contain communication electronics through which a user device is able to wirelessly communicate lighting settings to set the lighting of the illumination source 200 via the PCB 326 and the secondary control hoard 325. As different protocols (e.g., WiFi, Bluetooth, Zigbee) may be used, and the secondary control board 325 may only support a single protocol, the secondary control board 325 may be removable (swappable) to change the protocol used to communicate the information from the user device. The secondary control board 325 may also communicate information to the user device, such as present lighting conditions, available lighting conditions, and error messages. The PCB 326 and the secondary control hoard 325 may be protected by a removable cover 327 formed from an opaque material, such as metal or plastic.

Figure 4A:
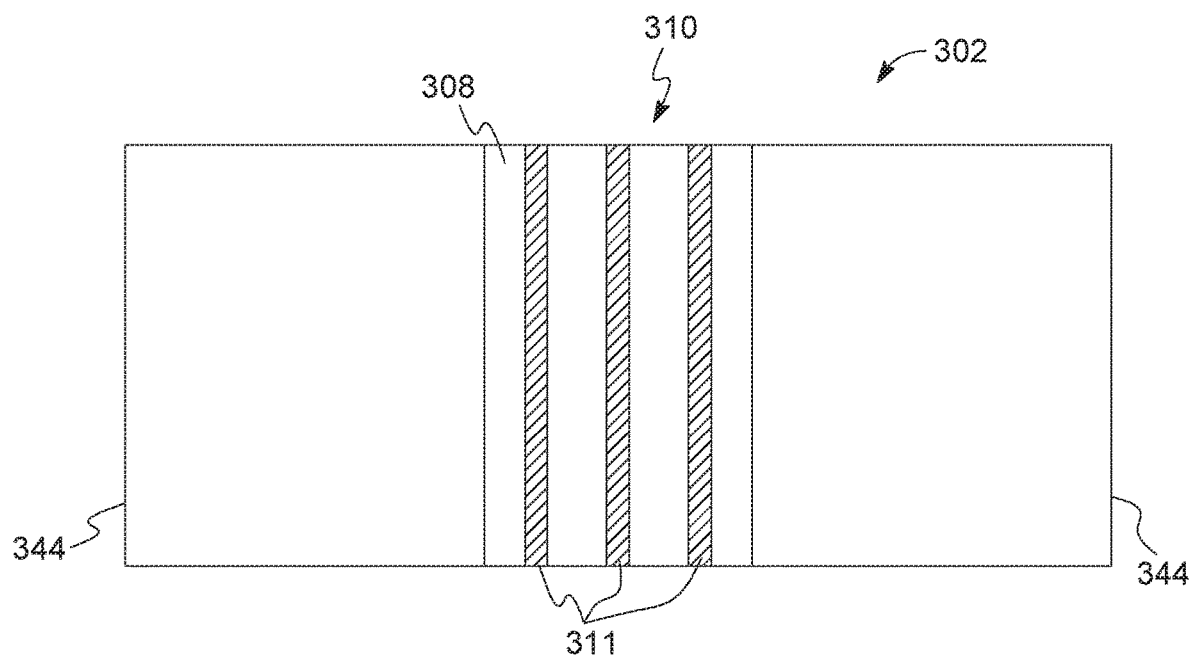
FIG. 4A is a cross-sectional side view of an example of a light guide that is part of the light fixture of FIG. 3, according to aspects of the disclosure.
Figure 4B:
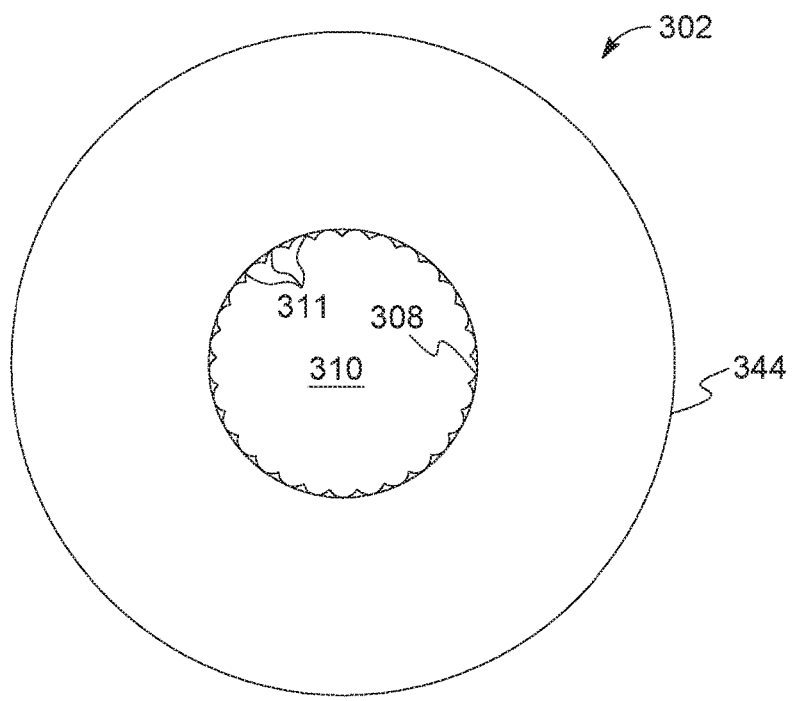
FIG. 4B is a planar top-down view of the light guide of FIG. 4A, according to aspects of the disclosure.

FIGS. 4A-B show the light guide 302 in further detail, in accordance with one particular implementation. FIG. 4A shows a vertical cross-section of the light guide 302 and FIG. 4B shows a top view of the light guide 302. As illustrated, in some implementations, the sidewalls 308 of the opening 310 of the light guide 302 may have one or more grooves (or indentations) 312 formed thereon. The sidewalls 308 may define an interior edge of the light guide 302 that faces the illumination source 200 when the illumination source 200 is at least partially disposed in the opening 310. The grooves may have any suitable shape, such as a circular shape, linear shape, a curved shape, etc. In the present example, the grooves 311 may be vertical, and they may have a linear shape that extends fully or partially between the top and bottom surfaces of the light guide 302. Additionally or alternatively, in some implementations, the grooves 311 may be horizontal, and they may have a linear shape that extends fully or partially around the circumference of the opening 310 of the light guide 302. The grooves 311 may have any suitable type of depth. In some implementations, the grooves 312 may be less than 1 mm deep. Additionally or alternatively, in some implementations, the grooves 311 may be less than 2 mm deep. Additionally or alternatively, in some implementations, the grooves 311 may be less than 3 mm deep. Additionally or alternatively, in some implementations, the grooves 311 may be less than 4 mm deep. Additionally or alternatively, in some implementations, the grooves 311 may be less than 5 mm deep. Additionally or alternatively, in some implementations, the grooves 311 may be less than 10 mm deep. Additionally or alternatively, in some implementations, the grooves 311 may be less than 20 mm deep, etc. Although in the present example the grooves 311 are formed on the interior edge of the light guide 302, alternative implementations are possible in which the same or similar groves are formed on the outer edge 344 of the light guide 302. In such instances, there may be additional LEDs that are optically coupled to the outer edge 344 of the light guide 302 (e.g., see FIG. 8).

Figure 8:
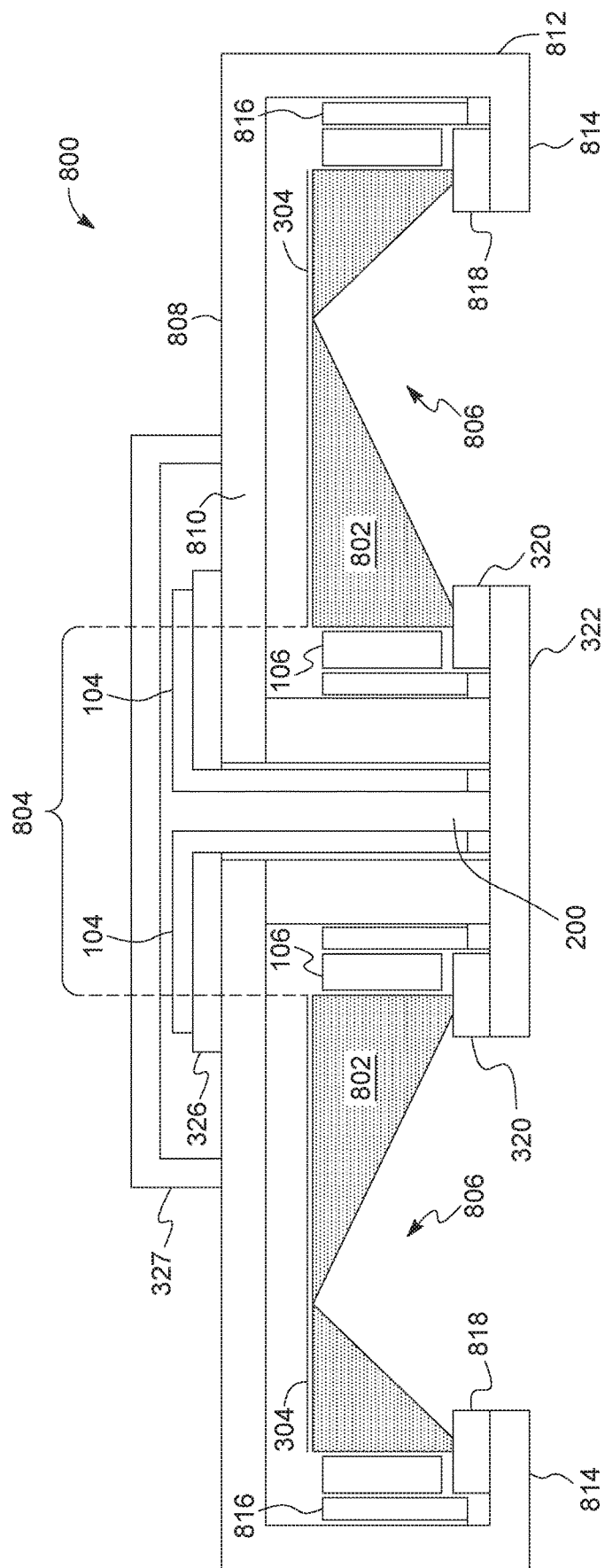
FIG. 8 is a cross-sectional side view of yet another example of a light fixture, according to aspects of the disclosure.

Although the light guide 302 has a flat surface in the example of FIGS. 4A-B, alternative implementations are possible in which the light guide has a recess formed in its surface (e.g., see FIG. 8). Furthermore, alternative implementations are possible in which the light guide 302 is tapered and or chamfered (e.g., see FIGS. 9 and 10). Notably, the present disclosure is not limited to a specific configuration of the light guide 302.

Figure 6:
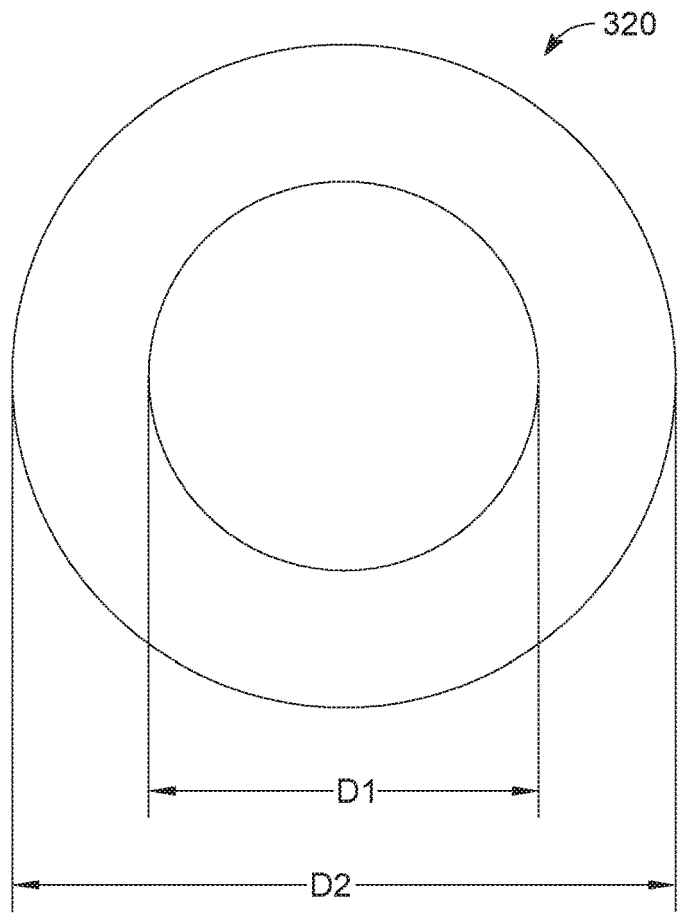
FIG. 6 is a cross-sectional side view of the light fixture of FIG. 3, according to aspects of the disclosure.

As shown in FIG. 3, the illumination source 200 may be coupled to a mounting post 316. In some implementations, the illumination source 200 may be disposed at least partially inside the opening 310 in the light guide 302, as shown in FIGS. 4A-B, such that light emitted from the illumination source 200 is injected into the light guide 302 through the opening's sidewalls 308 of FIGS. 4A-B (e.g., the interior edge of the light guide 302). A reflector 320 may be disposed under the illumination source 200, as shown. The reflector 320 is shown in further detail in FIG. 6. As illustrated, in some implementations, the reflector 320 may be ring-shaped. In some implementations, the reflector 320 may have an inner diameter D1 that is smaller than the inner diameter Δ1 of the illumination source 200, as shown in FIG. 2B. Additionally or alternatively, the reflector 320 may have an outer diameter D2, as shown in FIG. 6, that is greater than the outer diameter Δ2 of the illumination source 200, as shown in FIG. 2B. Dimensioning the reflector 320 in this way may ensure a complete overlap between the illumination source 200 and the reflector 320, such that all, or a large portion, of light that is emitted by the illumination source 200 towards the reflector 320, without being injected into the light guide 302, is reflected back to be injected into the light guide 302 through the interior edge of the light guide.

In some implementations, as shown in FIG. 3, a cap 322 may be disposed under the light guide 302 and the reflector 320. The cap 322 may be formed of plastic, metal, and/or any other suitable type of material. In some implementations, the cap 322 may be formed of a reflective material, such that the surface of the cap 322 that faces the illumination source 200 is configured to reflect at least some of the light emitted from the illumination source 200 back towards the light guide 302. Additionally or alternatively, in some implementations, the cap 322 may be light transmissive (e.g., transparent or translucent). Additionally or alternatively, in some implementations, the cap 322 may be opaque.

In the example shown in FIG. 3, the opening 310 in the light guide 302 is a through-hole. However, alternative implementations are possible in which the opening is a blind hole. In such implementations, the reflector 320 and the cap 322 may be altogether omitted, while the illumination source 200 remains at least partially disposed inside the blind hole.

In some implementations, a heat dissipating element such as a housing/pan/heat spreading element 324 may be disposed above the illumination source 200, as shown. The pan 324 may be formed of metal and/or any other suitable type of thermally conductive material. In some implementations, the pan 324 may be thermally coupled to the base 202 of the illumination source 200. In such instances, heat that is generated by the LEDs on the illumination source 200 may be led away from the LEDs by the base 202 of the illumination source 200, into the pan 324, to be subsequently dissipated by the pan 324. In some implementations, the pan 324 may have an interior opening to allow the legs 104 of the flexible printed circuit board 100 (which is part of the illumination source 200) to be routed through the pan 324 and connected to circuitry, such as the PCB 326, that is overlying the pan 324. The pan 324 thus may form the back of the light engine 300, provide mechanical protection, and spread the heat generated by the LEDs 102 for good thermal dissipation since the pan may be contact with a center rod (shown below). The outer edge of the pan 324 may be used to shape optimally as the outer edge may significantly impact the overall photometric performance, mechanical protection, cosmetic aspect, and also ingress protection. If the light engine is not highly mechanical robust, and thermal dissipative is not too high, the reflector may be used as the housing.

In some implementations, the PCB 326 disposed over the pan 324 may include circuitry for individually addressing/controlling the operation of the LEDs or sets of the LEDs in the illumination source 200. The circuitry may be configured to control each segment 106 in the illumination source 200 independently of the remaining segments and/or each LED within the segment independently of each other LED within the segment. For example, each segment 106 may be turned on/off independently of the rest as a result of this arrangement. Additionally or alternatively, in some implementations, the brightness of each segment 106 may be changed independently of the rest as a result of this arrangement. Additionally or alternatively, in some implementations, the color of light output by each of the segments 106 may be changed independently of the rest as a result of this arrangement. Additionally or alternatively, in some implementations, the CCT of light output by each of the segments 106 may be changed independently of the rest as a result of this arrangement.

Figure 5A:
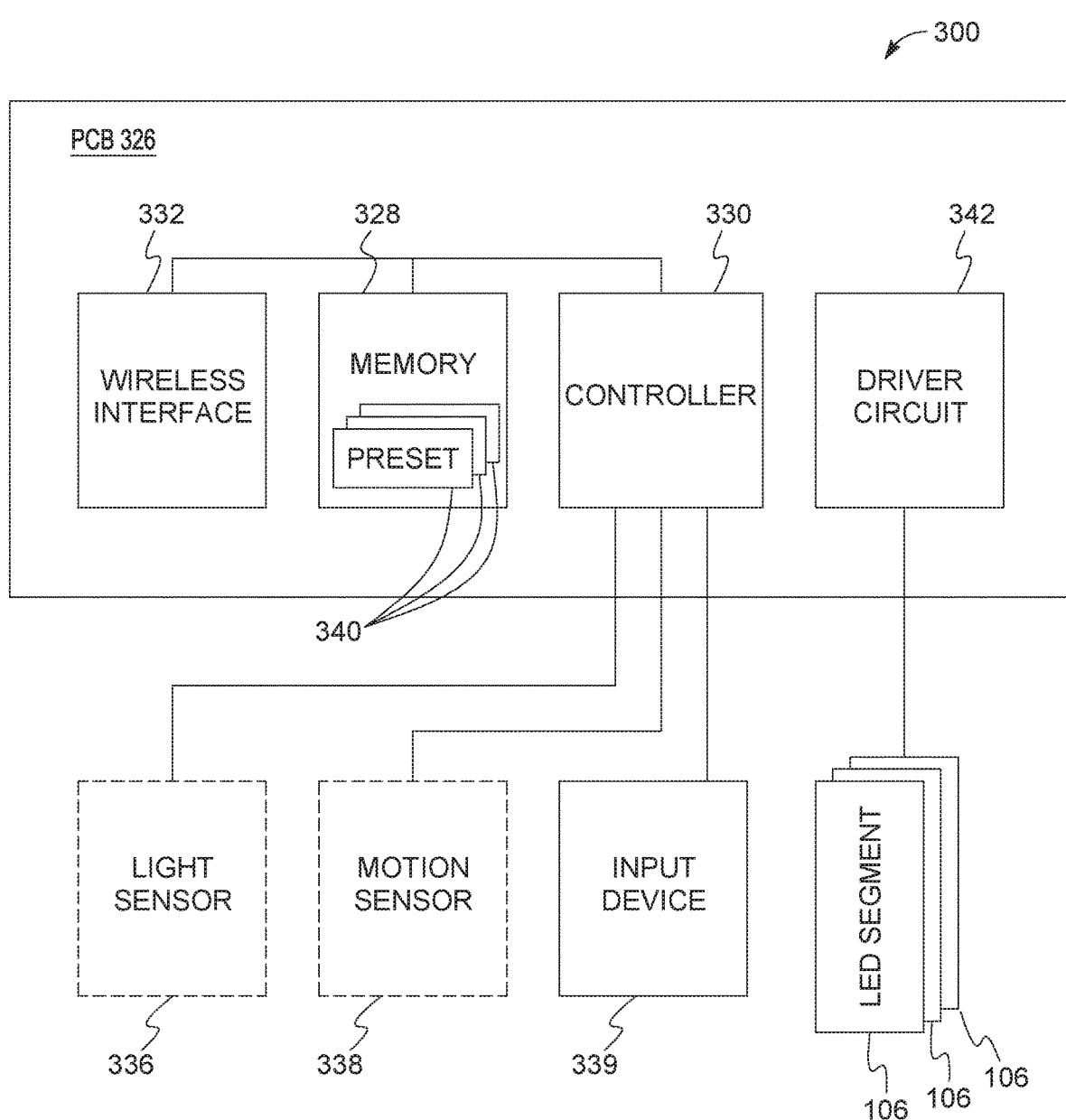
FIG. 5A is a schematic diagram of the light fixture of FIG. 3, according to aspects of the disclosure.
Figure 5B:
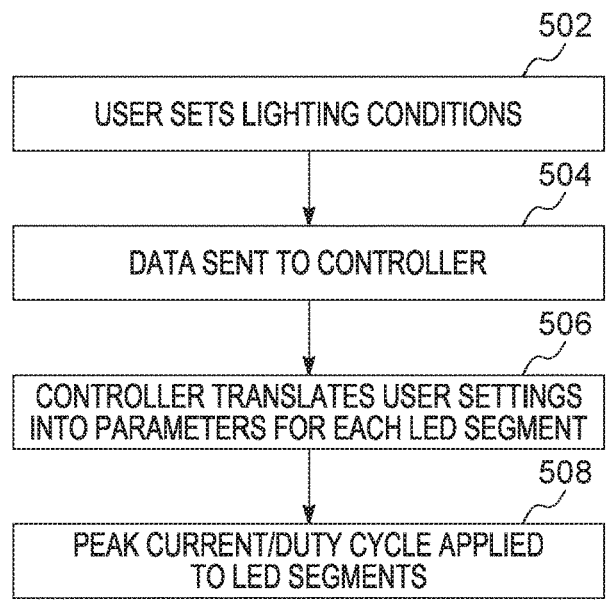
FIG. 5B is a flowchart of operation of the light fixture of FIG. 3, according to aspects of the disclosure.

FIG. 5A shows a schematic diagram of the light fixture 300 of FIG. 3 illustrating its electrical aspects, according to aspects of the disclosure. FIG. 5B is a flowchart of operation of the light fixture of FIG. 3, according to aspects of the disclosure. As illustrated, the light fixture 300 may include the PCB 326, an input device 334, and the LED segments 106. The PCB 326 may include a memory 328, a controller 330, a wireless interface 332, and a driver circuit 342. Any of the memory 328, the input device 334, the wireless interface 332, may be operatively coupled to the controller 330. The memory 328 may include any suitable type of volatile or non-volatile memory, such as one or more of a read-only memory, flash memory, EEPROM, Random Access Memory (RAM), Dynamic Random Access Memory (DRAM), etc. The controller 330 may include one or more of a general-purpose processor, an application specific integrated circuit (ASIC), a field-programmable gate array, and/or any other suitable type of electronic circuitry. The wireless interface 332 may be any applicable interface such as a Bluetooth interface, a Zigbee interface, and/or any other suitable type of wireless interface. The input device 334 may include a knob, a button, a mouse, a track pad, a keypad, or a touchscreen that can be used to select and/or specify a current preset for the light fixture.

In some implementations, the distribution of the light output by the light fixture 300 may be modified by selectively (and/or dynamically) by changing the state of different segments on the illumination source 200 independently of one another. This may be initiated by the user setting a lighting condition using a wired or wireless device at operation 502. The data corresponding to the lighting condition may then be sent at operation 504 to the controller of the light fixture 300. The controller may subsequently translate the user settings into individual parameters for each LED segment at operation 506. In such instances, the memory 328 may store respective representations of a plurality of presets 340. Any of the presets 340 may specify one or more settings for each of the LED segments 106 in the illumination source 200. Specifying settings for a given LED segment 106 may include specifying one or more of: (1) whether the LED segment is to be turned on, (2) the color of light output by the LED segment, (3) the brightness of the LED segment, (4) the CCT of light output by the LED segment, and/or any other suitable characteristic of the operation of the LED segment. Each of the settings may be represented as a number, a string, and/or any other suitable type of alphanumerical string. Each preset may be represented as any suitable type of data structure for encapsulating and/or relating the settings in the preset to one another, such as a table, a row in a table, a one-dimensional array, a two-dimensional array, etc. The presets may be stored in a lookup table in the memory 328 that are selected by a remote device (e.g., wirelessly) or local device (e.g., via a wired connection). The lookup table may serve to steer the light beam by selecting the characteristics of the LED segments, as described later.

The controller 330 may thus be configured to receive or detect user input selecting a given preset 340, retrieve the selected preset 340 from the memory 328, and/or change the state of one or more of the LED segments 106 in the illumination source 200 based on the retrieved preset 340. For each given LED segment 106, the controller may use the preset 340 to identify one or more settings corresponding to the given segment 106 and change the state of the given segment based on the identified settings. Changing the state of the given LED segment 106 may include one or more of: turning on or off the given segment 106, changing the brightness of the given segment 106, changing the color of light that is output by the given segment 106, changing the CCT of light that is output by the given segment 106, and/or changing any other suitable characteristic of the operation of the given LED segment 106.

In some implementations, the controller 330 may receive user input selecting one of the plurality of presets 340 that are stored in the memory 328, through the wireless interface 332. The memory 328 may contain a lookup table that contains a correspondence between a light distribution selected by a user equipment (e.g., smartphone, connected controller) and parameters associated with each LED segment. The parameters may include one or more of the duty cycle of current flowing to each LED segment or peak current associated with each LED segment, as shown in FIG. 5B, which may be adjusted to provide the desired illumination, as explained in more detail with reference to FIGS. 15-18 below. The lookup table may be preprogrammed based on an association between the number and placement of LED segments on the base and within the light engine (e.g., center-lit, edge lit, offset) and predetermined light distribution patterns.

Alternatively, the controller may receive input specifying a preset that the user wants to be used, through the interface 332. Thus, although in the present example the presets 340 are retrieved from a non-volatile memory located on the PCB 326 or the secondary control board 325, alternative implementations are possible in which a particular preset 340 is specified or selected by the user (e.g., on the user's smartphone) and received by the controller via the wireless interface 332. In the latter case, the preset 340 may be stored in volatile memory and deleted or discarded, eventually. The present disclosure is not limited to any specific method for storing, implementing, or selecting the presets. Additionally or alternatively, in some implementations, the PCB 326 may be coupled to an input device 339, such as a knob, keypad, or a touchscreen that can be used to select and/or specify a current preset for the light fixture.

Figure 20:
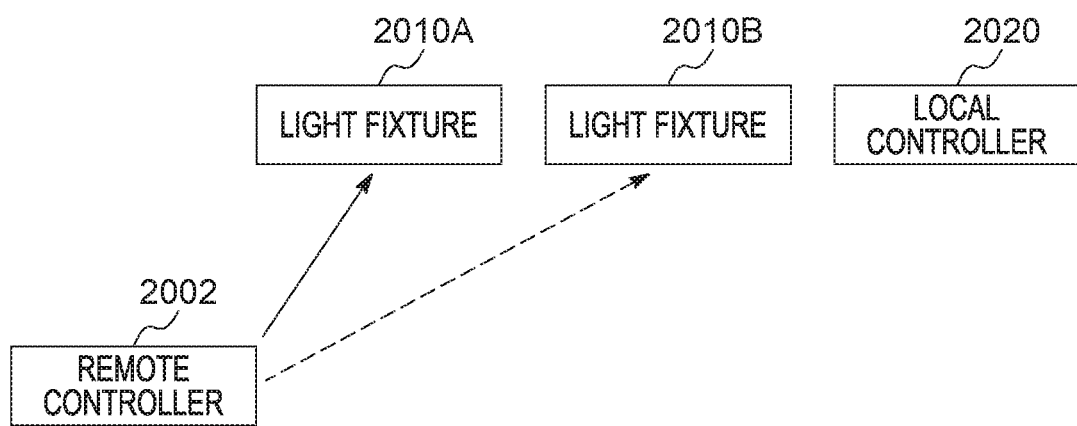
FIG. 20 shows an environment in which the system is used, according to aspects of the disclosure.

FIG. 20 shows an environment in which the system is used, according to aspects of the disclosure. As shown, one or more light fixtures 2010a, 2010b may be present in an environment 2000. The environment 2000 may be a home, office or other environment where the light fixtures 2010a, 2010b are present. Each light fixture 2010a, 2010b may contain a light engine, such as one of the light engines described herein. The LED segments in each of the light fixtures 2010a, 2010b may be wirelessly controlled by a remote controller 2002, such as a smartphone or specialized controller, using the techniques described herein. One or more of the light fixtures 2010a, 2010b may also be controlled using a local controller 2020, such as a wall panel. Control of the light fixtures 2010a, 2010b (and the light engines and the LED segments therein) may be independent of each other. Alternatively, a single light distribution may be selected by the controller 2002, 2020 and distributed to the light fixtures 2010a, 2010b. In some embodiments, the single light distribution may be the same across the light fixtures 2010a, 2010b, affecting similarly oriented LED segments in each light fixture 2010a, 2010b. In other embodiments, the single light distribution may be complementary—affecting the same number of LED segments in the light fixtures 2010a, 2010b, but in which the orientation is rotated to take into account the relative locations of the light fixtures 2010a, 2010b. Note that while only two light fixtures 2010a, 2010b are shown, there may be more than two light fixtures that include light engines. Wireless and/or wired control may be user-selectably effected over one, all or only some of the multiple light fixtures in a single command. The user may establish programs, stored in the memory of the user device and/or of the individual light fixtures to control sets of the light fixtures. In some cases, an ID may be assigned to sets of the light fixtures, the individual controllers of the light engines in the light fixtures matching an ID of the light fixture (of a group to which the light fixture is a member) to a command from the user device before controlling the light distribution of the light engine. The light fixtures 2010a, 2010b may have the same type of light engine (shown in the figures herein) or one or more of the light fixtures 2010a, 2010b may have a different light engine. For example, although not shown, one or more of the light fixtures 2010a, 2010b may include motion sensors, which may adjust the light distribution of those light fixtures 2010a, 2010b and may further adjust the light distribution of light fixtures 2010a, 2010b that do not have the motion sensors through wireless communication, sending a similar signal from device to device as that sent by the user device.

Although in the present example the light fixture 300 of FIG. 3 does not include any sensors, alternative implementations are possible in which the light fixture 300 includes a light sensor 336, as denoted by one of the dashed rectangles in FIG. 5. The light sensor 336 may be operatively coupled to the controller 330. The light sensor 336, such as a photodiode, may be configured to measure the amount of ambient light that enters the light fixture through the cap 322 and the opening 310 in the light guide 302. The light sensor 336 may thus be disposed within the opening 310. The light sensor 336 may be further configured to generate a signal that indicates the amount of ambient light in the vicinity of the light fixture 300. The controller 330 may be configured to receive the signal and switch on or otherwise change the state of the light fixture 300 when the level of the signal crosses (e.g., exceeds or falls below a threshold). Changing the state of the light fixture 300 may include one or more of switching on the light fixture 300, changing the distribution of the light output of the light fixture 300, changing the color of the light output of the light fixture 300, changing the CCT of the light fixture 300, etc. Although in the present example the light sensor 336 is depicted as being separate from the PCB 326, alternative implementations are possible in which the light sensor 336 is mounted on the PCB 326.

Although in the present example the light fixture 300 of FIG. 3 does not include any sensors, alternative implementations are possible in which the light fixture 300 includes a motion sensor 338, as denoted by one of the dashed rectangles in FIG. 5. The motion sensor 338 may be operatively coupled to the controller 330. In some implementations, the controller 330 may be configured to receive a signal that is generated using the motion sensor 338 and turn on or otherwise change the state of the light fixture 300 when the level of the signal crosses a threshold. In such implementations, the cap 322 may be configured to permit the motion sensor to operate correctly. For example, the thickness of the cap 322 and/or the material of the cap 322 may be selected so that the motion sensor 338 can operate properly inside the light fixture. Changing the state of the light fixture may include one or more of switching on the light fixture 300, changing the distribution of the light output of the light fixture, changing the color of the light output of the light fixture, changing the CCT of the light fixture, etc. Although in the present example the motion sensor 338 is depicted as being separate from the PCB 326, alternative implementations are possible in which the motion sensor 338 is mounted on the PCB 326. The input device 339 may include a knob, a keypad, or a touch screen for controlling the light fixture.

Although in the present example, the light fixture is depicted as including both a light sensor and a motion sensor, alternative implementations are possible in which both the light sensor and the motion sensor are omitted. Furthermore, alternative implementations are possible in which the light fixture 300 includes only a motion sensor. And still furthermore, alternative implementations are possible in which the light includes only a light sensor. Notably, the present disclosure is not limited to any specific sensor configuration of the light fixture 300.

Figure 7C:
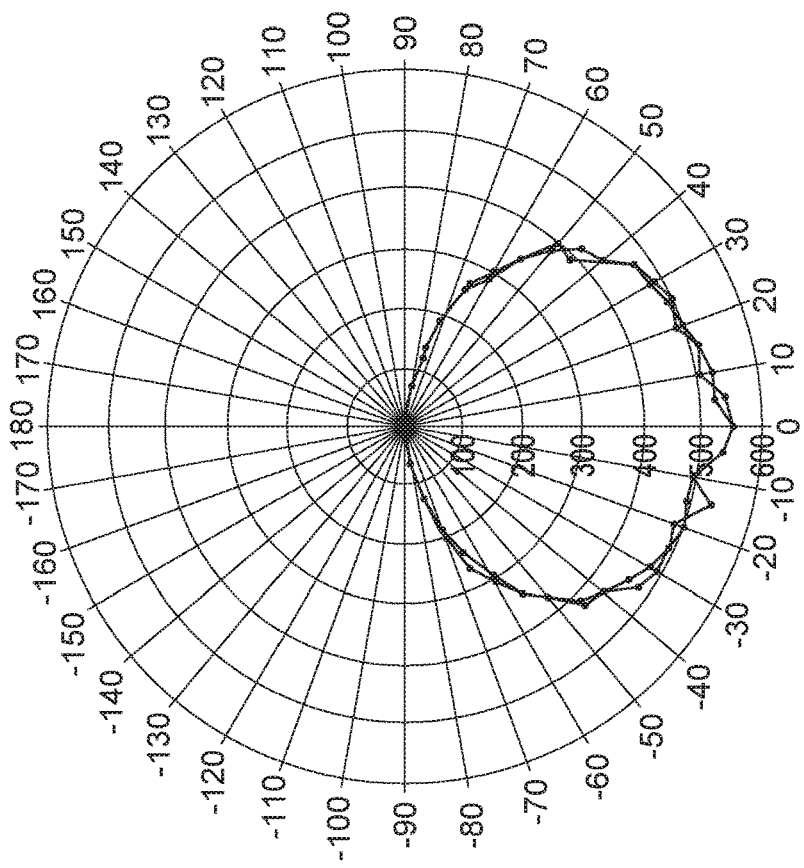
FIGS. 7B and 7C are luminance distributions, in accordance the light fixture of FIG. 7A.
Figure 7B:
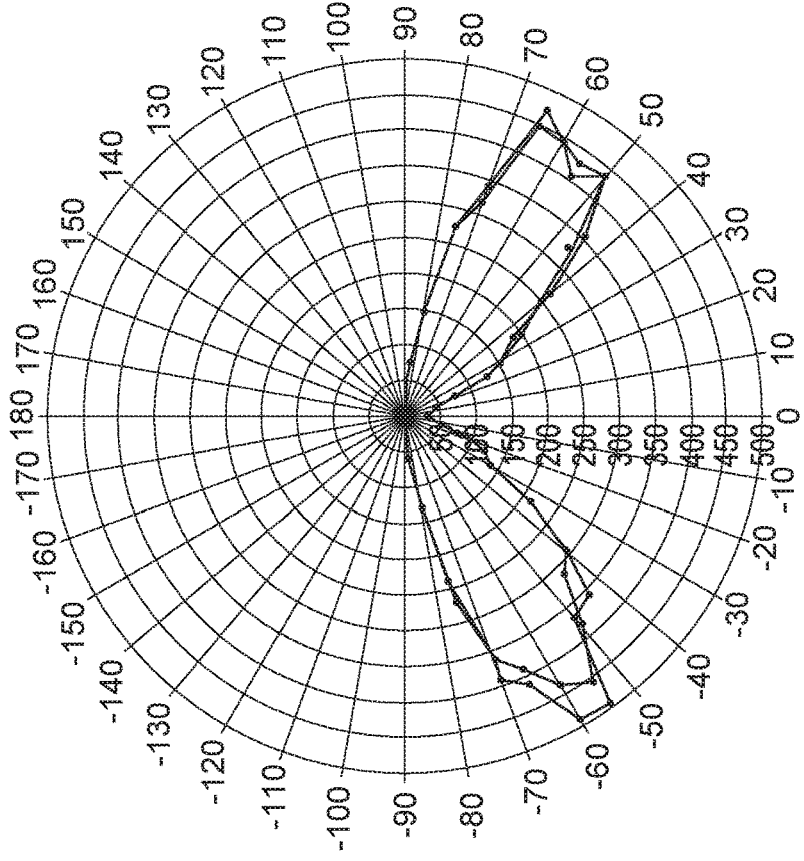

FIG. 7A shows a planar cross-sectional side view of a light fixture of FIG. 3, according to aspects of the disclosure. Note that although the opening is shown here and in other figures as extending completely through the base 202 to above the PCB 326, with the terminal portions of the legs 104 of the flexible PCB extending parallel to the PCB 326, in other embodiments, the opening may terminate within the base 202, and the terminal portions of the legs 104 of the flexible PCB remaining unbent. As illustrated, the pan 324 may have a top surface 312 and a sidewall 314. In the present example, the sidewall 314 has a length L that is greater than or equal than the thickness T of the light guide 302, such that the outer edge 344 of the light guide 302 is covered completely by the sidewall 314 of the pan 324. However, in some implementations, the length L of the sidewall may be less than the thickness T of the light guide 302, such that the outer edge 344 of the light guide 302 is only partially covered by the sidewall 314 of the pan 324. Furthermore, alternative implementations are possible in which sidewall 314 of the pan 324 is altogether omitted. The pan 324 may comprise any applicable material such as aluminum and may act as a heat sink, as further disclosed herein. FIGS. 7B and 7C are luminance distributions, in accordance the light fixture of FIG. 7A. The flat shape of the light guide may be used for intermediate batwing beam angle or Lambertian applications.

FIG. 8 shows a planar cross-sectional view of a light fixture 800, according to aspects of the disclosure. The light fixture 800 differs from the light fixture 300 of FIG. 3 in that in it includes a light guide 802 with a recess 806 in it, an LED strip 816 that is wrapped around an outer edge of the light guide 802, and a pan 808 that is provided with a lip. As illustrated, the light fixture 800 includes a disk-shaped light guide 802, having an interior opening 804 and a recess 806 that is formed around the interior opening 804. The light guide 802 thus, as shown, has a cross-section of two substantially triangular areas with different areas, with a vertex near but not at, the center of the length of the light guide 802. In other embodiments, the areas may be the same. An illumination source 200 may be at least partially disposed in the interior opening, and a cap 322 may be disposed underneath the light source, while a reflector 320 is disposed between the cap 322 and the illumination source 200, as shown.

In some implementations, the recess 806 may completely or partially surround the interior opening 804. The recess 806 may have a triangular cross-section, and or any suitable shape of cross-section. A pan 808 may be disposed over the light guide 802, as shown. The pan 808 may be formed of metal and/or any other suitable type of thermally conductive material. In some implementations, the pan 808 may be thermally coupled to the base 202 of the illumination source 200. In such instances, heat that is generated by the LEDs on the illumination source 200 may be led away from the LEDs by the base 202 of the illumination source 200, into the pan 808, to be subsequently dissipated by the pan 808.

As illustrated, the pan 808 may include a top portion 810 that is coupled to a sidewall 812. The sidewall 812 may be provided with a lip 814, and an LED strip 816 may be disposed between the sidewall 812 and the light guide 802. In some implementations, the LED strip 816 may have adhesive backing that is adhered to the interior surface of the sidewall 812. A reflector 818 may be provided between the lip 814 and at least a portion of the LED strip 816. In some implementations, the reflector 818 may be ring-shaped and it may have an inner diameter that is smaller than the outer diameter of the light guide 802. Additionally or alternatively, the reflector 818 may have an outer diameter that is greater than the diameter of the light guide 802. As discussed above with respect to the reflector 320, configuring the reflector 818 in this manner may reflect upwards light emitted by the LED strip 816 that is not injected into the light guide 802. The use of both center edge and outer edge LED strips may provide a higher light output and/or increased degree of control over light distributions in the horizontal and vertical planes.

Figure 9A:
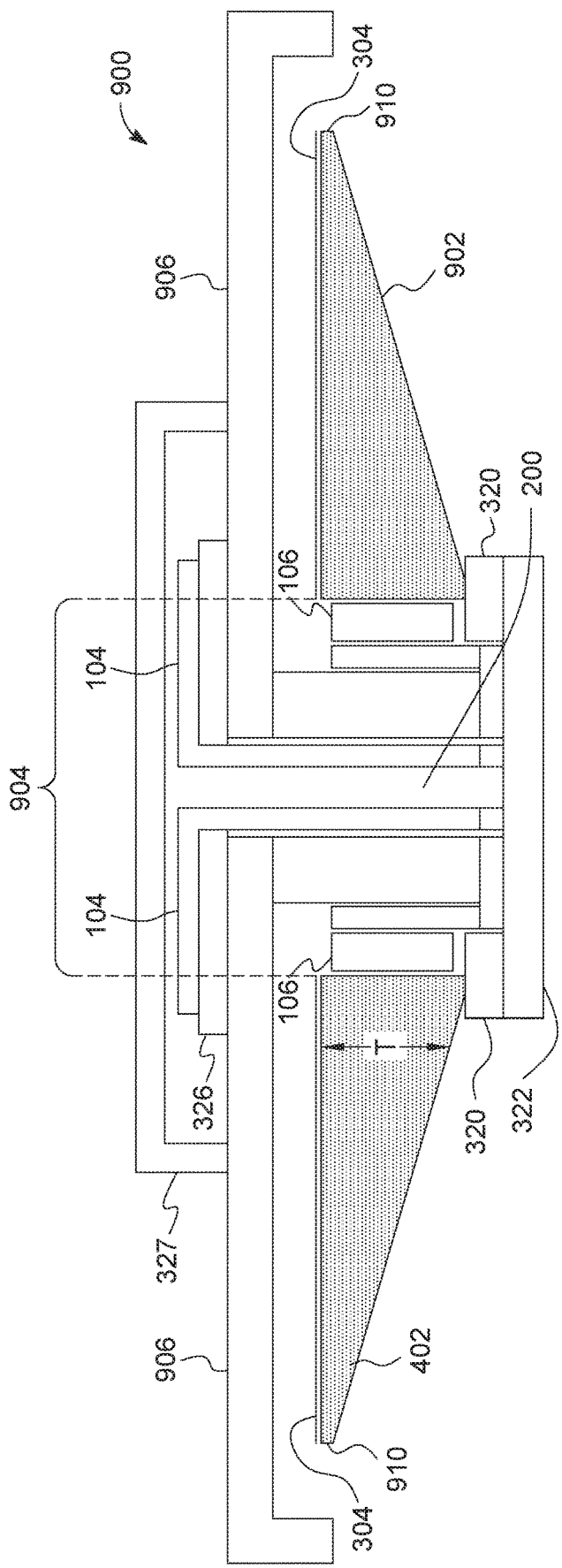
FIG. 9A is a cross-sectional side view of yet another example of a light fixture, according to aspects of the disclosure.
Figure 9C:
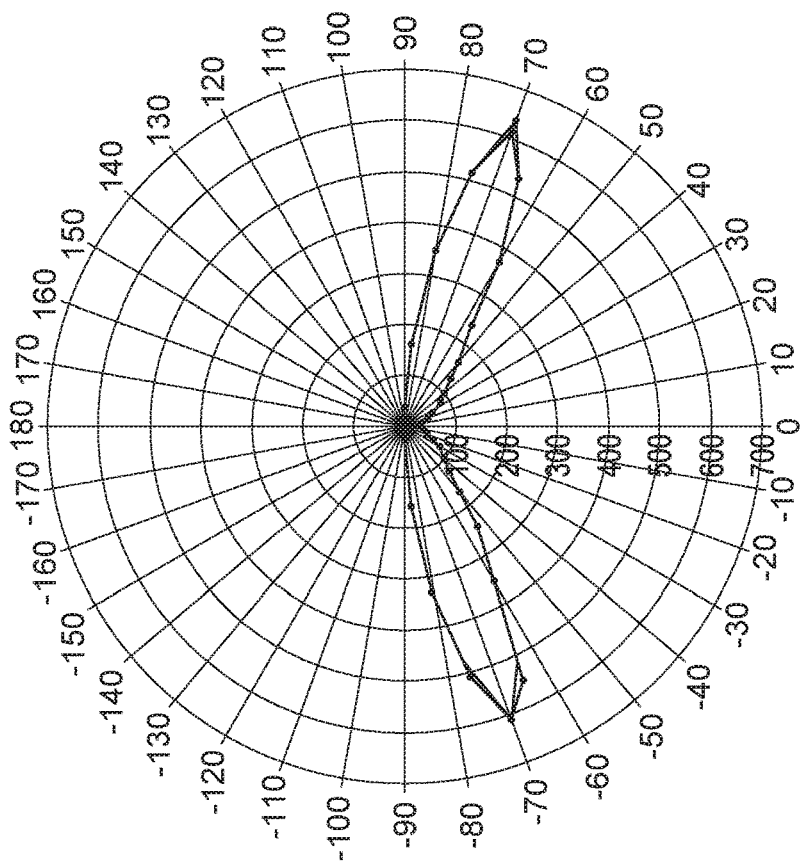
FIG. 9C is a luminance distribution, in accordance the light fixture of FIG. 9A.
Figure 9B:
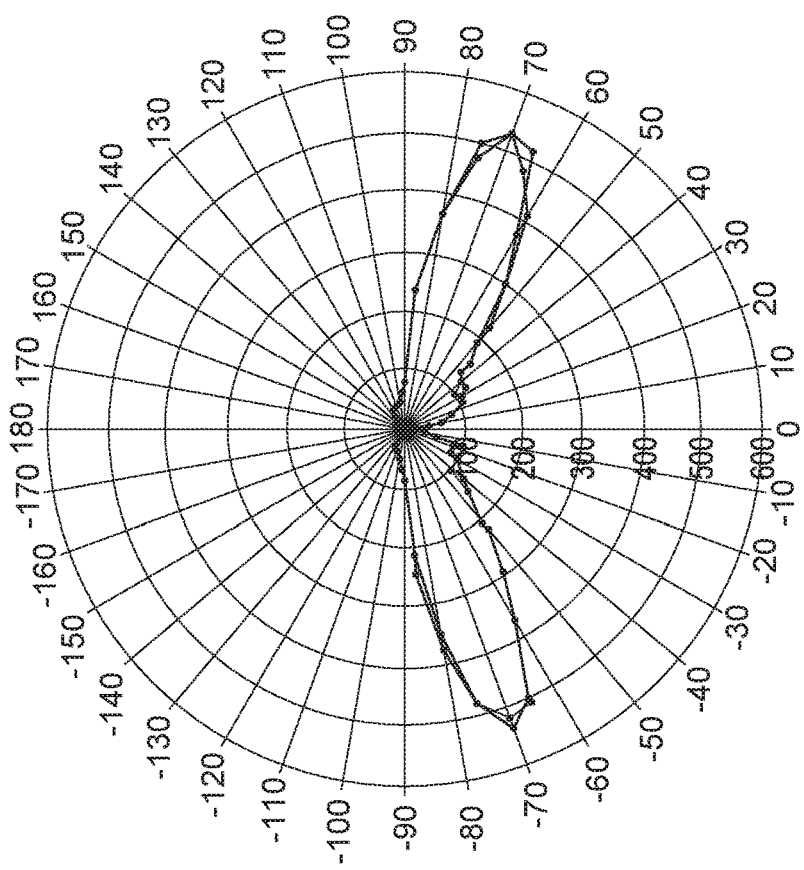
FIG. 9B is a luminance distribution, in accordance the light fixture of FIG. 9A.

FIG. 9 shows a planar cross-sectional view of a light fixture 900, according to aspects of the disclosure. The light fixture 900 differs from the light fixture 300 of FIG. 3 in that in it includes a tapered light guide 902. As illustrated, the light fixture 900 includes a disk-shaped light guide 902 having an interior opening 904. An illumination source 200 may be at least partially disposed in the interior opening, and a cap 322 may be disposed underneath the light source, while a reflector 320 may be disposed between the cap 322 and the illumination source 200, as shown. A pan 906 may be disposed over the illumination source 200. The pan 906 may be thermally coupled to the illumination source 200 and configured to dissipate heat generated by the illumination source 200. In the example of the light fixture 900, the bottom light-emitting surface 908 of the light guide 902 may be tapered, such that the thickness T of the light guide 902 decreases from the interior opening 904 of the light guide 902 to its outer edge 910 in a substantially triangular shape. FIG. 9B and FIG. 9C are luminance distributions, in accordance the light fixture of FIG. 9A. As shown in FIGS. 9B and 9C, the tapering of the light guide 902 may result in a high batwing beam angle light distribution.

Figure 10A:
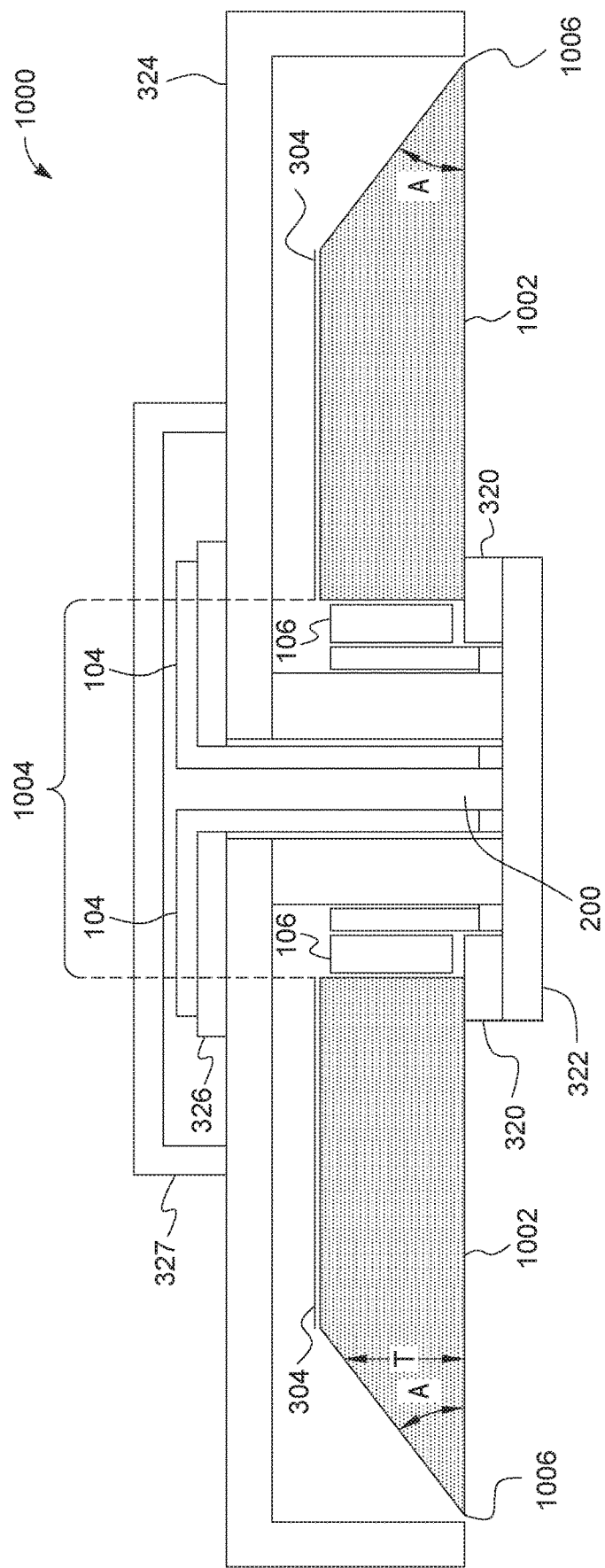
FIG. 10A is a cross-sectional side view of yet another example of a light fixture, according to aspects of the disclosure.

FIG. 10A shows a planar cross-sectional view of a light fixture 1000, according to aspects of the disclosure. The light fixture 1000 differs from the light fixture 300 of FIG. 3 in that in it includes a chamfered light guide 1002. As illustrated, the light fixture 1000 includes a disk-shaped light guide 1002, having an interior opening 1004. An illumination source 200 may be at least partially disposed in the interior opening 1004, and a cap 322 may be disposed underneath the light source, while a reflector 320 is disposed between the cap 322 and the illumination source 200, as shown.

Figure 10C:
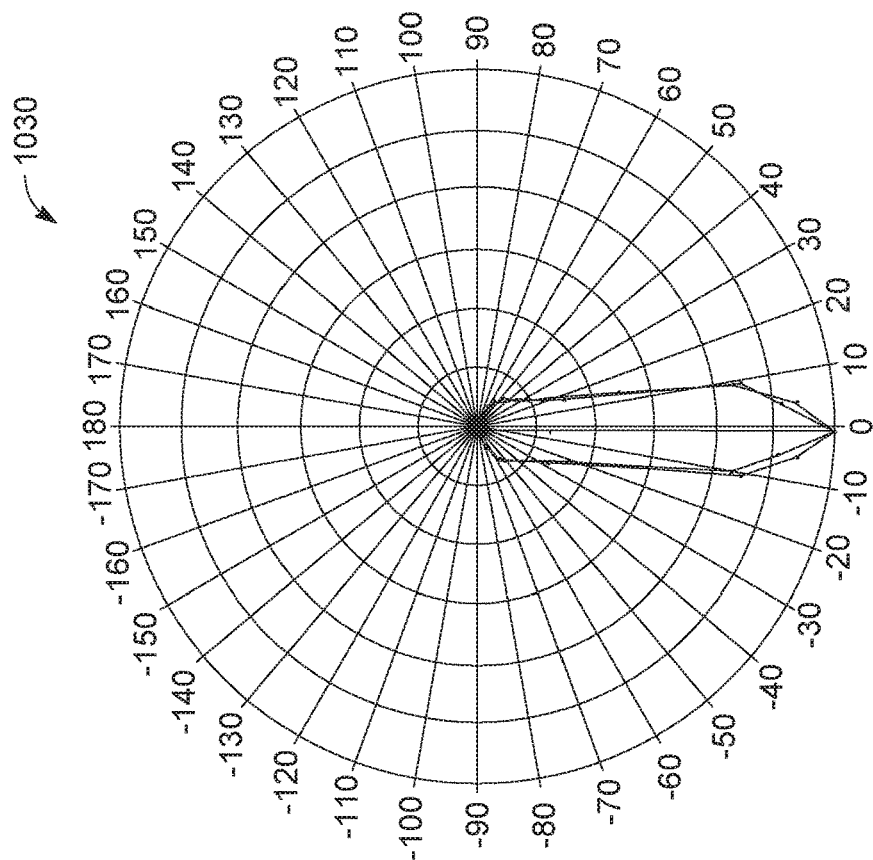
FIG. 10C is a luminance distribution, in accordance the light fixture of FIG. 10A.
Figure 10B:
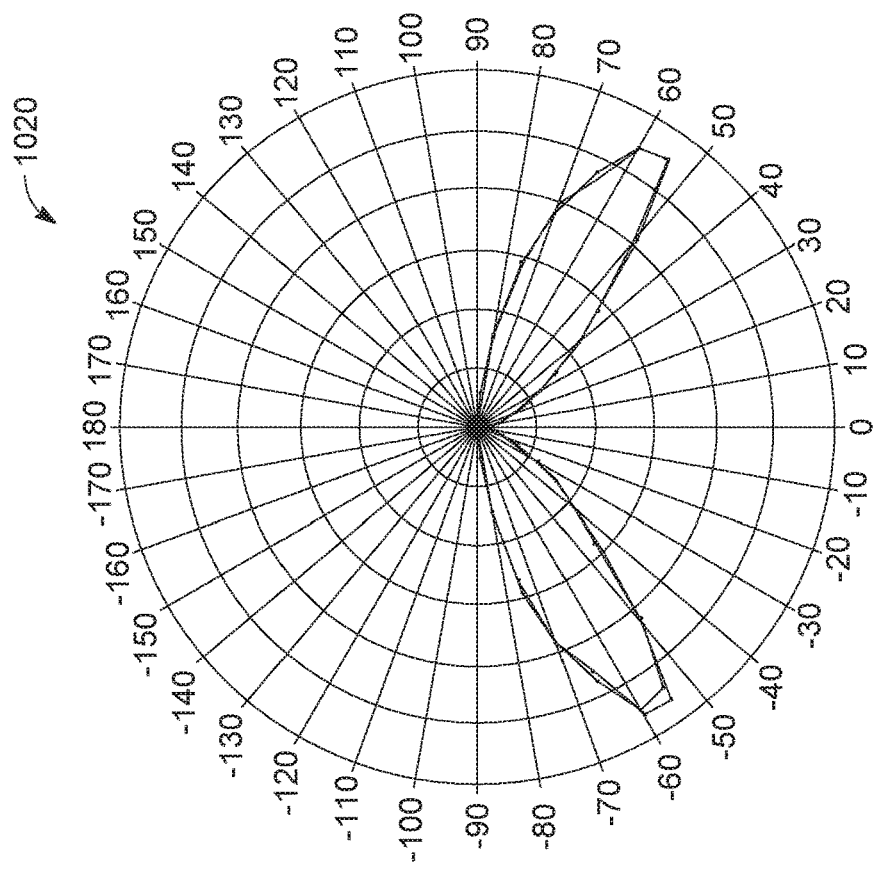
FIG. 10B is a luminance distribution, in accordance the light fixture of FIG. 10A.

In the example of the light fixture 1000, the light guide 1002 has a chamfered outer edge, such that the thickness T of the light guide 1002 increases from the light guide's exterior edge 1006 towards the interior opening until it reaches it's a constant thickness level, as shown. According to aspects of the disclosure, the angle A of the chamfer may be used to deliberately shape the distribution of the light output of the light fixture. For example, the polar diagram 1020, which is shown in FIG. 10B shows the light distribution produced by a light guide having a chamfer angle of approximately 10 degrees. As illustrated, when the chamfer angle of the light guide is approximately 10 degrees, the light guide 1002 may produce a batwing distribution having lobes that are spaced apart from one another. As another example, the polar diagram 1030, which is shown in FIG. 10C, shows the light distribution produced by a light guide having a chamfer angle A of approximately 45 degrees. As illustrated, when the chamfer of the light guide is approximately 45 degrees, the light guide may produce a "spotlight" distribution having lobes that are approximately coincident.

Stated succinctly, the chamfer angle A of the light guide 1002 may be used to control the spread of the light output of the light fixture 1000. In some implementations, the chamfer of the light guide 1002 may be configured to produce a light distribution having at least two lobes that are at least partially coincident. The angle of the chamfer may produce a desired degree of overlap between the two lobes, and it may be somewhere between 10 and 45 degrees, in some implementations. The flat shape of the light guide may be used for intermediate batwing beam angle or spot applications.

Figure 11:
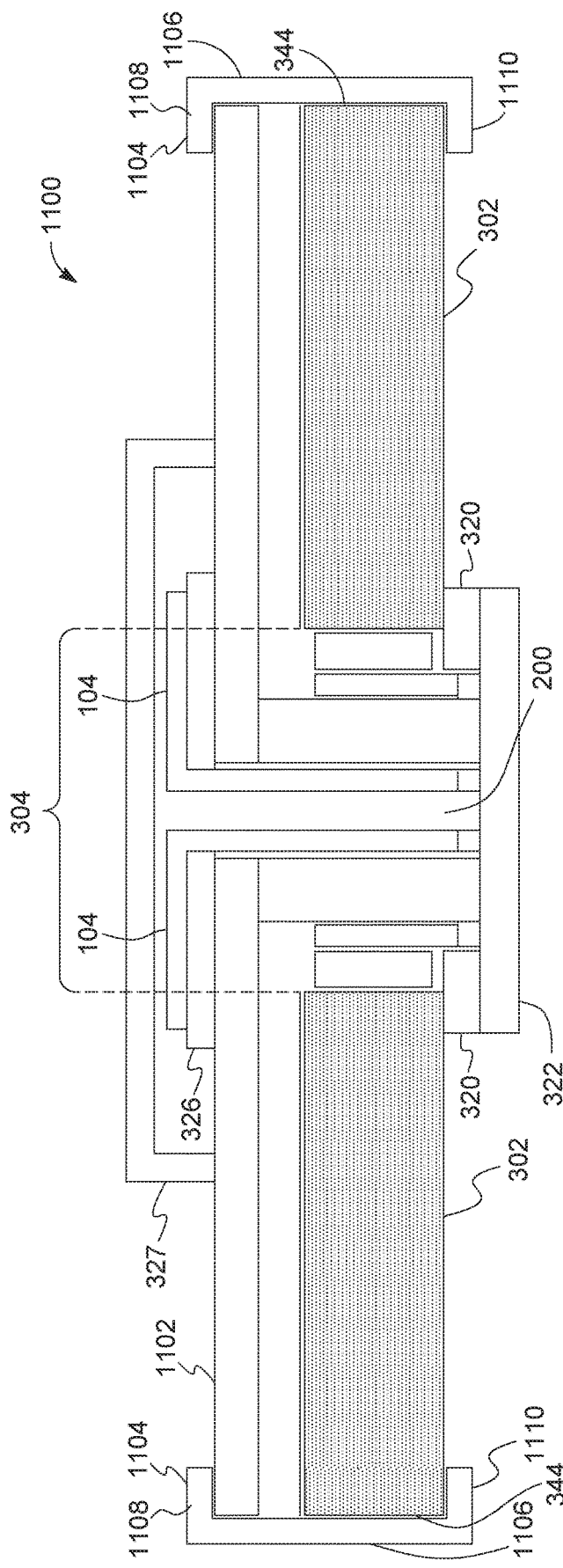
FIG. 11 is a cross-sectional side view of yet another example of a light fixture, according to aspects of the disclosure.

FIG. 11 is a planar cross-sectional view of a light fixture 1100, according to aspects of the disclosure. The light fixture 1100 differs from the light fixture 300 of FIG. 3 in that in it includes a reflective gasket 1104 disposed around the circumference of the light fixture 1100. As illustrated, the light fixture 1100 includes a disk-shaped light guide 302, having an interior opening 305. An illumination source 200 may be at least partially disposed in the interior opening, and a cap 322 may be disposed underneath the light source, while a reflector 320 is disposed between the cap 322 and the illumination source 200, as shown. A pan 1102 may be disposed over the illumination source 200. The pan 1102 may be thermally coupled to the illumination source 200 and configured to dissipate heat generated by the illumination source 200. Unlike the pan 324 of FIG. 3, the pan 1102 does not have any sidewalls. However, a reflective gasket 1104 is edge coupled to the pan 1102 and the light guide 302, as shown.

In some implementations, the reflective gasket 1104 may be shaped as a ring and it may be formed of plastic, metal and/or any other suitable type of material. In the present example, the reflective gasket 1104 has a main portion 1106 that is wrapped around the outer edge of the light guide 302 and the pan 324, as well as a top lip 1108 and a bottom lip 1110. The top lip 1108 is disposed over the pan 324 and the bottom lip 1110 is disposed under the light guide 302. Although in the present example, the reflective gasket 1104 has both a top lip 1108 and a bottom lip 1110, alternative implementations are possible in which the reflective gasket 1104 includes only a top lip. Furthermore, alternative implementations are possible in which the reflective gasket has only a bottom lip.

Figure 12:
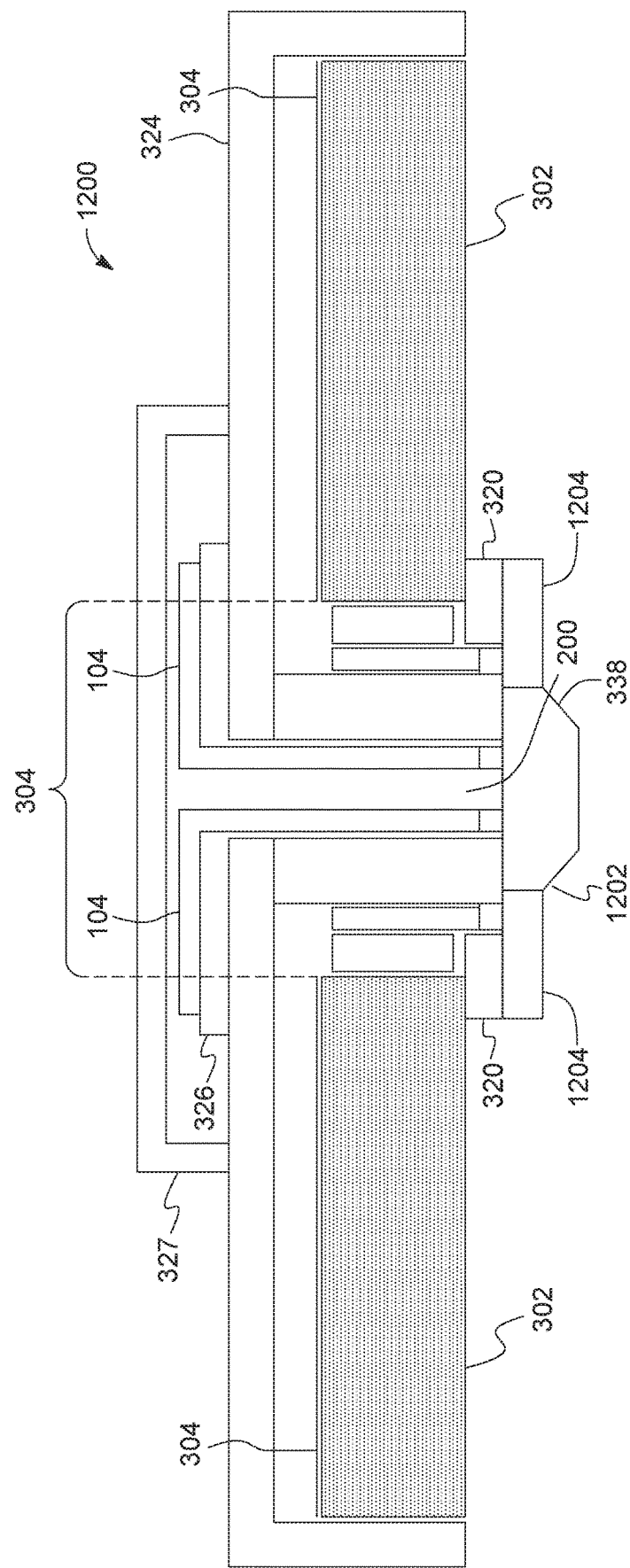
FIG. 12 is a cross-sectional side view of yet another example of a light fixture, according to aspects of the disclosure.

FIG. 12 is a planar cross-sectional view of a light fixture 1200, according to aspects of the disclosure. The light fixture 1200 differs from the light fixture 300 of FIG. 3 in that in it includes a cap assembly 1202 in place of the cap 306. As illustrated, the cap assembly 1202 may include a frame 1204 and a motion sensor 338 that is coupled to the frame 1204. The motion sensor 338 may be operatively coupled to at least one controller (not shown) that is part of the light fixture 1200. As discussed above with respect to FIG. 3, the controller may be configured to receive a signal that is generated using the motion sensor 338 and turn on or otherwise change the state of the light fixture 1200 when a level of the signal crosses a threshold.

Figure 13A:
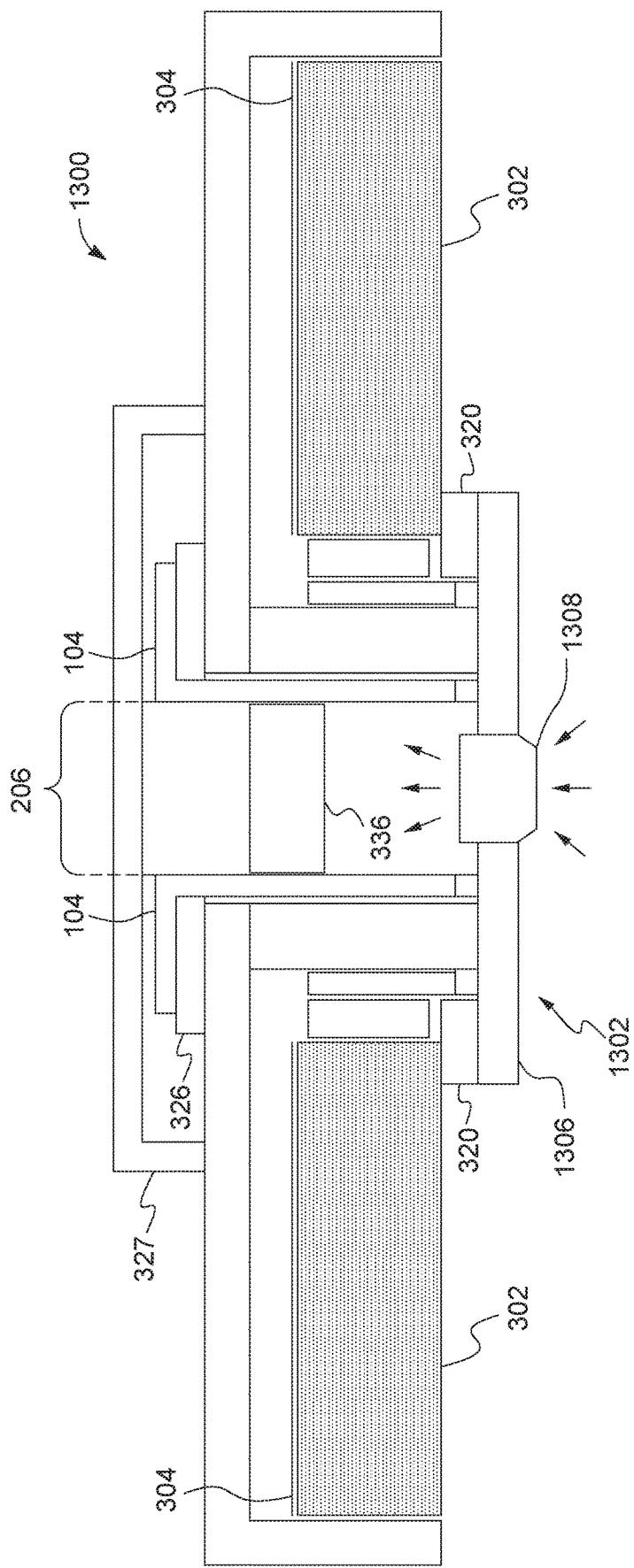
FIG. 13A is a cross-sectional side view of yet another example of a light fixture, according to aspects of the disclosure.

FIG. 13A is a planar cross-sectional view of a light fixture 1300, according to aspects of the disclosure. The light fixture 1300 differs from the light fixture 300 of FIG. 3 in that in it includes a cap assembly 1302 in place of the cap 306, which is arranged to allow a light sensor 336, as shown in FIG. 5, to detect ambient light in the vicinity of the light fixture 300. As illustrated, the cap assembly 1302 may include a frame 1306 and a light-transmissive portion 1308 that is coupled to the frame 1306. The light-transmissive portion 1308 may be made of any suitable type of light-transmissive material, such as glass or plastic. In some implementations, the light transmissive portion 1308 may include a window. Additionally or alternatively, in some implementations, the light-transmissive portion 1308 may include a lens. The light sensor 336, in some implementations, may include a photodiode or a charge-coupled device (CCD). Additionally or alternatively, in some implementations, the light sensor 336 may include or be proximate to a camera. The light sensor 336 may be disposed in the opening 206 of the illumination source 200, such that at least some of light passing through the light-transmissive portion 1308 of the cap assembly 1302 reaches the light sensor 336. The light sensor 336 may be operatively coupled to at least one controller (not shown) that is part of the light fixture 1200. As discussed above with respect to FIG. 3, the controller may be configured to receive a signal that is generated using the light sensor 336 and turn on or otherwise change the state of the light fixture 1300 when the level of the signal crosses a threshold.

In some implementations, the controller may be configured to track the position of a person or another object relative to the light fixture 1300 based on one or more signals (e.g., image signals) that are received from the light sensor 336. When the position is a first location relative to the light fixture 1300, the controller (not shown) may activate a first preset, as described herein, thereby causing the light fixture 1300 to output light having a first distribution pattern. When the position at a second location relative to the light fixture 1300, the controller (not shown) may activate a second preset, thereby causing the light fixture 1300 to output light having a second distribution pattern. The first location may be different from the second location, and the first distribution pattern may be different from the second distribution pattern.

Figure 13B:
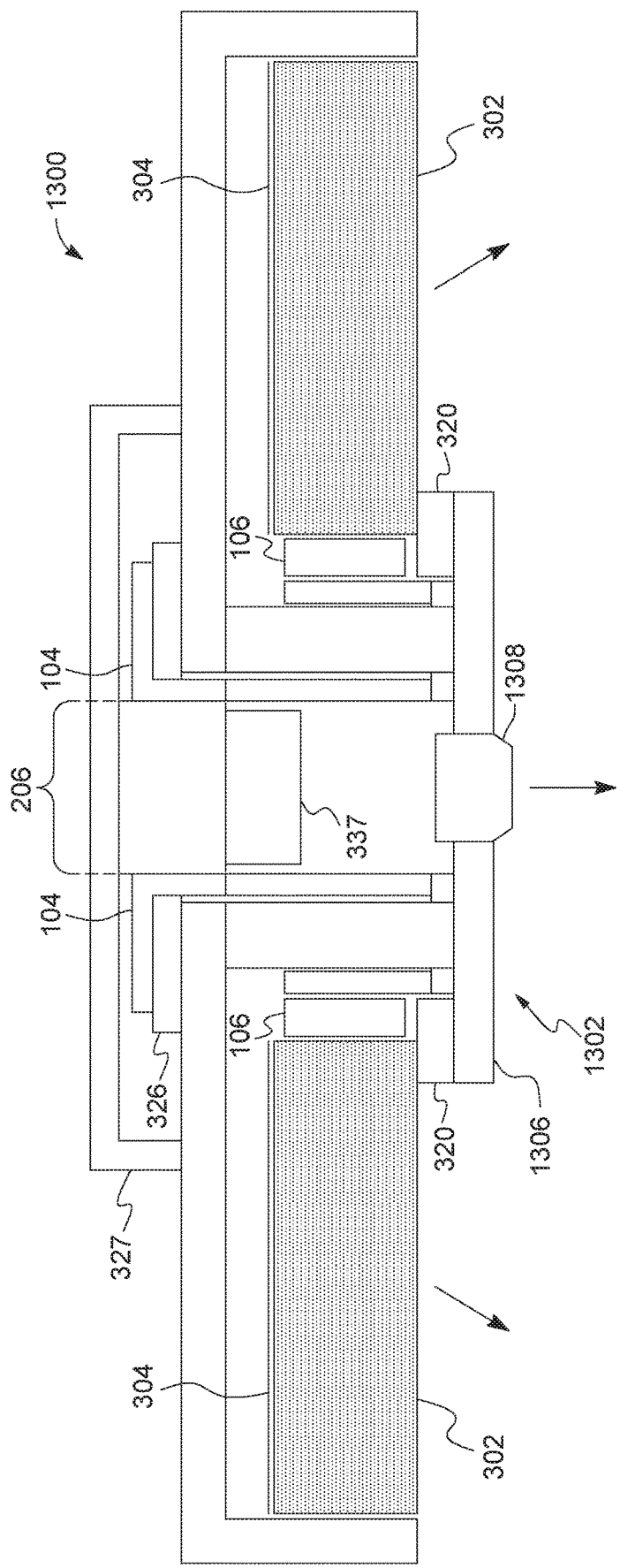
FIG. 13B is a cross-sectional side view of yet another example of a light fixture, according to aspects of the disclosure.

FIG. 13B is a planar cross-sectional view of a light fixture, according to aspects of the disclosure. The light fixture 1300 differs from the light fixture 300 of FIG. 13A in that the cap assembly 1302 is arranged to transmit light from another LED strip 337. The light-transmissive portion 1308 may be made of any suitable type of light-transmissive material, such as glass or plastic. In some implementations, the light transmissive portion 1308 may include a window. Additionally or alternatively, in some implementations, the light-transmissive portion 1308 may include a lens. The additional LED strip 337 may be disposed in the opening 206 of the illumination source 200, such that at least some of light passing through the light-transmissive portion 1308 of the cap assembly 1302 reaches the environment. The additional LED strip 337 may be operatively coupled to at least one controller (not shown) that is part of the light fixture 1200. As discussed above with respect to FIG. 3, the controller may be configured to receive a signal and change the state of the additional LED strip 337.

Thus, as shown, the front bezel-cap assembly 1302, or a bezel-ring may support a lens or a window or a motion sensor, hide the direct light from the LEDs and include mechanical threaded bosses into which screws are used to mechanically close the light engine and compress the gasket that may be present at that location. The cap may be a translucent material to allow part of the LEDs direct light to be extracted directly. A collimating film can be inserted between LEDs and light guide panel to tighten the beams and increase angular resolution if desired.

Figure 14:
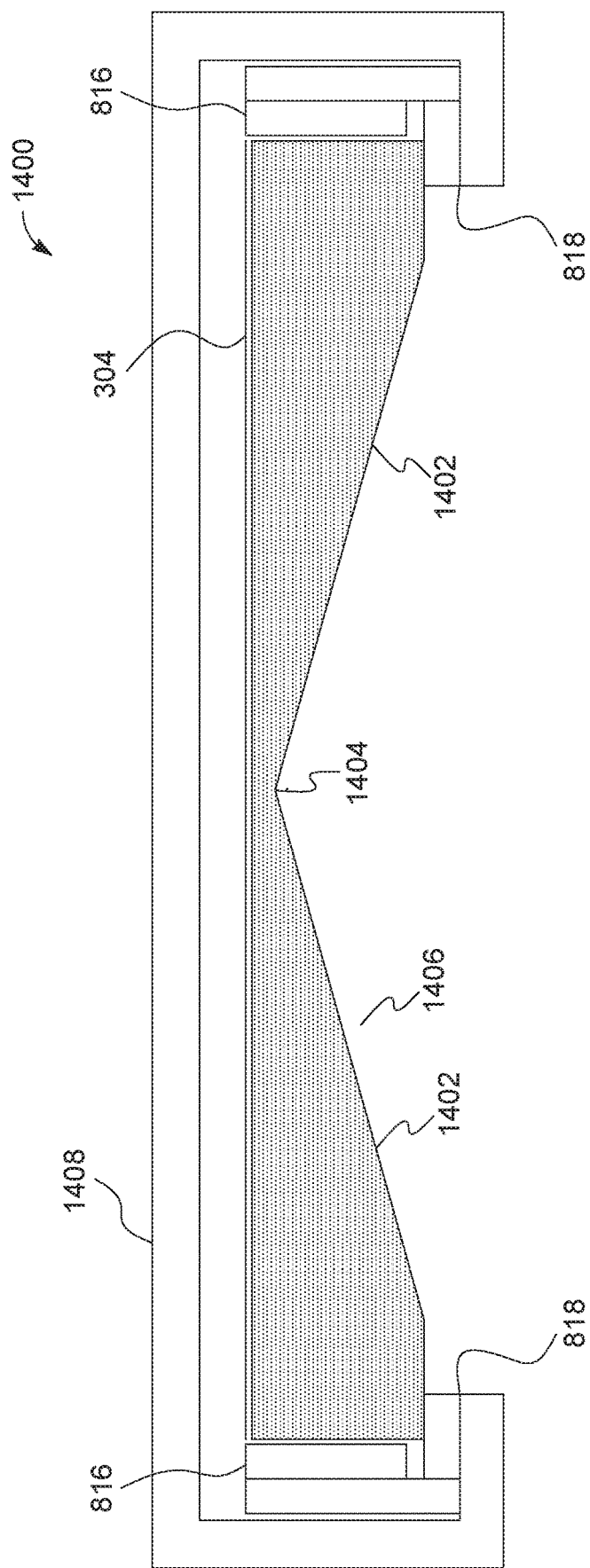
FIG. 14 is a cross-sectional side view of yet another example of a light fixture, according to aspects of the disclosure.

FIG. 14 is a planar cross-sectional view of a light fixture 1400, according to aspects of the disclosure. The fixture 1400 is similar to the fixture 800 of FIG. 8, and includes a concave light guide 1402 that provides high batwing beam angles. As illustrated, the concave light guide 1402 may lack a central opening with the centrally located illumination source 200, as shown in FIG. 8, and may instead have a recess 1404 formed thereon. The recess 1404 may have a triangular cross-section or another applicable cross-section as discussed in relation to FIG. 8. In some implementations, the recess 1404 may include a surface 1406 that defines the shape of cone. The vertex of the cone may be situated in the center of the light guide 1402 or at an off-center position. In some implementations, the light fixture 1400 may include a pan 1408 placed above the light guide 1402 such that it does not contain an internal opening, such as the internal opening 804 in FIG. 8.

Figure 15:
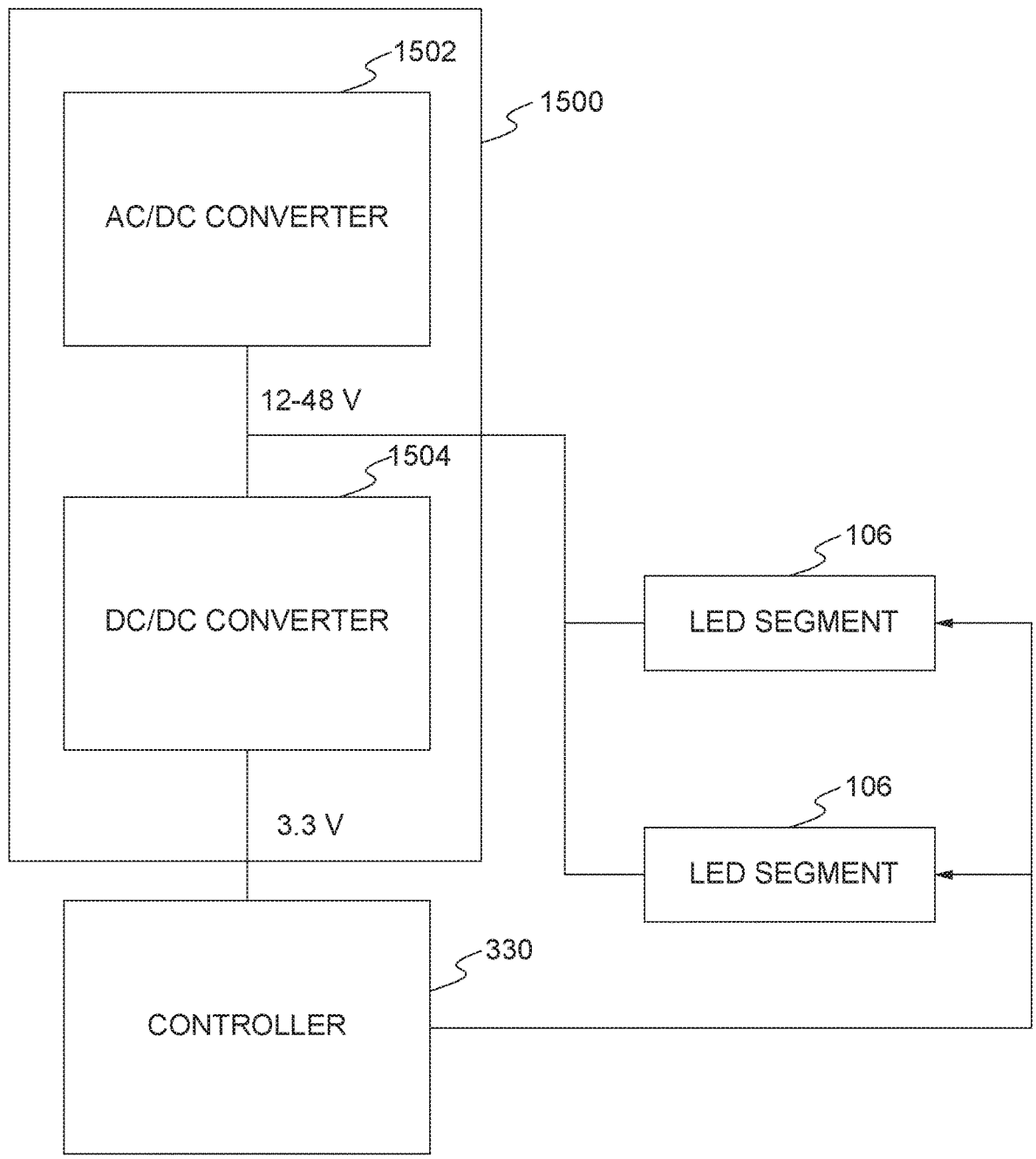
FIG. 15 is a diagram of an example of a driver circuit, in accordance with one possible electrical layout of a light fixture.

FIG. 15 is a diagram of an example driver circuit 1500, in accordance with one possible electrical layout of the light fixtures disclosed herein. As illustrated, the driver circuit 1500 may include an AC/DC converter 1502 that is configured to provide constant voltage to the LED segments 106 and a DC/DC converter 1504. The DC/DC converter 1504 may be configured to reduce the voltage supplied by the AC/DC converter 1502 and feed the reduced voltage to the controller 330 and/or other components of the light fixtures disclosed herein. The LED segments 106 are each supplied with a fixed peak current that is pre-programmed by a constant current regulator. The controller 330 may be configured to receive user input via any applicable input mechanism such as a wireless interface or an input device, select a duty cycle based on the input, and impart the selected duty cycle on current that is flowing across the LED segments 106. In the example of FIG. 15, the LED segments 106 are matched to one another (equal resistances) and the forward voltage of the LEDs in each of the LED segments 106 may be 1-2V below the voltage output by the AC/DC converter 1502. The use of a constant current regulator permits the controller 330 to individually control the light intensity of each LED segment 106 using different duty cycles for the different. LED segments 106. The duty cycle may be effected, for example, by pulse width modulation supplied to the LED segment driver.

Figure 16:
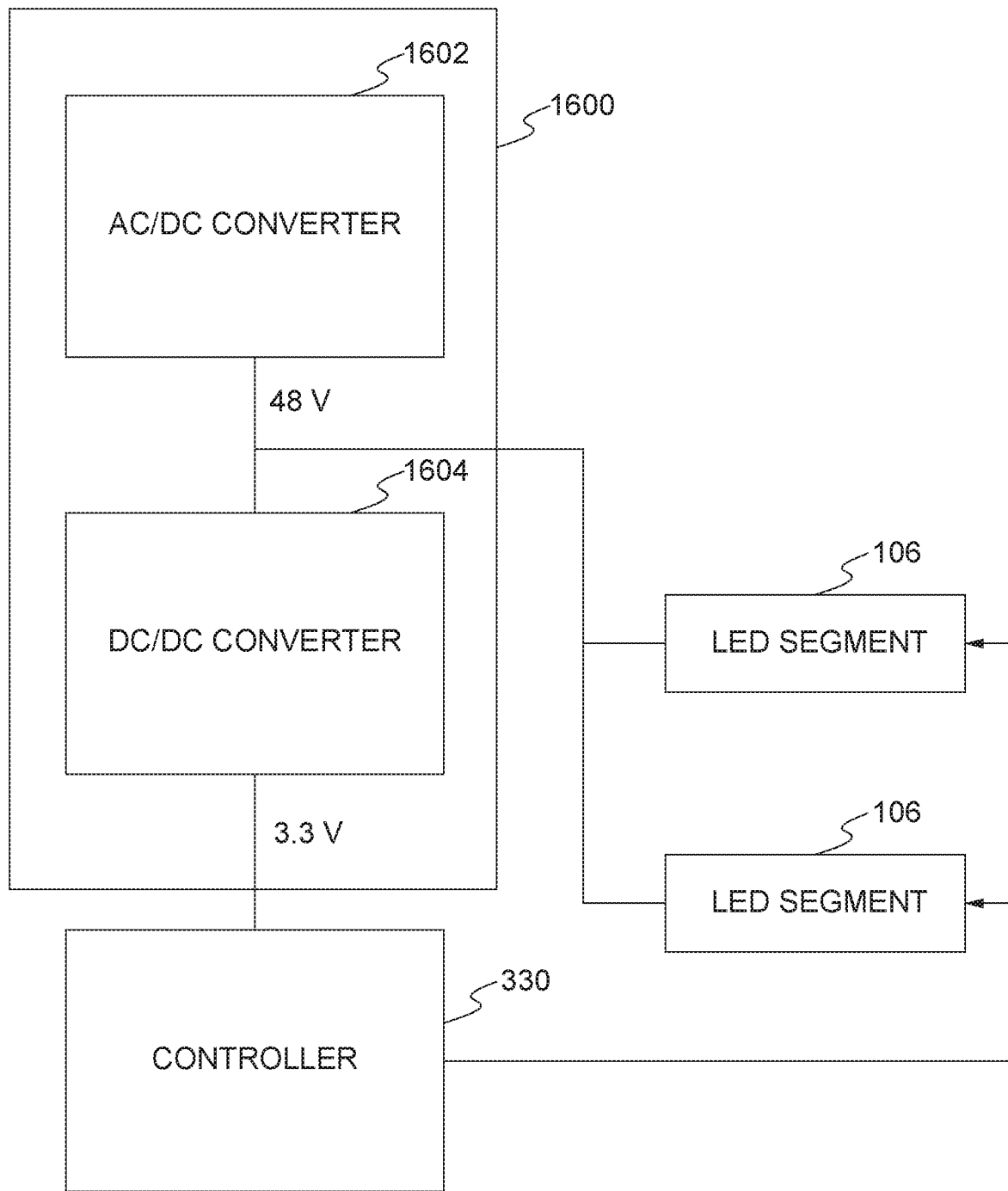
FIG. 16 is a diagram of another example of a driver circuit, in accordance with one possible electrical layout of a light fixture.

FIG. 16 is a diagram of an example driver circuit 1600, in accordance with another possible electrical layout of the light fixtures disclosed herein. As illustrated, the driver circuit 1600 may include an AC/DC converter 1602 that is configured to provide constant voltage to the LED segments 106 and a DC/DC converter 1604. The DC/DC converter 1604 may be configured to reduce the voltage supplied by the AC/DC converter 1602 and feed the reduced voltage to the controller 330 and/or other components of the light fixtures disclosed herein. In accordance with the example of FIG. 16, each of the LED segments 106 is provided with a different DC/DC converter that is used to power that. LED segment 106. The controller 330 may be configured to receive user input via at least one of a wireless interface and an input device, select at least one of a peak current or duty cycle for any of the LED segments 106 respective DC/DC converters. Afterwards, the controller 330 may impart the selected peak current(s) and/or duty cycle(s) on respective ones of the DC/DC converters. The use of individual DC/DC converters permits the controller 330 to individually control the light intensity of each LED segment 106 using different duty cycles for the DC/DC converters and/or by changing the peak current for the different LED segments 106.

Figure 17:
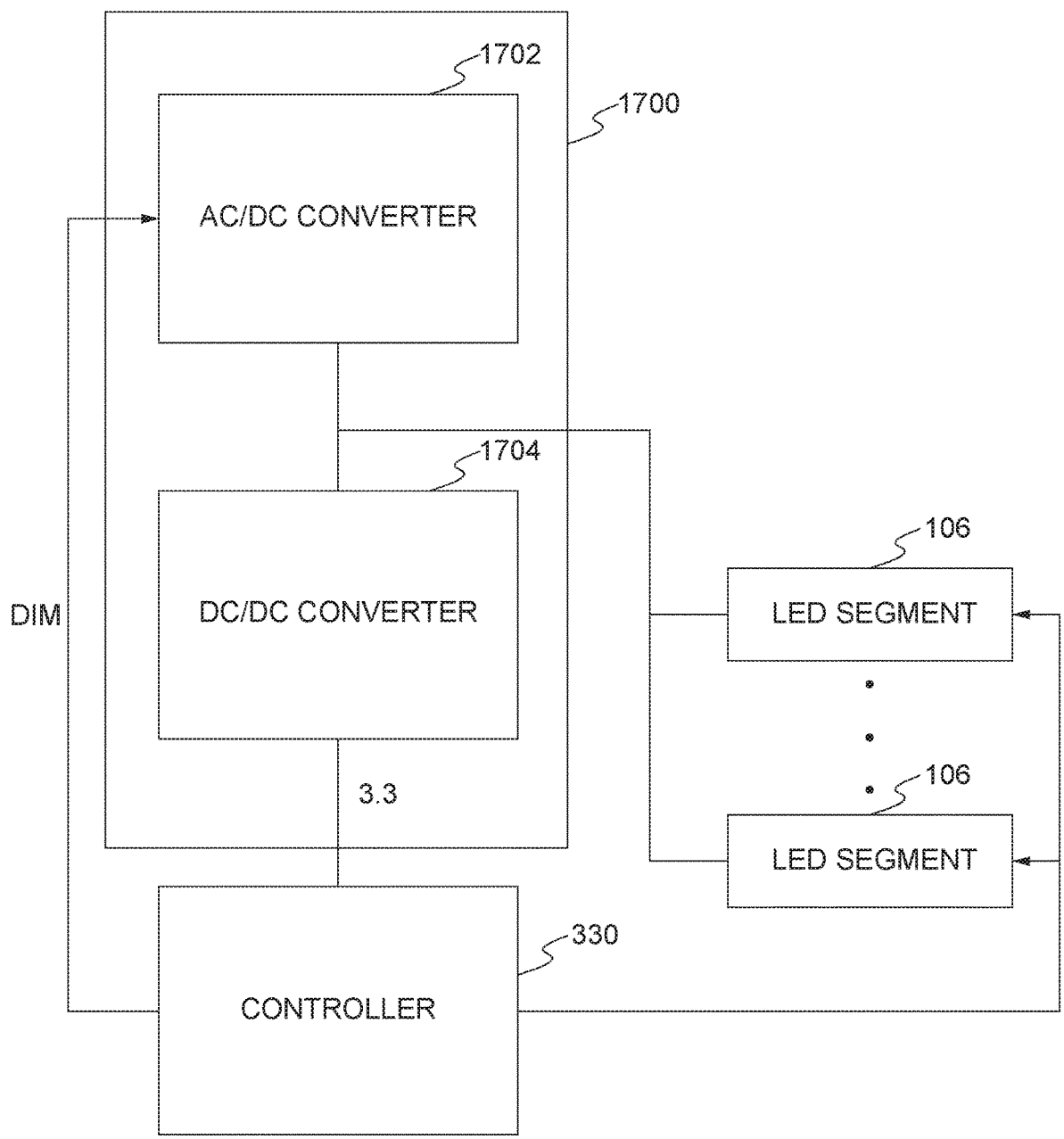
FIG. 17 is a diagram of yet another example of a driver circuit, in accordance with one possible electrical layout of a light fixture.

FIG. 17 is a diagram of an example driver circuit 1700, in accordance with yet another possible electrical layout of the light fixtures disclosed herein. As illustrated, the driver circuit may include an AC/DC converter 1702 that is configured to provide constant current to the LED segments 106 and a DC/DC converter 1704. The constant current provided to the LED segments 106 may be shared by the LED segments 106. As in the example of FIG. 15, the LED segments 106 are matched to one another. The DC/DC converter 1704 may be configured to reduce the voltage supplied by the AC/DC converter 1702 and feed the reduced voltage to the controller 330 and/or other components of the light fixtures disclosed herein. The controller 330 may be configured to receive user input, via any applicable input mechanism such as a wireless interface or an input device, and feed a dimming signal (DIM) to the AC/DC converter 1702 that is generated based on the user input. Based on the DIM, the AC/DC converter may change the value of the current output by the AC/DC converter 1702, thereby adjusting the constant current provided to the LED segments 106. Alternatively, or in addition, the duty cycle of each LED segments 106 may be changed. In this case, because all of the LED segments 106 share the same current, only one LED segment 106 may conduct current at a particular time. A time domain multiplexer may be used to effect this time divisioning.

Figure 18:
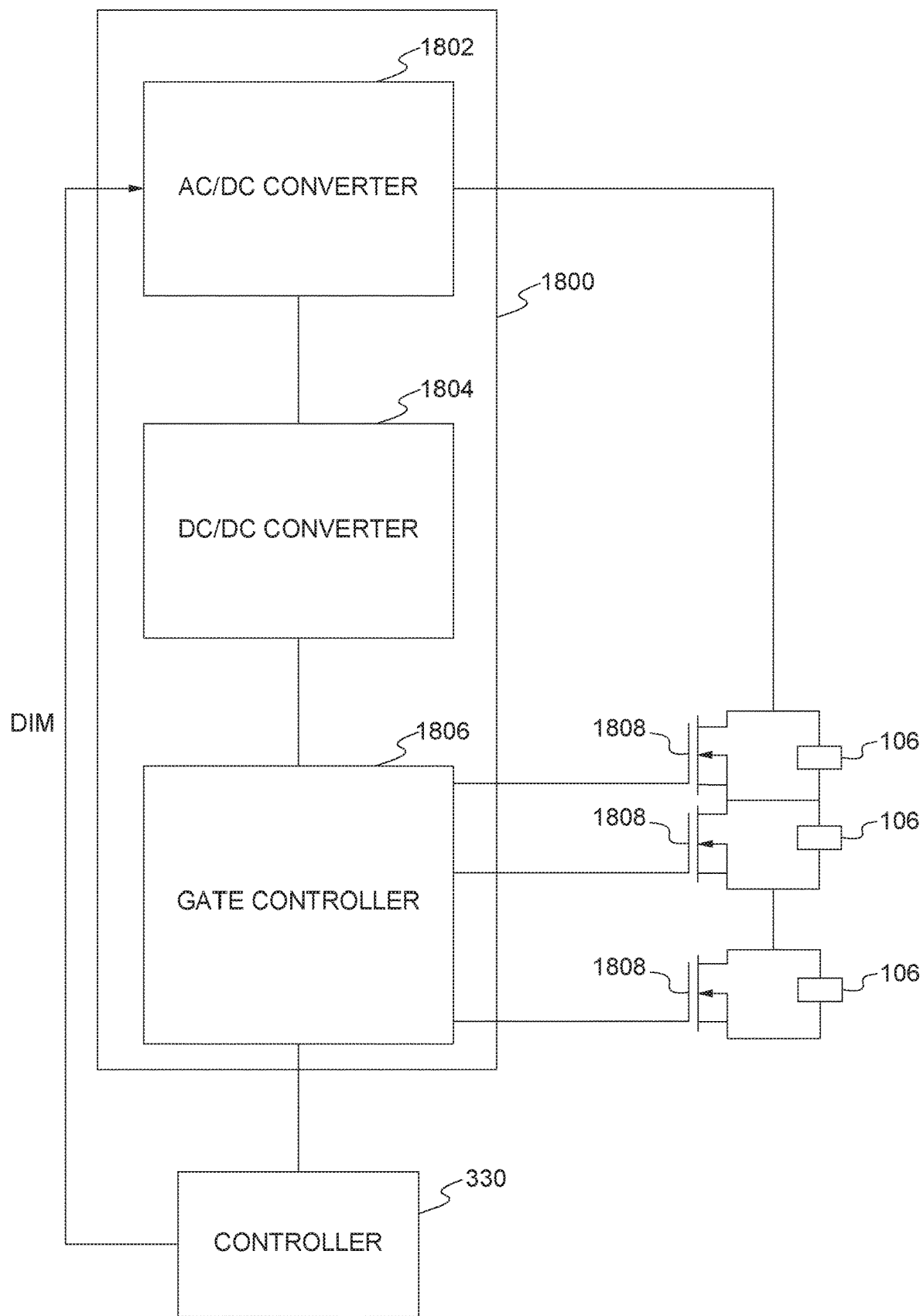
FIG. 18 is a diagram of yet another example of a driver circuit, in accordance with one possible electrical layout of a light fixture.

FIG. 18 is a diagram of an example of a driver circuit 1800, in accordance with yet another possible electrical layout of the light fixtures described herein. As illustrated, the driver circuit may include an AC/DC converter 1802 that is configured to provide constant current to a plurality of LED segments 106 and a DC/DC converter 1804. The DC/DC converter 1804 may configured to reduce the voltage supplied by the AC/DC converter 1802 and feed the reduced voltage to the controller 330 and/or other components of the light fixture 300. The controller 330 may be coupled to the LED segments 106 via a gate controller 1806 and a plurality of shunt (bypass) switches 1808. Each of the switches 1808 may be configured to turn on and off a different one of the LED segments 106 as the LED segments 106 are in series with each other. In operation, the controller 330 may be configured to receive user input and cause the gate controller 1806 to change the duty cycle of one or more of the LED segments 106 based on the user input. Furthermore, based on the user input, the controller 330 may generate a signal DIM and feed that signal to the AC/DC converter 1802. Based on the DIM, the AC/DC converter 1802 may change the peak current of its output. Multiple LED segments 106 may be conducting at the same time if their shunt switches 1808 are not in the bypass mode.

Note that although the term constant current is used herein, the constant current is able to vary. That is, while current is being supplied to the LED segments or DC/DC converter, depending on the implementation, the current is constant. However, the current may change between different the LED segments or DC/DC converters.

Figure 19A:
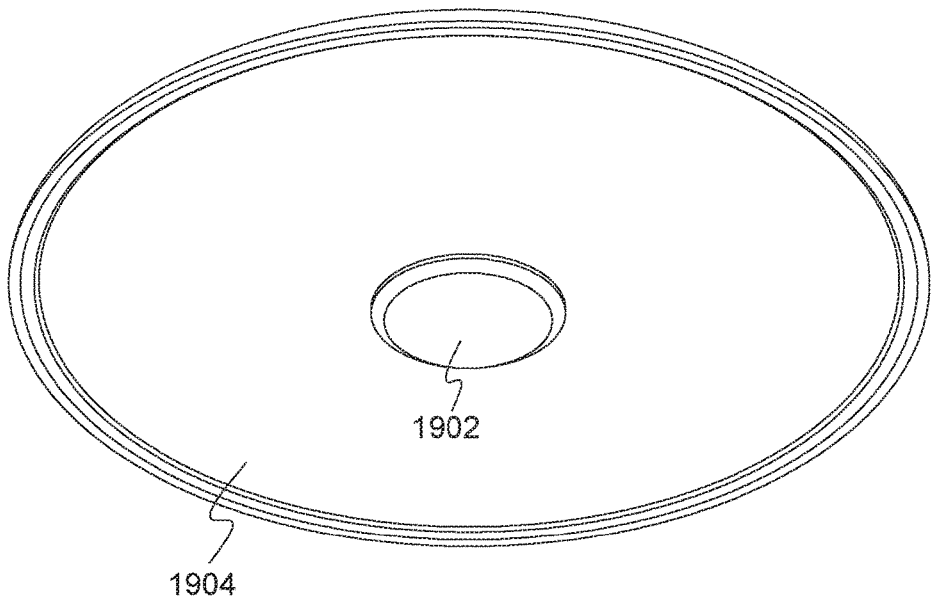
FIG. 19A is a diagram of a perspective view of an assembled light engine, in accordance with one possible electrical layout of a light fixture.
Figure 19B:
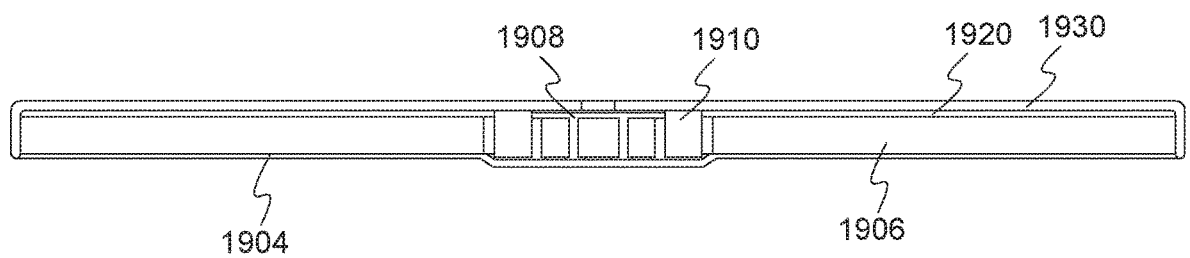
FIG. 19B is a diagram of a side view of the assembled light engine, in accordance with one possible electrical layout of a light fixture.

Alternate views of the light engine are shown in FIGS. 19A and 19B. FIG. 19A is a diagram of a perspective view of an assembled light engine, in accordance with one possible electrical layout of a light fixture. FIG. 19B is a diagram of a side view of the assembled light engine, in accordance with one possible electrical layout of a light fixture. FIG. 19A shows the light guide 1904 and a front bezel cap or motion sensor 1902. FIG. 19B shows the flexible circuit 1908 surrounded by a center supporting rod 1910. The reflector 1920 extends above the light guide 1906 and the heat dissipation element 1930 covers the entire structure, with an airgap between the light guide 1906 and the heat dissipation element 1930. The heat dissipation element 1930 may extend to cover the sides of the structure to protect against moisture ingress, in cooperation with a sealant, such as glue or a gasket. Another sealant may be used to seal the front bezel cap or motion sensor 1902. A collimating film may be present between the LEDs and the light guide 1906.

Figure 19C:
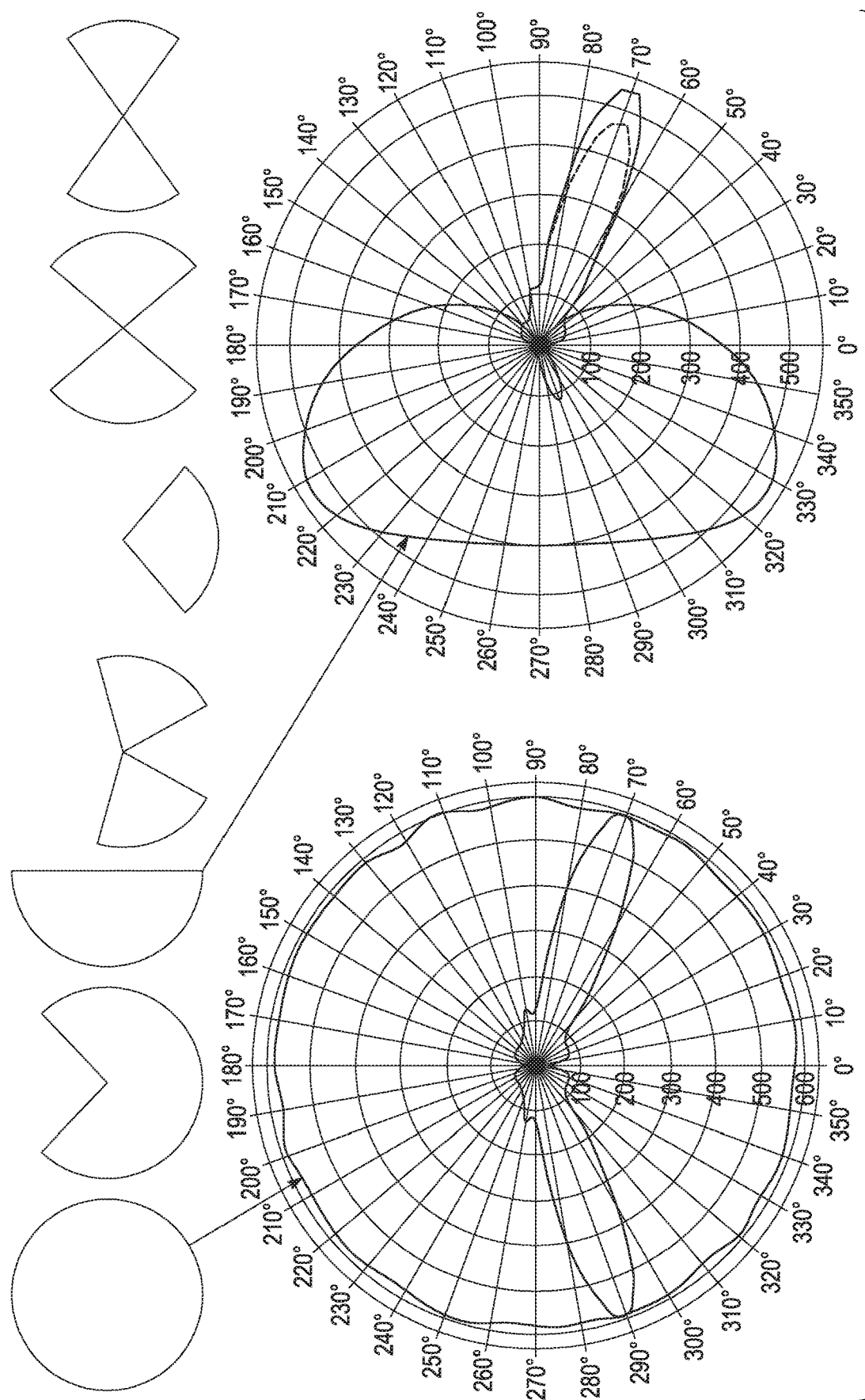
FIG. 19C are luminance distributions, in accordance with some aspects of the disclosure.

FIG. 19C are luminance distributions, in accordance with some aspects of the disclosure. The figures at the top show possible dynamically controlled activation/deactivation patterns of the LEDs (for an octagonal LED structure), with the luminance distributions of some of the LEDs shown. The luminance distributions shown are for activation of all LEDs and for only half activated in a semicircle.

Figure 21:
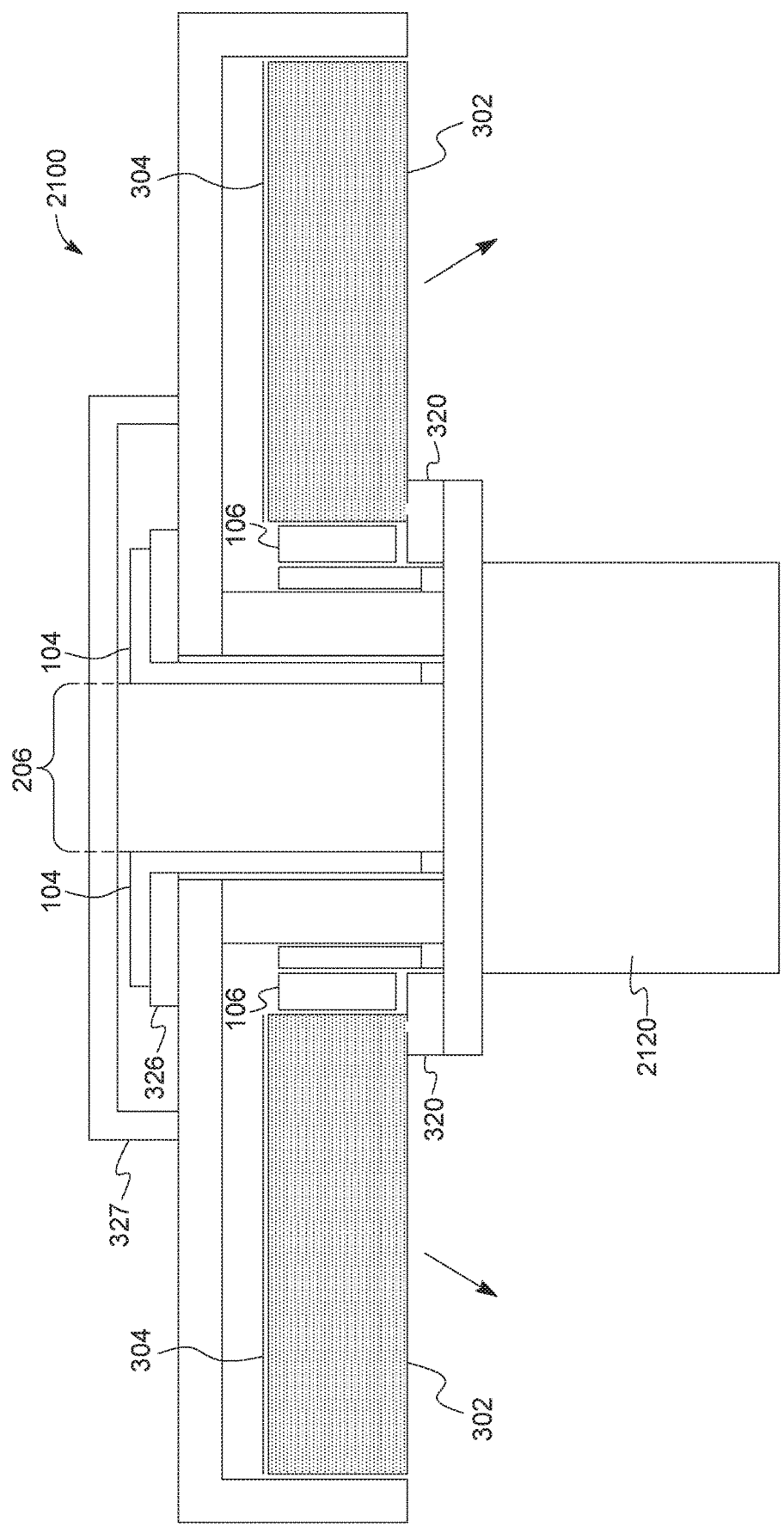
FIG. 21 is a planar cross-sectional view of a light fixture 2100, according to aspects of the disclosure.

FIG. 21 shows a planar cross-sectional side view of a light fixture of FIG. 3, according to aspects of the disclosure. This structure is similar to that of FIG. 7A, with the addition of an underlying support. As illustrated, the pan 324 may have a top surface 312 and a sidewall 314. In the present example, the outer edge 344 of the light guide 302 is covered completely by the sidewall 314 of the pan 324. However, in some implementations, the length L of the sidewall may be less than the thickness T of the light guide 302, such that the outer edge 344 of the light guide 302 is only partially covered by the sidewall 314 of the pan 324. Furthermore, alternative implementations are possible in which sidewall 314 of the pan 324 is altogether omitted. The pan 324 may comprise any applicable material such as aluminum and may act as a heat sink, as further disclosed herein. The light fixture 2100 may be disposed on a post 2120, such as a lamp post. As above, in some embodiments, rather than the opening extending completely through the base 202 to above the PCB 326, the opening may terminate within the base 202, and the terminal portions of the legs 104 of the flexible PCB remain unbent. Wires that extend from the post 2120 may provide the control signals to the LED segments via the flexible PCB.

Figure 22:
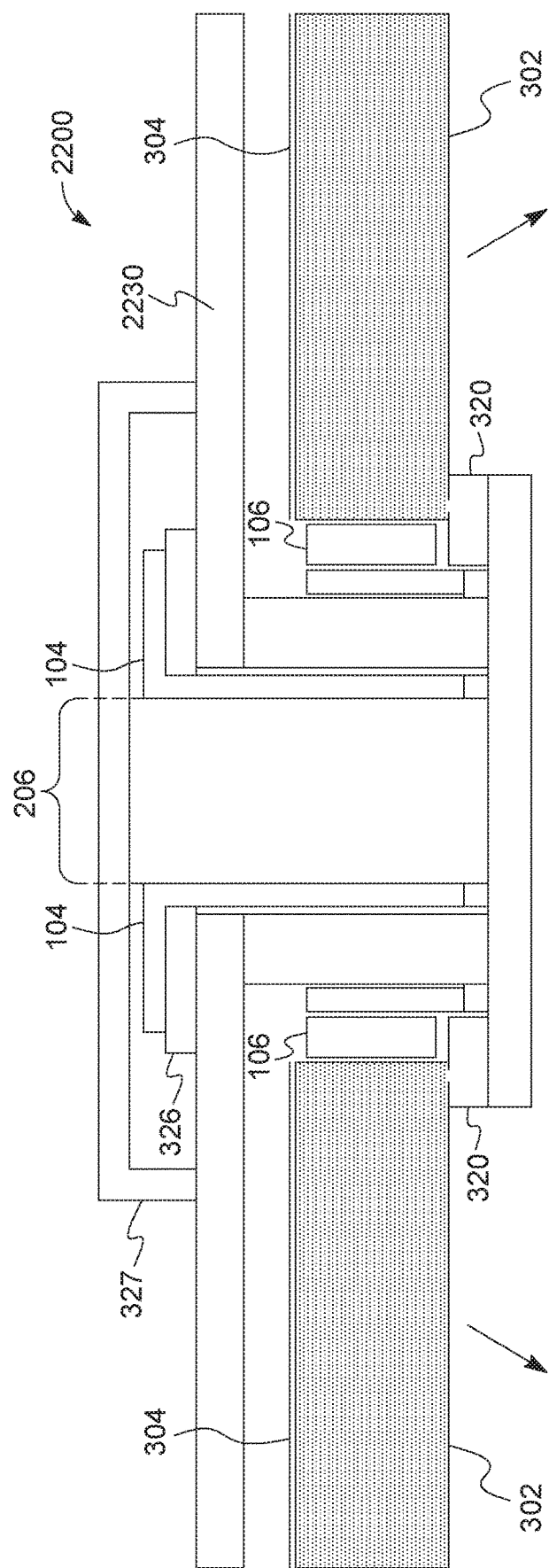
FIG. 22 is a planar cross-sectional view of a light fixture 2200, according to aspects of the disclosure.

FIG. 22 shows a planar cross-sectional side view of a light fixture of FIG. 3, according to aspects of the disclosure. This light fixture 2200 is similar to that of FIG. 7A, with the pan 324 being modified. As illustrated, the pan 324 may have a top surface 312 but not a sidewall 314. Thus, the outer edge 344 of the light guide 302 is not covered by the pan 324 and the outer edge 344 of the light guide 302 is exposed to the environment.

Figure 23:
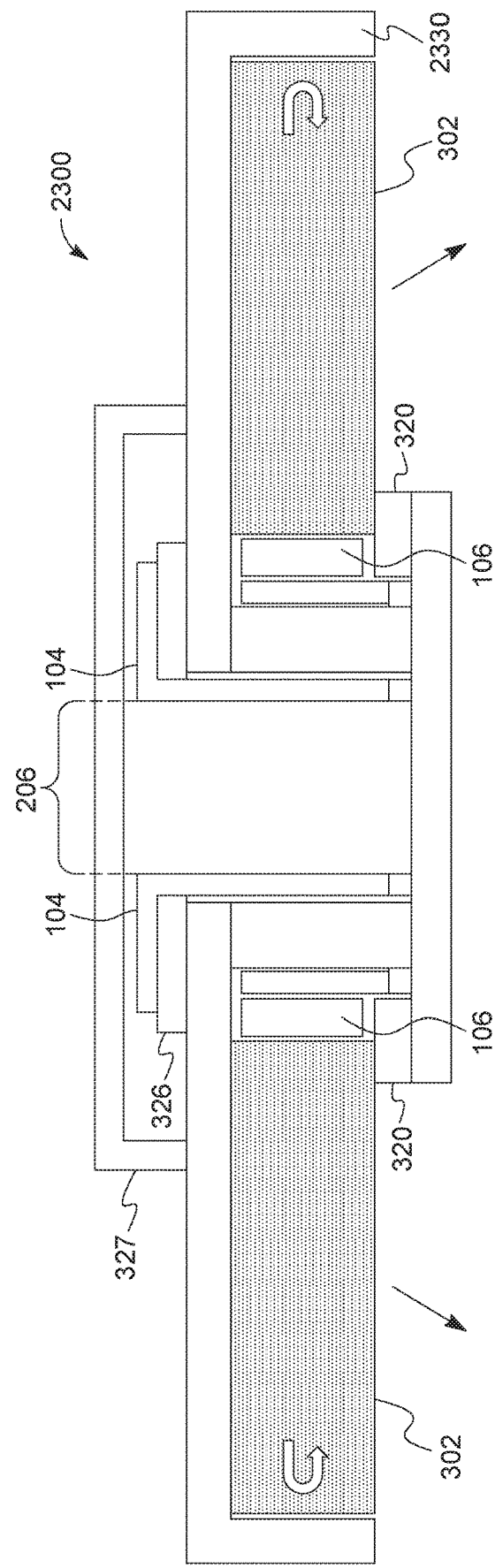
FIG. 23 is a planar cross-sectional view of a light fixture 2300, according to aspects of the disclosure.

FIG. 23 shows a planar cross-sectional side view of a light fixture of FIG. 3, according to aspects of the disclosure. This light fixture 2300 is also similar to that of FIG. 7A, with the pan 324 being modified. As illustrated, the pan 324 may have a highly reflective top surface 312 and a sidewall 314. Thus, the pan 324 may be used as a reflector without the need for an additional reflector.

Figure 24:
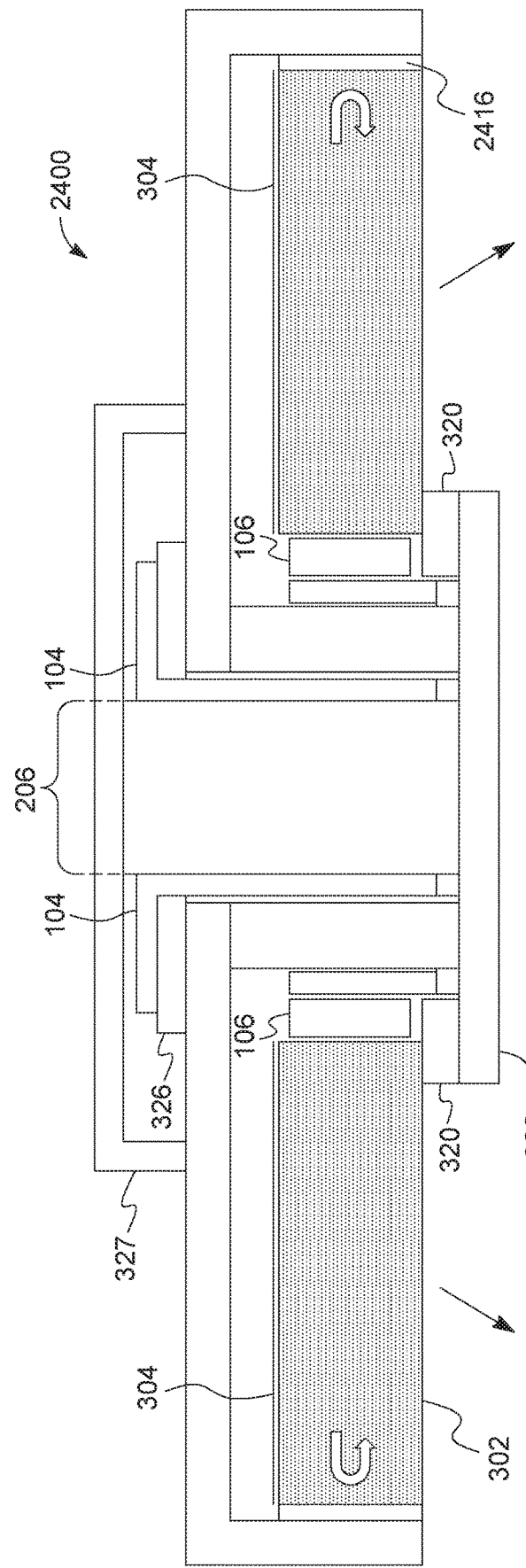
FIG. 24 is a planar cross-sectional view of a light fixture 2400, according to aspects of the disclosure.

FIG. 24 is a planar cross-sectional view of a light fixture, according to aspects of the disclosure. The light fixture 2400 differs from the light fixture 300 of FIG. 3 in that in it includes a reflective gasket 2416 disposed between the pan sidewall 314 and the light guide 302.

Figure 25:
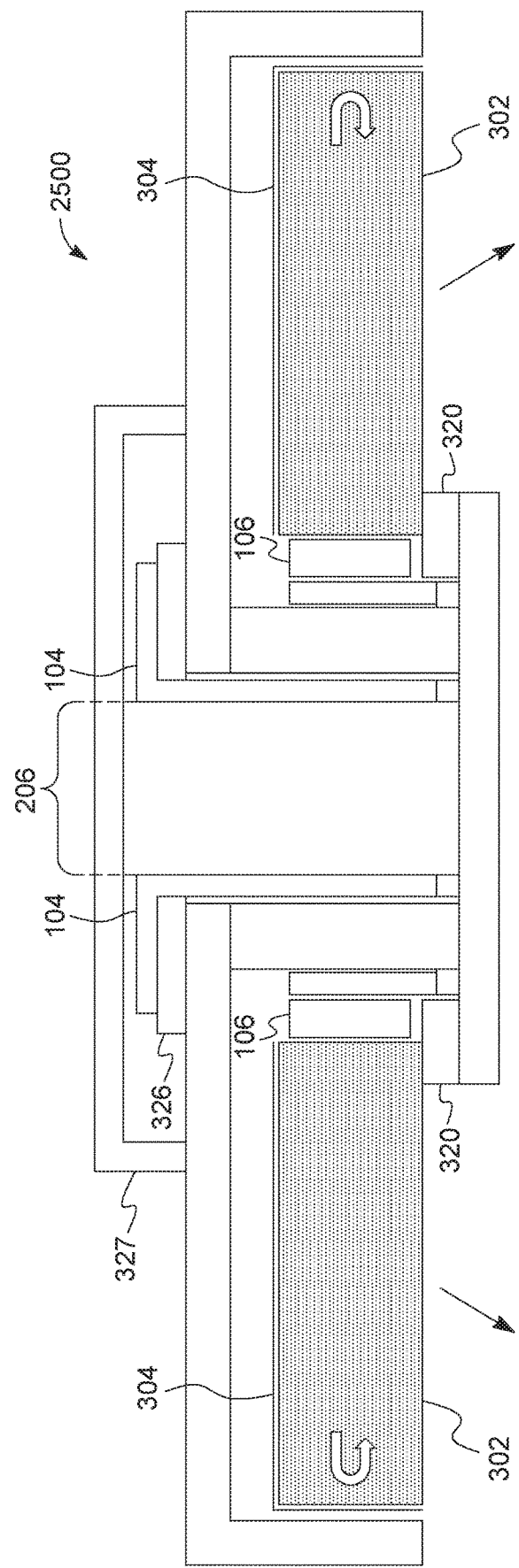
FIG. 25 is a planar cross-sectional view of a light fixture 2500, according to aspects of the disclosure.

FIG. 25 is a planar cross-sectional view of a light fixture, according to aspects of the disclosure. The light fixture 2500 differs from the light fixture 300 of FIG. 3 in that in the reflector 304 extends over the outer edge of the light guide 302 and is disposed between the pan sidewall 314 and the outer edge of the light guide 302.

Figure 26:
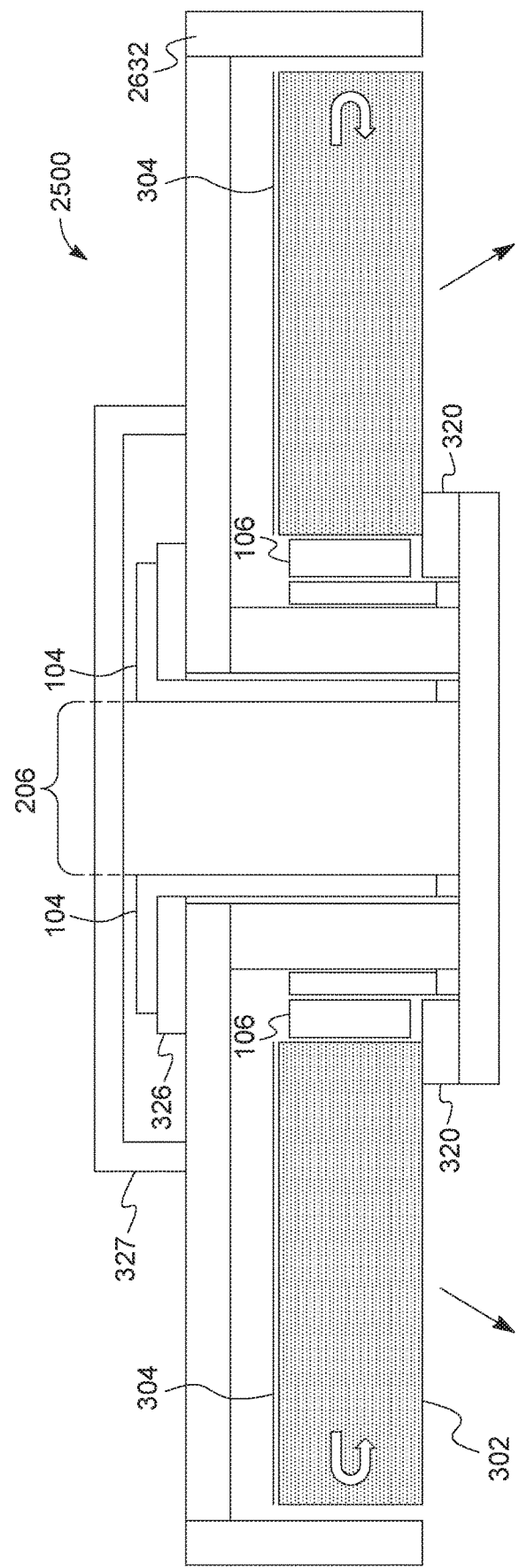
FIG. 26 is a planar cross-sectional view of a light fixture 2600, according to aspects of the disclosure.

FIG. 26 shows a planar cross-sectional side view of a light fixture of FIG. 3, according to aspects of the disclosure. This light fixture 2600 is similar to that of FIG. 7A, with the pan 324 being modified. As illustrated, the pan 324 may have a top surface 312 but not a sidewall 314. Instead, the reflective gasket 2632 is attached to an outer edge of the pan 324 and extends to cover the outer edge of the light guide 302 without extending under the light guide 302.

Figure 27:
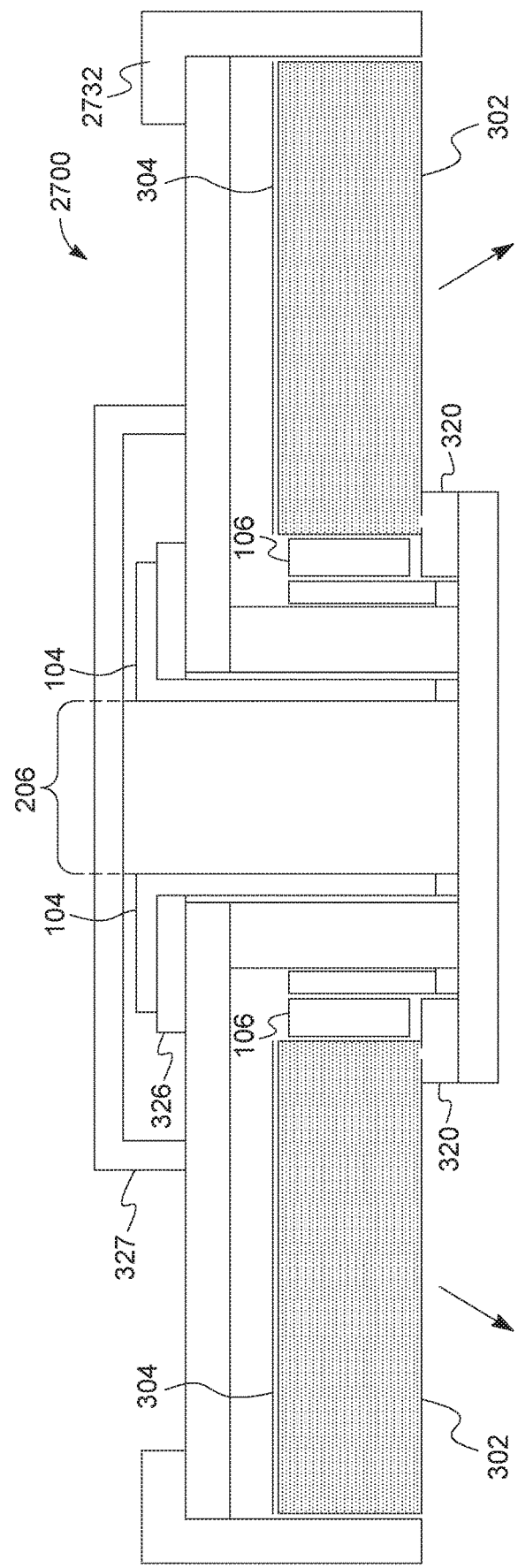
FIG. 27 is a planar cross-sectional view of a light fixture 2700, according to aspects of the disclosure.

FIG. 27 shows a planar cross-sectional side view of a light fixture of FIG. 3, according to aspects of the disclosure. This light fixture 2700 is similar to that of FIG. 26, with the reflective gasket 2732 being modified. As illustrated, the reflective gasket 2632 again extends to cover the outer edge of the light guide 302 without extending under the light guide 302. In this case, however, the reflective gasket 2732 has an overhang (is formed in an "L" shape) so that the reflective gasket 2732 also partially covers the upper surface of the light guide 302.

Figure 28:
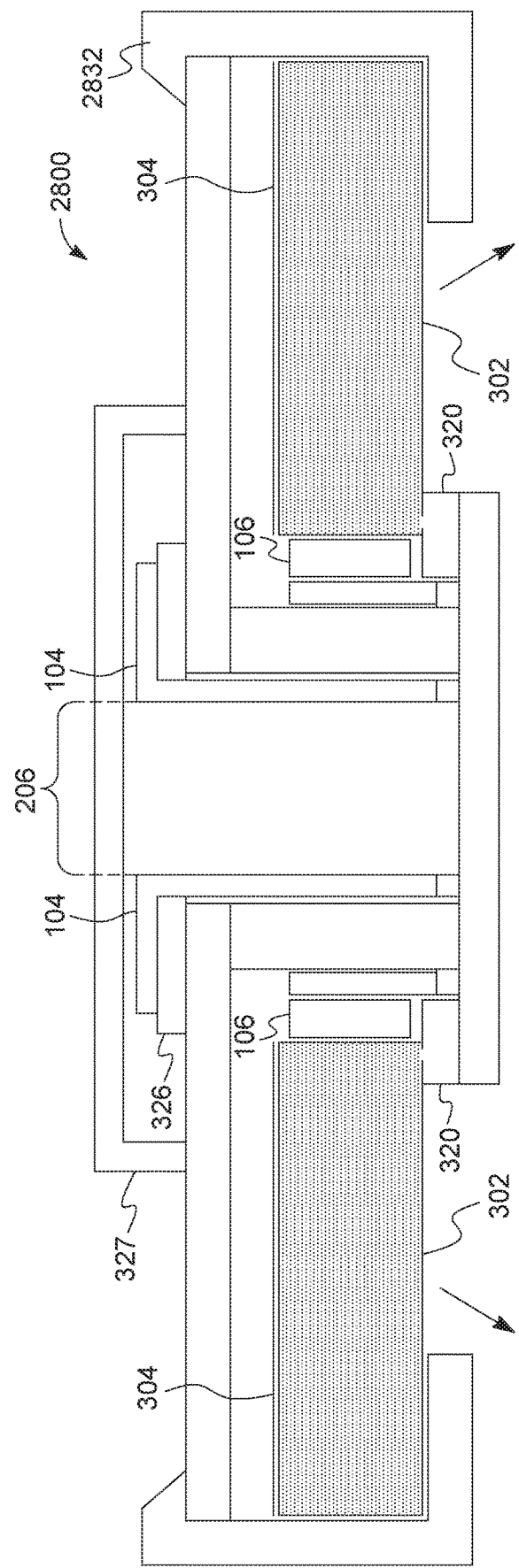
FIG. 28 is a planar cross-sectional view of a light fixture 2800, according to aspects of the disclosure.

FIG. 28 shows a planar cross-sectional side view of a light fixture of FIG. 3, according to aspects of the disclosure. This light fixture 2800 is similar to that of FIG. 27, with the reflective gasket 2632 again being modified. As illustrated, the reflective gasket 2832 again extends to cover the outer edge of the light guide 302, but this time extends under the light guide 302. In addition, the reflective gasket 2832 has a bezeled overhang so that the reflective gasket 2832 also partially covers the upper surface of the light guide 302. The reflective gasket 2632 is thus formed substantially in an "C" shape.

Figure 29:
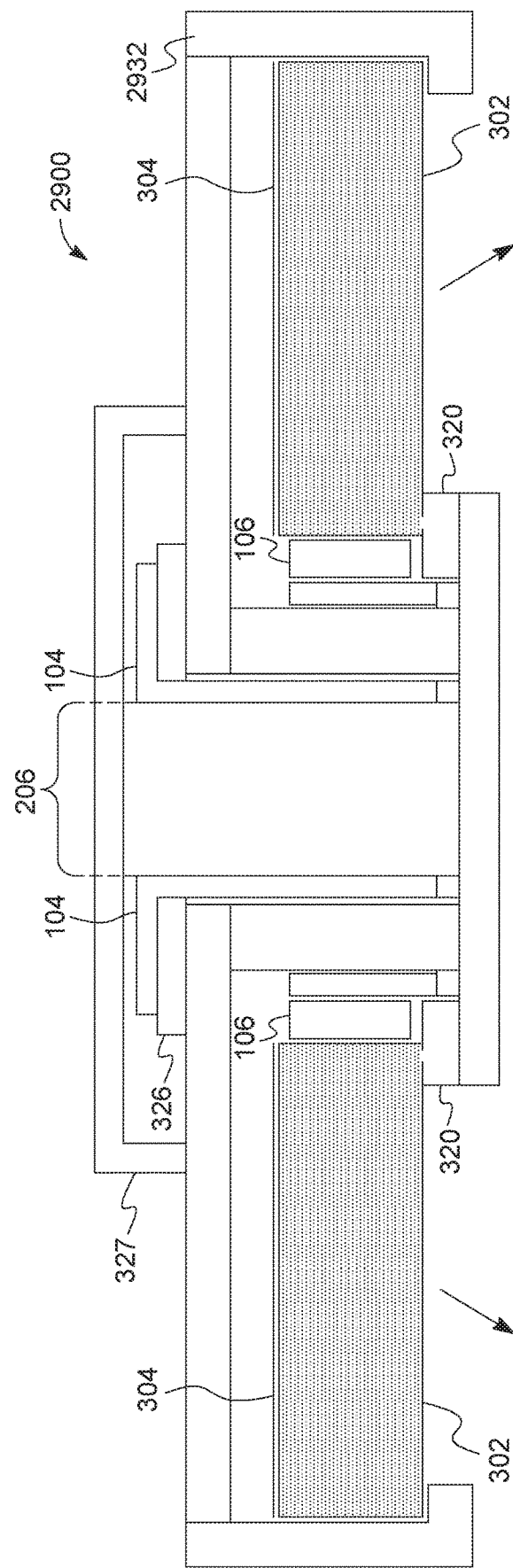
FIG. 29 is a planar cross-sectional view of a light fixture 2900, according to aspects of the disclosure.

FIG. 29 shows a planar cross-sectional side view of a light fixture of FIG. 3, according to aspects of the disclosure. This light fixture 2900 is similar to that of FIG. 28, with the reflective gasket 2632 again being modified. As illustrated, the reflective gasket 2932 is again formed in an "L shape", again extending to cover the outer edge of the light guide 302. In this embodiment, however, the reflective gasket 2932 extends under the light guide 302 but does not have an overhang.

Figure 30:
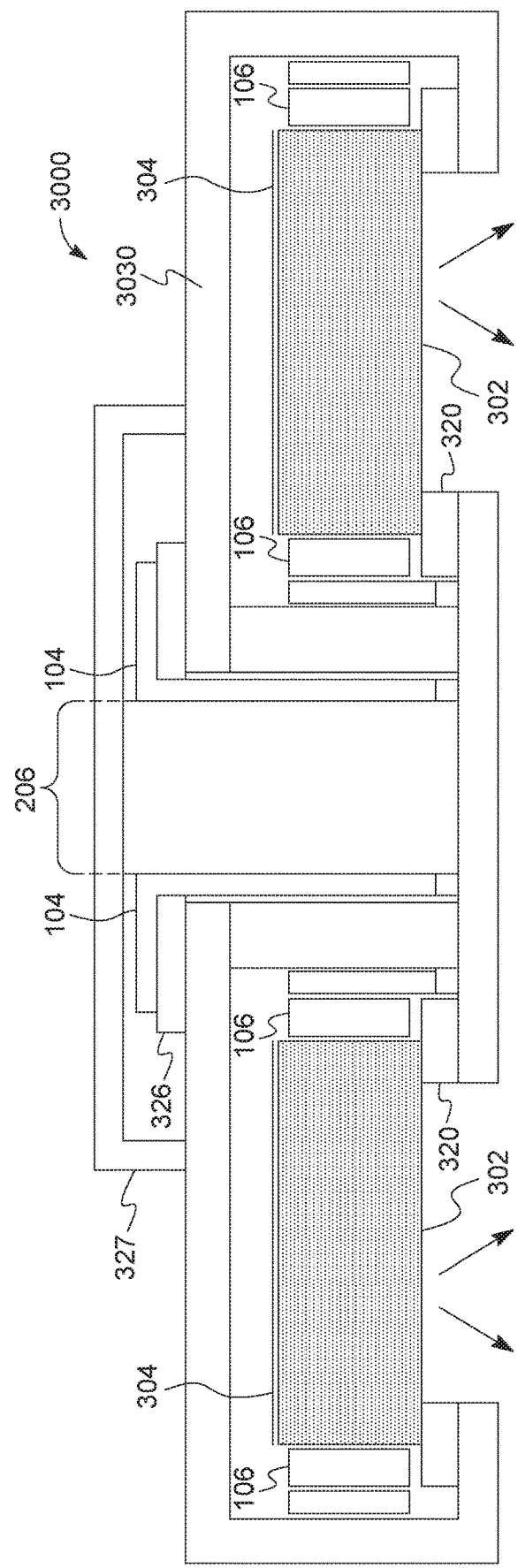
FIG. 30 is a planar cross-sectional view of a light fixture 3000, according to aspects of the disclosure.

FIG. 30 shows a planar cross-sectional view of a light fixture, according to aspects of the disclosure. The light fixture 300 differs from the light fixture 800 of FIG. 8 the light guide 302 has a substantially rectangular shape. Thus, unlike the light fixture 800 of FIG. 8, the light guide 802 does not contain a recess 806. Like the light fixture 800, multiple LED segments 106 are present—in the center and on an outer edge of the light guide 802. The pan 808 is provided with a lip to cover the outer edge LED strips 106.

Figure 31B:
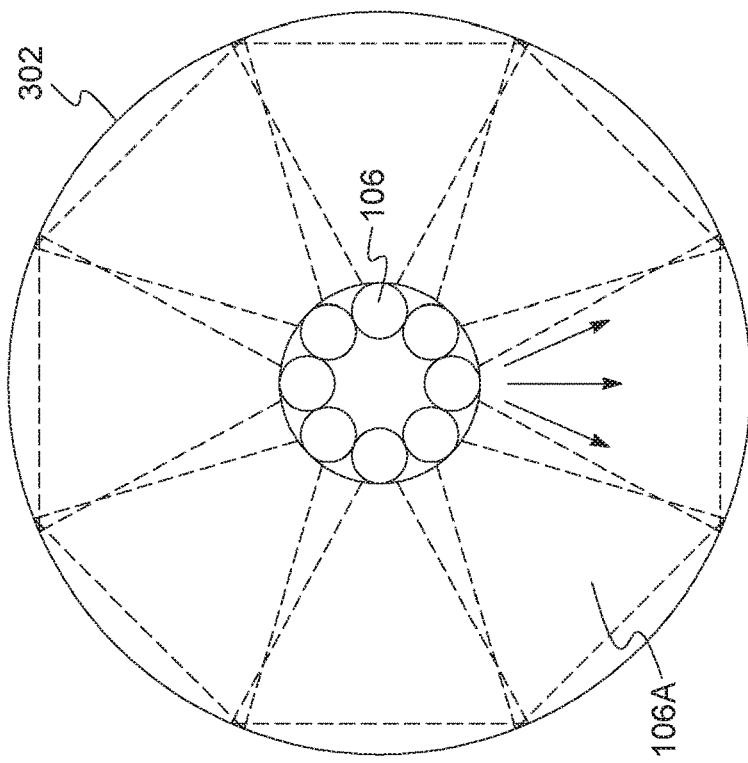
FIG. 31B is a top view of a center-lit configuration, according to aspects of the disclosure.
Figure 31A:
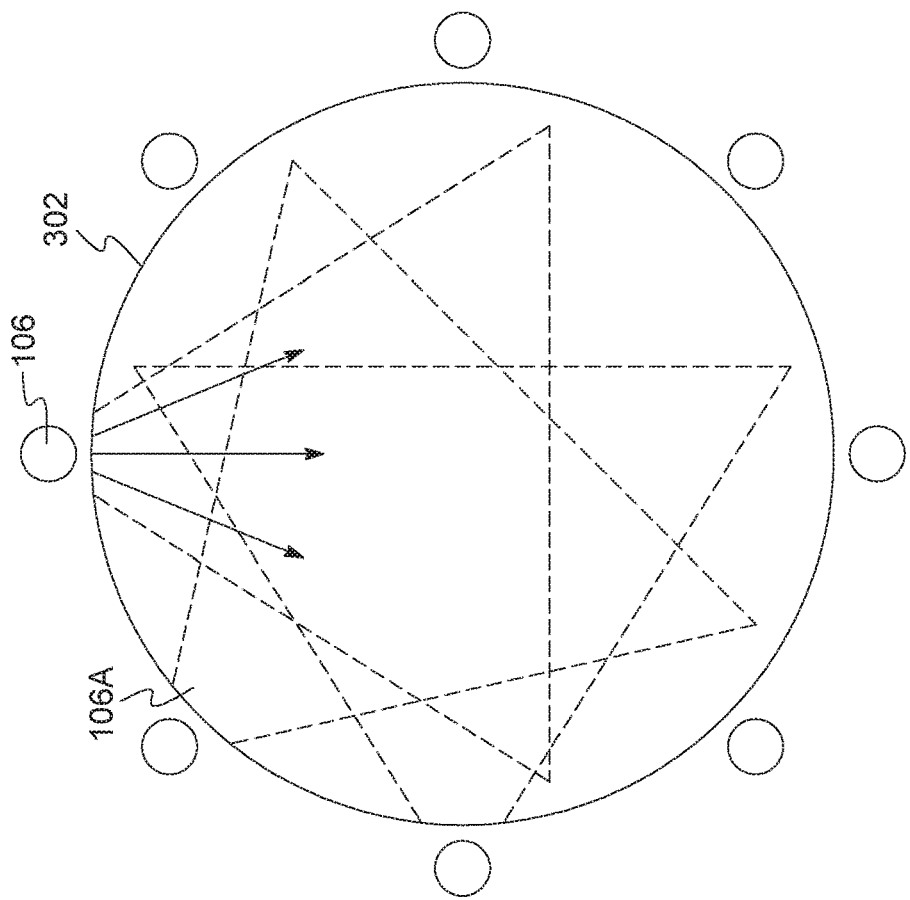
FIG. 31A is a top view of an edge-lit configuration, according to aspects of the disclosure.

FIG. 31A is a top view of an edge-lit configuration, according to aspects of the disclosure. As shown in FIG. 31A multiple LED segments 106 are disposed at an edge of a light guide 302. The LED segments 106 are disposed symmetrically having constant angular difference between adjacent LED segments 106. As can be seen, if an insufficient number of the LED segments 106 are active, the resulting light 106a in the light guide 302 may result in a non-uniform light distribution pattern. The use a greater number of LEDs, however, may increase the etendue/beam width.

FIG. 31B is a top view of a center-lit configuration, according to aspects of the disclosure. As shown in FIG. 31B, however, the use of LED segments 106 at the center of the light guide 302 may result in a more uniform, if narrower, distribution of the resulting light 106a.

Figure 32:
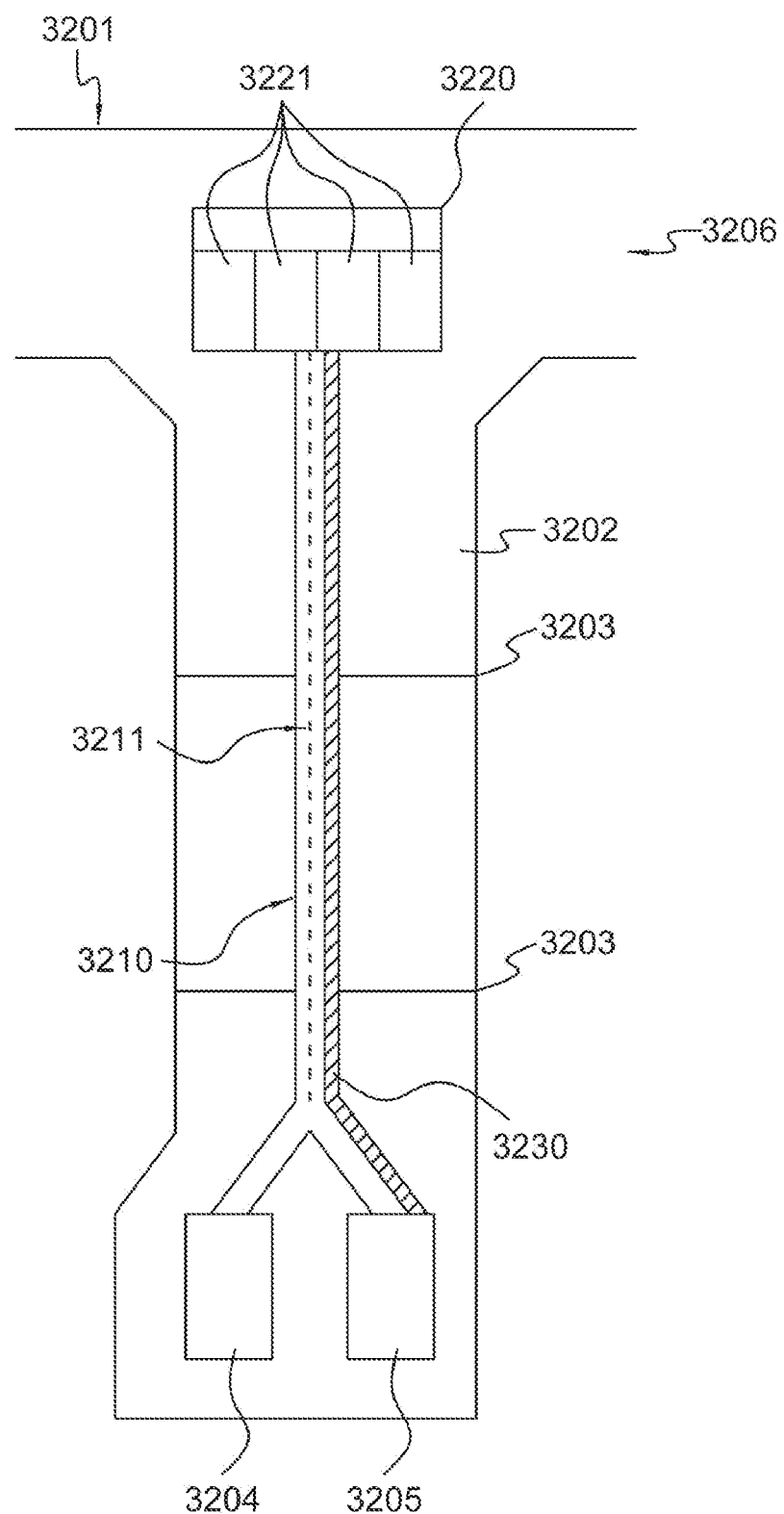
FIG. 32 is a diagram of an example LED strip with an integrated bus line.

FIG. 32 is a diagram of a flexible printed circuit board 3201, which may similar to flexible printed circuit hoard 100 of FIG. 1A. The flexible printed circuit board 3201 may include a body 3206 which includes a LED segment (or LED bank) 3220 which may include one or more LEDs 3221. The one or more LEDs 3221 may emit the same color light or may emit different colored lights. LEDs 3221 which emit different colored lights may emit light such that the when viewed from an external point, the different colored lights combine to produce a single color that is a blend of the different colored lights. The LED strip 3201 also may include a leg 3202 which may be flexible such that it bends, folds, curves, or otherwise shapes itself. For example, the leg 3202 may bend at bend points 3203 to wrap around an object or structure such as base 332 of FIGS. 2A-2D and 3A. A bend, as used herein, may be a change in direction of one or more portions of a leg such that, for example, a first portion of the leg is in a first plane and a second portion of the leg is in a second plane. Additional bends may be present such that, for example, a third portion of the leg is in a third plane and so on for additional portions of the leg. It will be understood that the bend points 3203 are an example only and the leg 3202 may include multiple additional bend points, may be configured to bend without bend points, may be a flexible tape, or the like. According to an implementation, the LED strip 3201 may have an adhesive backing for affixing the LED strip 3201 to an object or structure such as base 332 of FIGS. 2A-2D and 3A.

The leg 3202 may include electrical contacts 3204 and 3205 for controlling the LEDs 3221 in the LED bank 3220. For example, the contacts 3204 and 3205 may be used to provide a signal to the LEDs 3221 in the LED bank 3220. The signal may be, for example, one of: (1) turning off/on the LEDs 3221, (2) changing the brightness of the LEDs 3221 (3) changing the color of light output by the LEDs 3221, and/or (4) controlling another characteristic of the operation of the LEDs 3221. The contacts may include any conductive material such as, but not limited to, silver, copper, gold, platinum, and/or palladium.

The LEDs 3221 in LED bank 3220 may be connected to one another in series, in parallel, and/or in any other suitable way and may be configured to output the same color of light or different colors of light such as, for example, red, green, and blue. Additionally or alternatively, the LEDs 3221 may output light having the same correlated color temperature (CCT). Additionally or alternatively, the light outputs of at least two LEDs 3221 in the LED bank 3220 may have different CCTs.

Light emitted from the LEDs 3221 may be emitted into a light guide, such as the light guide shown in the previous figures. The light guide may guide the light emitted by the LEDs 3221 based on the shape and characteristics of the light guide and the apparatus in general, which features may include, but are not limited to, texture, curves, dimensions, pans, plates, and the like. For example, FIGS. 7A-10A show light guides with outer edges that are shaped to distribute light in a given pattern, based on the edge. FIGS. 10B and 10C show examples of such distributions. The LEDs 3221 may be deposited in an inner cavity of a light guide or may be deposited along an outer edge of a light guide such that they emit light into the light guide. An example such configuration is shown in FIG. 14A.

One or more of the LEDs 3221 may be a micro LED such that the one or more LEDs 3221 may have a width W in the range of 10-500 microns. Furthermore, the one or more LEDs 3221 may have a length L in the range of 10-500 microns and a height H in the range of 5-30 microns. The width W of any of the one or more LEDs 3221 may be the same or different from the length L of the same LED.

According to an implementation, at least one contact of the contacts 3204 and 3205 may be connected to the LED bank 3220 via an integrated bus line 3210. The integrated bus line 3210 may connect the contact 3204 and/or 3205 to the LED bank 3220 and LEDs 3221 such that an electrical signal may travel from the contact 3204 and/or 3205 to the LED hank 3220 via the integrated bus line 3210.

The integrated bus line 3210 may be provided such that the use of separate wires may be avoided, to provide an electrical signal from the contact 3204 and/or 3205 to the LED bank 3220. Accordingly, the integrated bus line 3210 may allow for a low profile solution which replaces wires that may use additional space and suffer damage. The integrated bus line 3210 may also mitigate a concern related to damaging wires during a manufacturing process (e.g., by catching the wire against a sharp edge or object).

The integrated bus line 3210 may traverse the length of substantially the entire leg 3202. The integrated bus line 3210 may be, for example, at least 10 mm long according to an implementation and may be, for example, at least 5 mm long according to another implementation. The integrated bus line 3210 may be narrower than the width of the leg 3202 and may have a width of less than 5 mm according to an implementation and less than 3 mm according to another implementation.

The integrated bus line 3210 may connect to multiple contacts such as contact 3204 and to contact 3205 and may receive multiple signals from the multiple contacts. According to an implementation, the integrated bus line may receive a control signal from contact 3204 and may provide a ground connection via contact 3205. The integrated bus line 3210 may carry the multiple electronic signals such that it is split in two or more parts throughout the length of the integrated bus line. As an example, integrated bus line 3210 is shown to be spilt by a dividing line 3211 which may isolate the signal from contact 3204 from the signal from contact 3205. The isolation may be based on the dividing line 3211 including an insulator or dielectric material which isolates the signal from contact 3204 from the signal from contact 3205. Alternatively, according to an implementation, the dividing line 3211 may be a physical gap between one side of the integrated bus line 3210 and a different side of the integrated bus line 3210. It will be understood that although two contacts 3204 and 3205 are shown in FIG. 32, there may be three or more contacts and multiple dividing lines provided in an integrated bus line.

The integrated bus line 3210 may be insulated by a dielectric material, such as polyimide, at one or more edges, ends, or surfaces such that the signals carried by the integrated bus line 3210 are insulated from exiting the integrated bus line 3210. As an example, the integrated bus line 3210 may include dielectric material 3230 which may insulate the ground connection via contact 3205 from being interrupted by a portion of the leg 3202 that is external to the integrated bus line 3210.

According to implementations disclosed herein, an integrated bus line may include a conductive material configured to transfer an electrical signal from a contact to an LED hank. As non-limiting examples, the integrated bus line may include a copper trace, an aluminum trace, and a combination aluminum/copper trace such as, for example, an aluminum coated copper trace.

Figure 33:
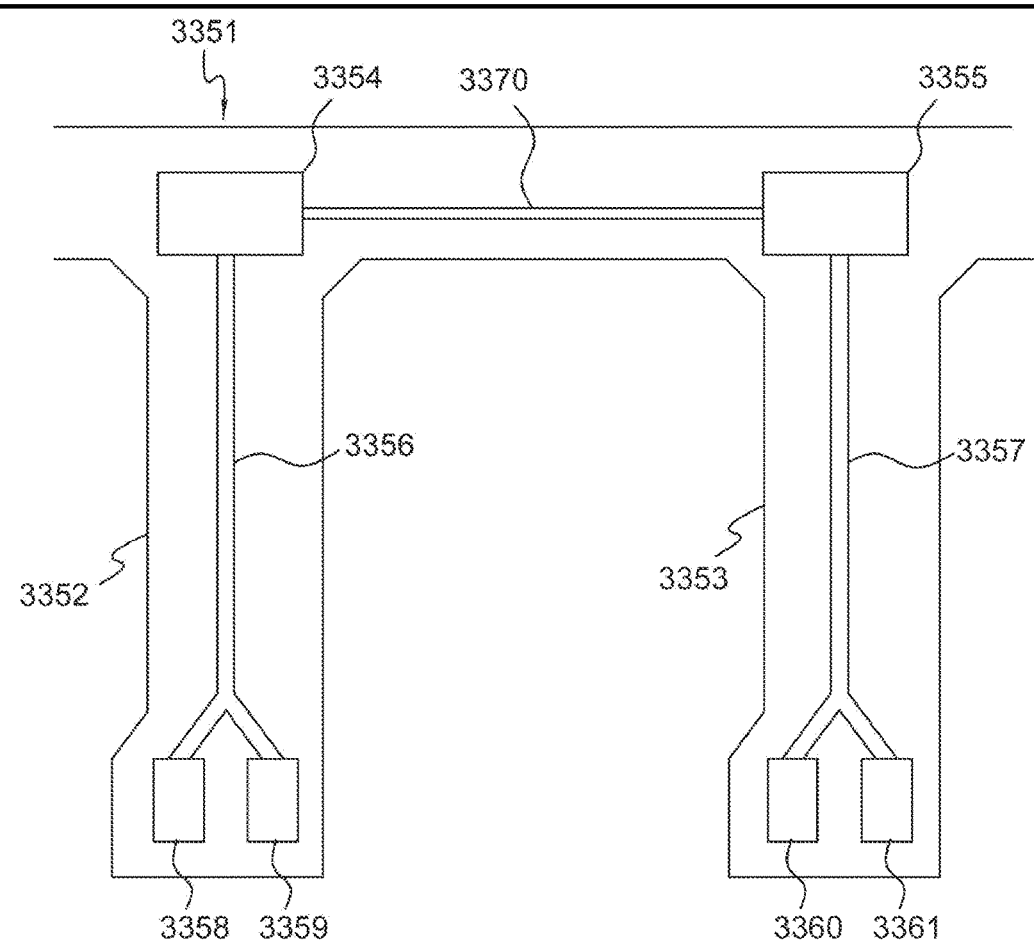
FIG. 33 is a diagram of an example LED strip with multiple legs.

A controller, such as controller 330 of FIGS. 15-18 or gate controller 1806 of FIG. 18 may be provide a signal to contacts such as contacts 3204 and/or 3205 of FIG. 32 or contacts 3258, 3259, 3260, and/or 3261 of FIG. 33. The controller may be connected to a contact via a control board which includes one or more traces or wires that are in contact with a controller. The controller may provide an electrical signal based on a signal from a component, such as a driver, a converter, or may generate the signal based on a different input signal provided to the controller.

According to an implementation, a flexible printed circuit board, such as flexible printed circuit board 3251 of FIG. 33, may include multiple legs, such as leg 3252 and leg 3253. Each leg and may include an integrated bus line which connects contacts to LED banks for each respective leg. For example, as shown in FIG. 33, leg 3252 may include an integrated bus line 3256 which connects contacts 3258 and 3253 to LED bank 3254. Additionally, as shown in FIG. 33, leg 3253 may include an integrated bus line 3257 which connects contacts 3260 and 3261 to LED bank 3255.

According to an implementation, as shown in FIG. 33 and as further disclosed herein, an integrated bus line may connect two LED banks such as the integrated bus line 3270 of FIG. 33 which connects LED bank 3254 and 3255.

Figure 34A:
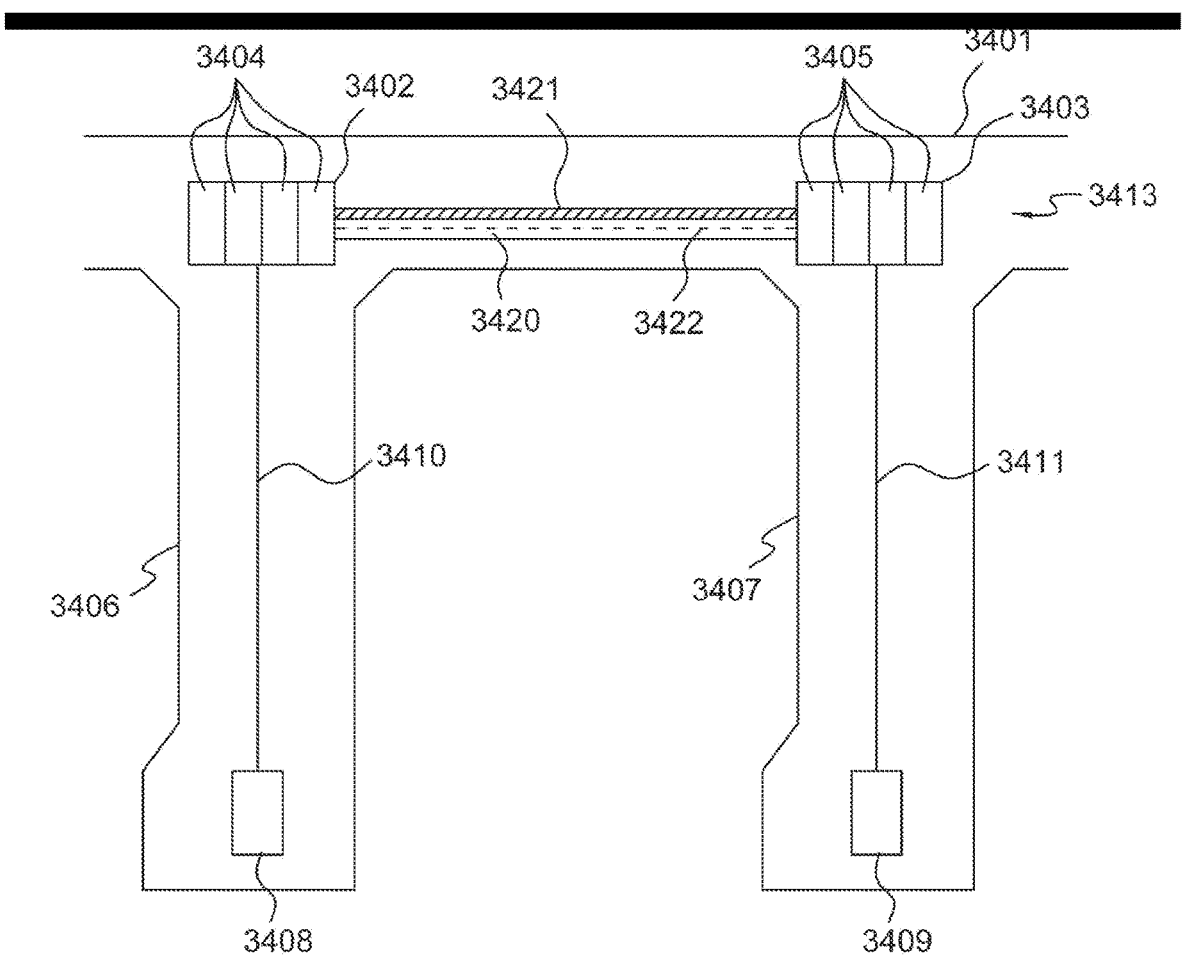
FIG. 34A is a diagram of an example LED strip with an integrated bus line between LED banks.

According to an implementation of the disclosed subject matter, two or more LED banks may be connected via an integrated bus line. As shown in FIG. 34A, a flexible printed circuit board 3401 may include an integrated bus line 3420 that connects a first LED bank 3402 and a second LED bank 3401. The LED strip 3401 may include a body 3413 which includes the LED banks 3403 and 3403. Each of the LED banks may include one or more LEDs, such as one or more LEDs 3404 of LED bank 3402 and one or more LEDs 3405 of LED bank 3403. The LED strip 3401 also may include multiple legs, each leg corresponding to an LED bank such as leg 3406 corresponding to LED bank 3402 and leg 3407 corresponding to LED bank 3403. As disclosed herein, each leg may be flexible such that the leg is able to bend, fold, curve, or otherwise shape itself.

According to an implementation, the LED strip 3401 may have an adhesive backing for affixing the LED strip 3201 to an object or structure such as base 332 of FIGS. 2A-2D and 3A.

Each leg may include one or more contacts such as contact 3408 of leg 3316 and contact 3409 of leg 3407. Each contact on a leg may be connected to the respective LED bank for that leg via any applicable manner such as via a flexible circuit, as disclosed herein and shown in FIGS. 32 and 33, or via wires. According to an implementation, only one of the legs may include a contact that is connected to the leg's corresponding LED bank, as further disclosed herein.

Electrical contacts 3408 and/or 3409 may provide a signal obtained from a controller, as disclosed herein, to one or more of the LED banks. For example, the contacts 3408 and/or 3409 may be used to provide a signal to the LEDs banks 3402 and/or 3401. It will be understood that a signal provided to an LED bank may correspond to providing the signal to the LEDs in the LED bank (e.g., providing a signal to LED bank 3402 may correspond to providing a signal to the LEDs 3404. The signal may be, for example, one of: (1)

turning off/on the LEDs in an LED bank, (2) changing the brightness of the LEDs in an LED bank (3) changing the color of light output by the LEDs in an LED bank, and/or (4) controlling another characteristic of the operation of the LEDs in an LED bank. The contacts 3408 and 3409 may include any conductive material such as, but not limited to, silver, copper, gold, platinum, and/or palladium.

The LEDs 3404 and/or 3405 in LED banks 3402 and/or 3403 may be connected to one another in series, in parallel, and/or in any other suitable way and may be configured to output the same color of light or different colors of light such as, for example, red, green, and blue. Additionally or alternatively, the LEDs 3404 and/or 3405 may output light having the same correlated color temperature (CCT). Additionally or alternatively, the light outputs of at least two LEDs in a given LED may have different CCTs.

Light emitted from the LEDs 3404 and/or 3405 may be emitted into a light guide, such as the light guide shown in FIGS. 3-4B, 7A-10A, and 11-14. The light guide may guide the light emitted by the LEDs 3404 and/or 3405 based on the shape and characteristics of the light guide and the apparatus in general, which features may include, but are not limited to, texture, curves, dimensions, pans, plates, and the like. For example, FIGS. 7A-10A show light guides with outer edges that are shaped to distribute light in a given pattern, based on the edge. FIGS. 10B and 10C show examples of such distributions. The LEDs 3404 and/or 3405 may be deposited in an inner cavity of a light guide or may be deposited along an outer edge of a light guide such that they emit light into the light guide. An example such configuration is shown in FIG. 14.

One or more of the LEDs 3404 and/or 3405 may be a micro LED such that the one or more LEDs 3404 and/or 3405 may have a width W in the range of 10-500 microns. Furthermore, the one or more LEDs 3404 and/or 3405 may have a length L in the range of 10-500 microns and a height H in the range of 5-30 microns. The width W of any of the one or more LEDs 3404 and/or 3405 may be the same or different from the length L of the same LED.

According to an implementation, LED bank 3402 and 3403 may be connected to each other via an integrated bus line 3420. The integrated bus line 3420 may connect the LED banks 3402 and 3403 such that an electrical signal may travel from the LED bank 3402 to the LED bank 3403 via the integrated bus line 3420.

The integrated bus line 3420 may be provided such that wires are not needed to provide an electrical signal from the LED bank 3402 to the LED bank 3403. Accordingly, the integrated bus line 3420 may allow for a low profile solution which replaces the need for wires that may require additional space. The integrated bus line 3420 may also mitigate a concern related to damaging wires during a manufacturing process (e.g., by catching the wire against a sharp edge or object).

The integrated bus line 3420 may traverse the length between two or more consecutive LED banks or may connect two or more non-consecutive LED banks. The integrated bus line 3420 may be, for example, at least 10 mm long according to an implementation and may be, for example, at least 5 mm long according to another implementation. The integrated bus line 3420 may be narrower than the width of the body 3413 and may have a width of less than 5 mm according to an implementation and less than 3 mm according to another implementation.

The integrated bus line 3420 may carry the multiple electronic signals such that it is split in two or more parts throughout the length of the integrated bus line 3420. As an example, integrated bus line 3420 may be spilt by a dividing line 3422 which may isolate the multiple signals. The isolation may be based on the dividing line 3422 including an insulator or dielectric material which isolates the signal. Alternatively, according to an implementation, the dividing line 3422 may be a physical gap between one side of the integrated bus line 3420 and a different side of the integrated bus line 3420.

The integrated bus line 3210 may be insulated by a dielectric material at one or more edges, ends, or surfaces such that the signals carried by the integrated bus line 3210 are insulated from exiting the integrated bus line 3210. As an example, the integrated bus line 3210 may include dielectric material 3230 which may insulate the ground connection via contact 3205 from being interrupted by a portion of the leg 3202 that is external to the integrated bus line 3210.

According to implementations disclosed herein, an integrated bus line may include a conductive material configured to transfer an electrical signal from a contact to an LED bank. As non-limiting examples, the integrated bus line may include a copper trace, an aluminum trace, and a combination aluminum/copper trace such as, for example, an aluminum coated copper trace.

A controller, such as controller 330 of FIGS. 15-18 or gate controller 1806 of FIG. 18 may be provide a signal to contacts such as contacts 3408 and/or 3409. The signal may be provided to an LED bank such as LED bank 3402 which may receive the controller provided signal via contact 3408. The LED bank 3402 may transfer that signal or a modified version of that signal to LED bank 3403 via integrated bus line 3420. By sharing a signal or a modified version of a signal between a first LED bank and a second LED bank, the disclosed subject matter may be implemented such that a strip has a single or a reduced number of legs as a single or a reduced number of signals are required as a single LED bank can receive a signal and provide the signal or a modified version of the signal to additional LED banks.

Figure 34B:
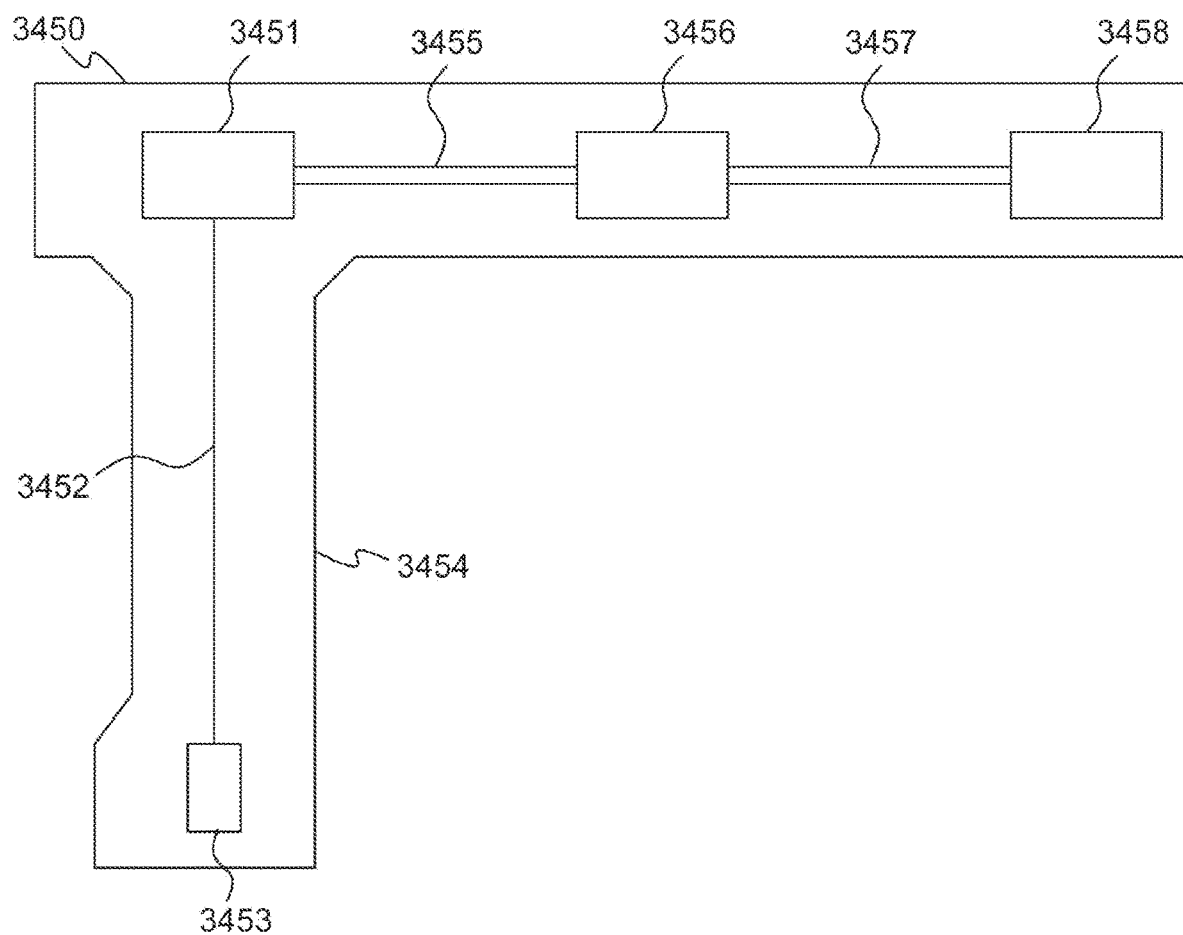
FIG. 34B is a diagram of another example LED strip with an integrated bus line between LED banks.

As an example, FIG. 34B comprises a flexible printed circuit board 3450 which includes a first LED bank 3451, and a leg 3454 which includes contact 3453 connected to the first LED bank 3451 via a wire 3452. The first LED bank is connected to a second LED bank 3456 via an integrated bus line 3455. The first LED bank 3450 and/or and second LED bank 3456 are connected to a third LED bank 3458 via an integrated bus line 3457. According to this example, a controller may provide a signal to contact 3453, and that signal may be provided to LED bank 3451. LED bank 3451 may then provide the same signal to LED bank 3456 via integrated bus line 3455. LED bank 3456 may provide the same signal to LED bank 3458 via integrated bus line 3457. Such a configuration may allow multiple LED banks to receive a signal from a single contact without the use of potentially cumbersome wires connecting each of the LED banks. Such a configuration may also reduce wear inherent to such wires during use and damage to such wires during manufacturing.

Furthermore, using integrated bus lines as disclosed in implementations herein may reduce additional manufacturing steps of soldering wires between multiple components and thereby reducing the overall cost and time of manufacturing.

Although the above light fixtures show the reflector as having a cylindrical shape with a substantially rectangular cross-section, like the other elements being formed in a shape circular or multi-sided (e.g., octangular) shape, the various aspects are not so limited. For example, the reflector may extend over the outer edge of the light guide and have a frustoconical shape. The frustoconical shape has a trapezoidal cross-section, similar to the shape of the light guide in FIG. 10A. The underlying light guide may retain the same frustoconical shape.

As mentioned above, other elements may be incorporated into the above light fixtures. For example, a diffuser may be used disposed under the light guide, to diffuse light directed out from the light guide to an external environment. The diffuser may be formed from a any material that diffuses or scatters light. In some embodiments, the diffuser may be formed from translucent material, such as ground or greyed glass, or may use a diffraction element to scatter the light. The diffuser may be attached to the pan/heat dissipation element using glue or some other adhesive, for example. The diffuser may have an opening that is colinear with the opening of the base. The diffuser may provide uniform light diffusion.

Similarly, throughout the examples above, the light guide is shown as having a circular shape (from a top view). However, in other embodiments, the light guide may have other shapes. Another shape may be an ovular shape. Whichever shape is used, in some embodiments, the lighting may be offset from the center of the light guide. The amount of offset may be dependent on the lighting effect desired, and the reflector and diffuser and other elements may be used to change the effects of the offset. If the light guide shape is non-circular, for example, ovular, the offset may be in the direction of the major axis, minor axis or neither axis. Similarly, if multiple illumination sources 200 are present, one or both of the illumination sources 200 may be offset from the center. The illumination sources 200 may be symmetrically offset or not symmetrically offset. As a result of the offset, the control (duty cycle/current) of the individual LED segments of the illumination sources 200 may be adjusted to produce lighting effects different from those of center lit light guides.

Note that although a majority of the examples describe center-edge-lit light guide panel, in some embodiments outer-edge-lit light guide panel (OEL) modules, or combinations of the two (OCEL) may be used, with each set of LEDs independently controllable. This may enable control of light distribution in the vertical planes in addition to control in the horizontal planes.

According to an implementation of the disclosed subject flatter, in which the light engine is installed in a vehicle, a light guide may include one or more external surfaces. An external surface may be a light guide surface that is visible from one or vehicle areas. Light illuminated on one or more external surfaces may exhibit a soft light distribution pattern on the one or more external surfaces. The soft light distribution pattern may be exhibited based on a surface feature such as surface texture, surface pattern, surface features, and/or the like, of the one or more external surfaces. A surface feature may be part of the external light guide surface or may be provided via a surface plate or other light guide component.

As disclosed herein, one or more addressable LED segments may emit light onto an inner surface of a light guide. For example, a first addressable LED segment may emit light onto an inner first portion of a light guide and a second addressable LED segment may emit light onto an inner second portion of the light guide. Light emitted onto the inner portion of a light guide may be emitted onto an external surface of the light guide and may further be emitted onto one or more vehicle areas. For example, light emitted onto an inner first portion of a light guide may be emitted onto a first external portion of the light guide and onto a first vehicle area. Similarly, light emitted onto an inner second portion of a light guide may be emitted onto a second external portion of the light guide and onto a first vehicle area. The light emitted onto an external surface of the light guide may be visible, on the external surface, from one or more vehicle area (e.g., a front vehicle area, a back vehicle area, etc.). The light illuminated on an external surface of the light guide may exhibit a smooth distribution such that it tapers from a high illuminance to a low or no illuminance with a gradient. Although tapering an illuminance is disclosed, it will be understood that one or more of brightness, intensity, contrast, color, or the like may taper from a first point to a second point on the external surface of a light guide.

According to an implementation, light illuminated on an external surface may taper from a maximum illuminance to a minimum illuminance over a distance of at least 1 cm. According to another implementation, light illuminated on an external surface may taper from a maximum illuminance to a minimum illuminance over a distance of at least 3 cm. An external surface of the light guide may be illuminated by light emitted by multiple independently addressable LED segments (e.g., 2-8 different independently addressable LED segments). Accordingly, multiple soft light distribution patterns may be illuminated onto an external surface of the light guide. One or more of the soft light distribution patterns may overlap such that a first soft light distribution pattern from light emitted by a first independently addressable LED segment tappers from a maximum illuminance to a minimum illuminance over a first distance (e.g., 1 cm) and a second soft light distribution pattern from light emitted by a second independently addressable LED segment tappers from a maximum illuminance to a mimimum illuminance over a second distance (e.g., 1 cm or 3 cm).

The present disclosure is provided as an example only. At least some of the elements discussed with respect to these figures can be arranged in different order, combined, and/or altogether omitted. It will be understood that the provision of the examples described herein, as well as clauses phrased as "such as," "e.g.", "including", "in some aspects," "in some implementations," and the like should not be interpreted as limiting the disclosed subject matter to the specific examples. Although the examples presented throughout the disclosure are presented in the context of light emitting diodes, it will be understood that any other suitable type of light source can be used instead.

Although some of the concepts disclosed herein are presented in the context of adaptive automotive lighting, it will be understood that the disclosed segmented LED chip implementations, adaptive lighting system implementations, and processes for operating adaptive lighting systems can be employed in any context. For example, they can be used in indoor lighting systems, street lighting systems, stage lighting systems, decorative lighting systems, and greenhouse lighting systems. Thus, the disclosure is not limited to the examples presented herein.

The figures provided herein are provided as an example only. At least some of the elements discussed with respect to these figures can be arranged in different order, combined, and/or altogether omitted. It will be understood that the provision of the examples described herein, as well as clauses phrased as "such as," "e.g.", "including", "in some aspects," "in some implementations," and the like should not be interpreted as limiting the disclosed subject matter to the specific examples. Thus, although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

The Abstract of the Disclosure is provided to comply with 37 § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is being claimed is:

1. An apparatus of a light engine comprising:
    a core comprising an opening extending completely through the core, the opening defining an inner surface of the core;
    a plurality of independently addressable light emitting diode (LED) segments, each LED segment comprising a plurality of LEDs;
    a flexible printed circuit board (PCB) comprising a body adjacent to one of an inner or outer surface of the core and to which the LED segments are attached and a plurality of legs extending from the body and bent to be adjacent and traverse to the other of the inner or outer surface, each leg associated with a different LED segment; and
    control circuitry connected with the legs of the flexible PCB, the control circuitry configured to independently control parameters of the LED segments to provide a preset illumination distribution and intensity based on user input.

2. The apparatus of claim 1, wherein:
    the control circuitry comprises a first PCB having a first surface that opposes the LED segments, a second surface opposing the first surface, and an opening extending between the first and second surfaces, and
    the legs of the flexible PCB extend through the opening and are soldered to control contacts of the first PCB on the second surface.

3. The apparatus of claim 2, wherein:
    the LED segments are configured in parallel, and
    the control circuitry comprises:
        a direct current (DC)/DC converter or low-dropout (LDO) regulator configured to convert a higher constant DC voltage to a lower constant DC voltage, the lower constant DC voltage used to adjust an LED voltage supplied to the LED segments,
        a constant current regulator configured to provide a fixed peak current to the LED segments, and
        a controller configured to control a duty cycle of the LED segments based on the user input to independently control light intensity from each of the LED segments.

4. The apparatus of claim 3, wherein:
    forward voltages of the LED segments are matched, and
    an applied voltage to each of the LED segments is below the LED voltage by about 1-2 volts.

5. The apparatus of claim 2, wherein:
    the LED segments are configured in parallel, and
    the control circuitry comprises:
        a plurality of DC/DC converters each supplied with a constant voltage and configured to control a different LED segment, and
        a controller configured to control at least one of a duty cycle or a peak current of the DC/DC converters independently based on the user input.

6. The apparatus of claim 2, wherein:
    the LED segments are configured in parallel, and
    the control circuitry comprises:
        a direct current (DC)/DC converter or low-dropout (LDO) regulator configured to convert a higher constant DC voltage to a lower constant DC voltage, the lower constant DC voltage used to adjust a constant current supplied to the LED segments, the LED segments sharing the constant current, and
        a controller supplied with the lower constant DC voltage and configured to control, via a time-division multiplexer, at least one parameter of each of the DC/DC converters independently based on the user input, such that only one of the LED segments is conducting current at a particular time.

7. The apparatus of claim 6, wherein:
    the parameter is a duty cycle of the DC/DC converter.

8. The apparatus of claim 6, wherein:
    the parameter is the constant current supplied to the DC/DC converter.

9. The apparatus of claim 6, wherein:
    forward voltages of the LED segments are matched.

10. The apparatus of claim 2, wherein:
    the LED segments are configured in series, and a shunt switch is disposed between each LED segment, and
    the control circuitry comprises:
        a direct current (DC)/DC converter or low-dropout (LDO) regulator configured to convert a higher constant DC voltage to a lower constant DC voltage, the lower constant DC voltage used to adjust a constant current supplied to the LED segments, and
        a controller supplied with the lower constant DC voltage and configured to control the constant current and a duty cycle of each LED segment independently.

11. The apparatus of claim 10, wherein:
    the controller is able to control the LED segments such that multiple LED segments are able to conduct current at the same time.

12. The apparatus of claim 2, wherein:

a duty cycle associated with each of the LED segments is set by a lookup table in a memory of the control circuitry, the lookup table containing a correspondence between a light distribution indicted by a user equipment and the duty cycle associated with each of the LED segments.

13. The apparatus of claim 12, wherein:

the lookup table further contains a correspondence between a constant current associated with each of the LED segments and the light distribution indicted by the user equipment.

14. The apparatus of claim 2, wherein:

the control circuitry further comprises a second PCB that is detachable from the first PCB, and the second PCB comprises communication circuitry configured to wirelessly communicate with a user interface via a supported communication protocol to control light output from each of the LED segments accordingly.

15. A method of controlling light distribution, the method comprising:

receiving a control signal from a user equipment;

determining a correspondence, between parameters of a plurality of independently controllable light emitting diode (LED) segments and an illumination distribution and intensity indicated by the control signal, the parameters comprising at least one of a duty cycle or current associated with each of the LED segments, each LED segment comprising a plurality of LEDs; and controlling the LED segments through signaling supplied from control circuitry local to the LED segments through a plurality of legs of a flexible printed circuit board (PCB) comprising a body to which the LED segments are attached, each leg associated with a different LED segment.

16. The method of claim 15, wherein controlling the LED segments comprises:

supplying each LED segment, connected in parallel and having matching forward voltages, with a constant voltage and a fixed peak current and varying the duty cycle of the LED segments independently, the fixed peak voltage supplied by a constant current regulator.

17. The method of claim 15, wherein controlling the LED segments comprises:

varying at least one of a duty cycle or a peak current of a plurality of DC/DC converters independently, each DC/DC converter associated with a different LED segment, the LED segments connected in parallel.

18. The method of claim 15, wherein controlling the LED segments comprises:

supplying all of the LED segments, which are connected in parallel and have matching forward voltages, with the same shared current, and varying at least one of a duty cycle or a peak current of each LED segment such that only a single LED segment is conducting current at the same time.

19. The method of claim 15, wherein controlling the LED segments comprises:

supplying all of the LED segments, which are connected in series and have matching bypass switch between each adjacent pair of LED segments, with a constant current, and varying at least one of a duty cycle or a peak current of the LED segments independently, such that only multiple LED segments are able to conduct current at the same time.

* * * * *